US009440848B2

(12) United States Patent
Sasagawa et al.

(10) Patent No.: US 9,440,848 B2
(45) Date of Patent: Sep. 13, 2016

(54) PASSIVATED MICROELECTROMECHANICAL STRUCTURES AND METHODS

(71) Applicants: Pixtronix, Inc., San Diego, CA (US); Sharp Corporation, Sharp Kabushiki Kaisha, Osaka OT (JP)

(72) Inventors: Teruo Sasagawa, Los Gatos, CA (US); Junghun Chae, Newton, MA (US); Jasper Lodewyk Steyn, Campbell, CA (US); Takeshi Hara, Shirakicho (JP); Asahi Yamato, Shirakicho (JP)

(73) Assignees: Pixtronix, Inc., San Diego, CA (US); Sharp Corporation, Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/724,374

(22) Filed: May 28, 2015

(65) Prior Publication Data

US 2016/0090299 A1    Mar. 31, 2016

Related U.S. Application Data

(63) Continuation-in-part of application No. 14/502,255, filed on Sep. 30, 2014, now Pat. No. 9,395,533.

(51) Int. Cl.
*G01P 15/08* (2006.01)
*B81C 1/00* (2006.01)

(52) U.S. Cl.
CPC ................. *B81C 1/00801* (2013.01)

(58) Field of Classification Search
USPC .............. 257/417, 415, 418, 253, 254
See application file for complete search history.

(56) References Cited

U.S. PATENT DOCUMENTS

| | | | |
|---|---|---|---|
| 6,479,391 B2 | 11/2002 | Morrow et al. | |
| 7,714,446 B2 | 5/2010 | Enquist | |
| 7,956,428 B2 * | 6/2011 | Yama | B81C 1/00333 257/415 |
| 8,383,488 B2 | 2/2013 | Enichlmair et al. | |
| 2009/0095968 A1 | 4/2009 | Baek et al. | |
| 2012/0200906 A1 | 8/2012 | Wu et al. | |
| 2013/0134018 A1 | 5/2013 | Aimi | |
| 2014/0071142 A1 | 3/2014 | Steyn | |
| 2014/0268293 A1 * | 9/2014 | Chleirigh | H02N 1/006 359/290 |
| 2014/0293245 A1 | 10/2014 | Tani | |
| 2016/0091713 A1 | 3/2016 | Sasagawa et al. | |

OTHER PUBLICATIONS

U.S. Non-Final Office Action, dated Dec. 24, 2015, issued in U.S. Appl. No. 14/502,255.

* cited by examiner

*Primary Examiner* — Timor Karimy
(74) *Attorney, Agent, or Firm* — Weaver Austin Villeneuve & Sampson LLP

(57) ABSTRACT

This disclosure provides systems, methods and apparatus including devices that include layers of passivation material covering at least a portion of an exterior surface of a thin film component within a microelectromechanical device. The thin film component may include an electrically conductive layer that connects via an anchor to a conductive surface on a substrate. The disclosure further provides processes for providing a first layer of passivation material on an exterior surface of a thin film component and for electrically connecting that thin film component to a conductive surface on a substrate. The disclosure further provides processes for providing a second layer of passivation material on any exposed surfaces of the thin film component after release of the microelectromechanical device.

26 Claims, 35 Drawing Sheets

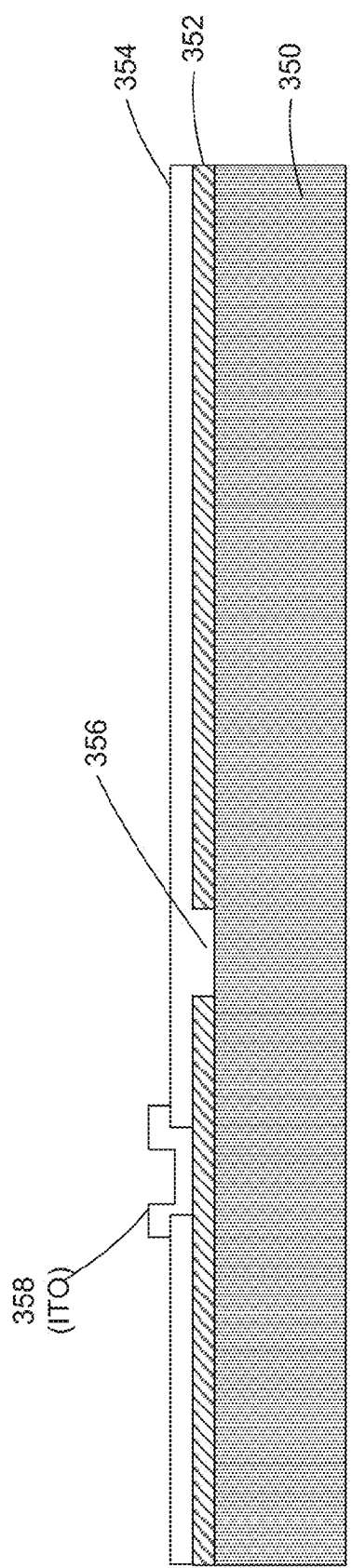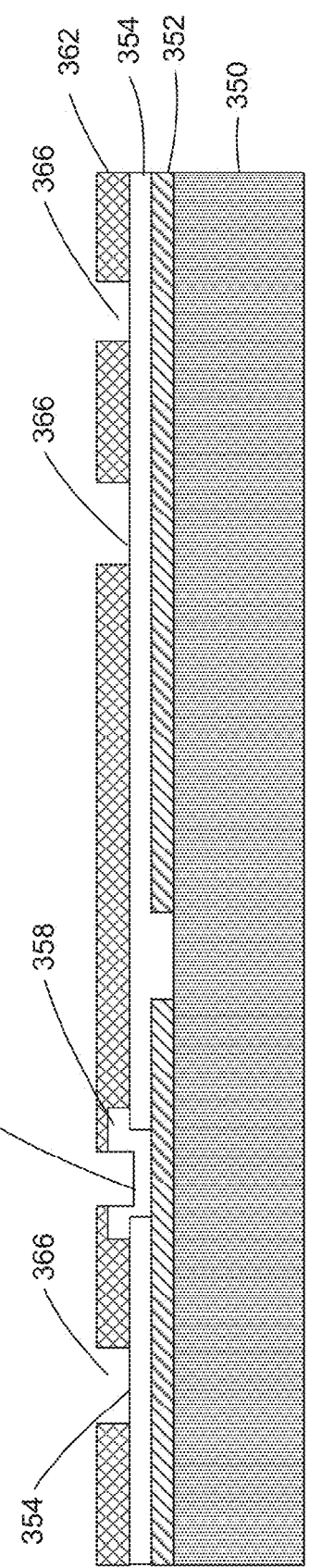

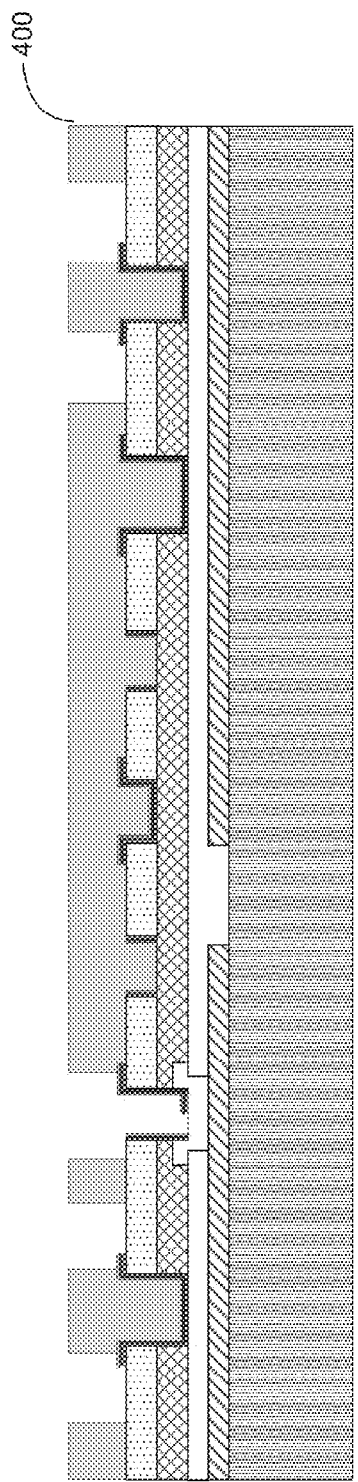
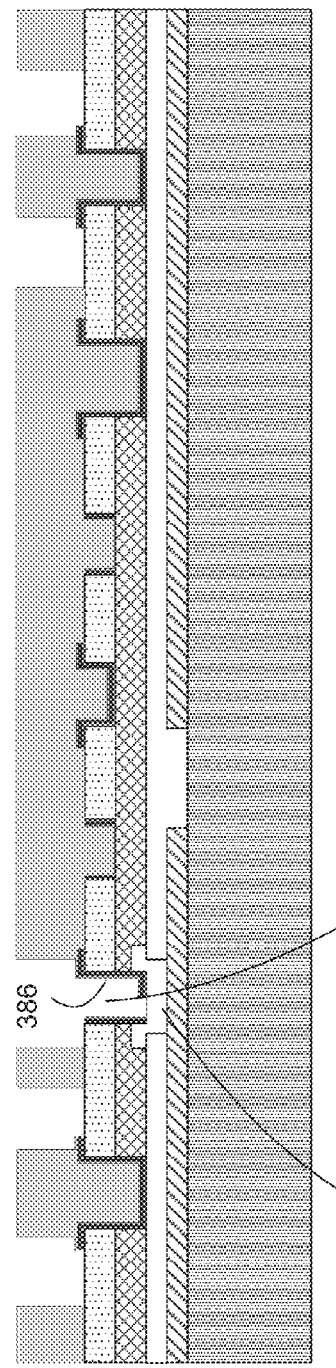

2600

2602 — forming a via through the first and second thin film beam so that it extends to the conductive pad, and forming an anchor within the via for supporting the first and second thin film beams 2604 — forming a side wall of the anchor from an arm connected to the first thin film beam and from an arm connected to the second thin film beam.

2606 — providing a conductive material within one of the thin film beams for connecting the first or second thin film beam to the conductive pad.

2608 — connecting one of the beams to the conductive pad and spacing the other thin film beam away from the conductive pad and electrically connecting that thin film beam to the beam that is connected to the conductive pad.

Fig. 26

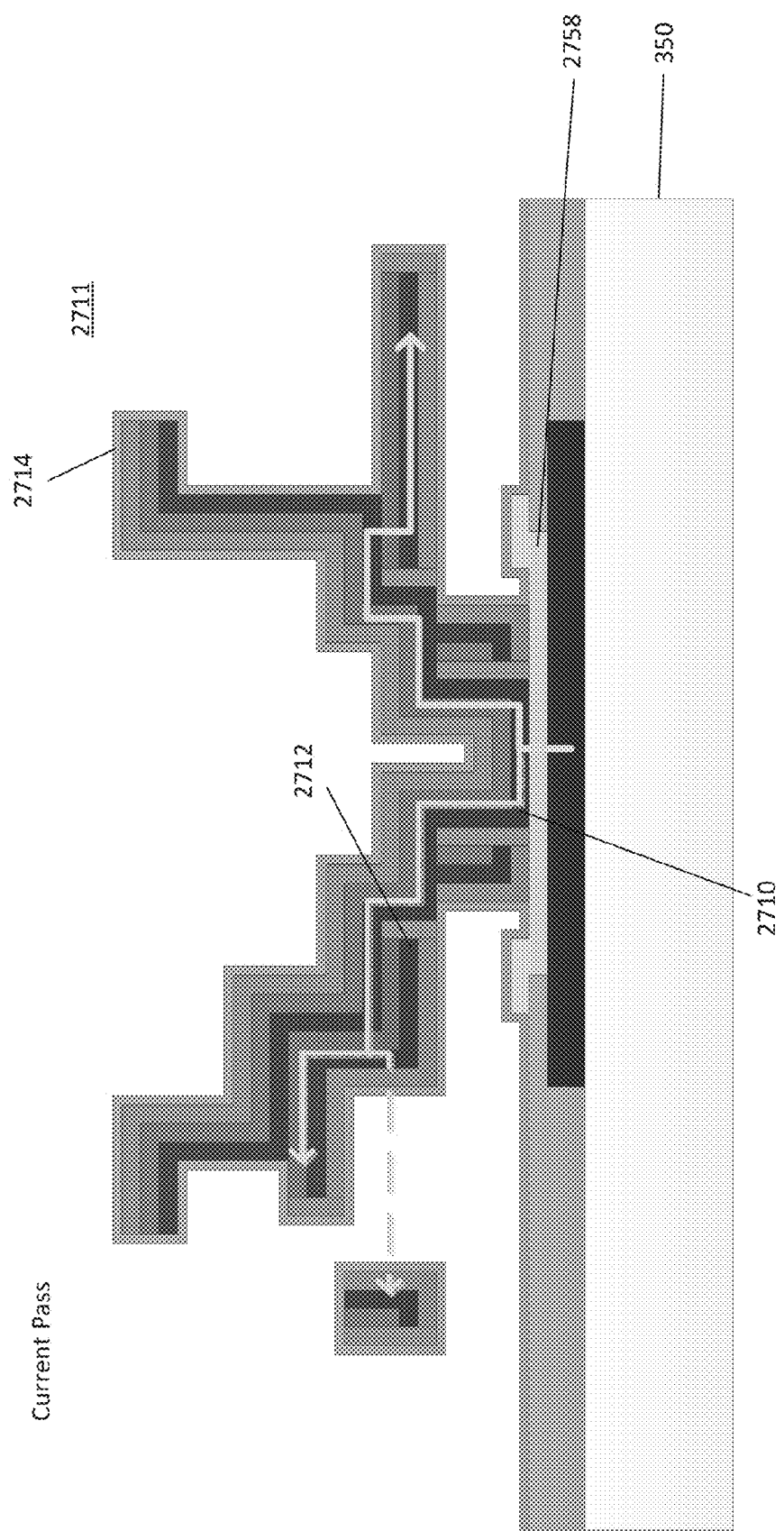

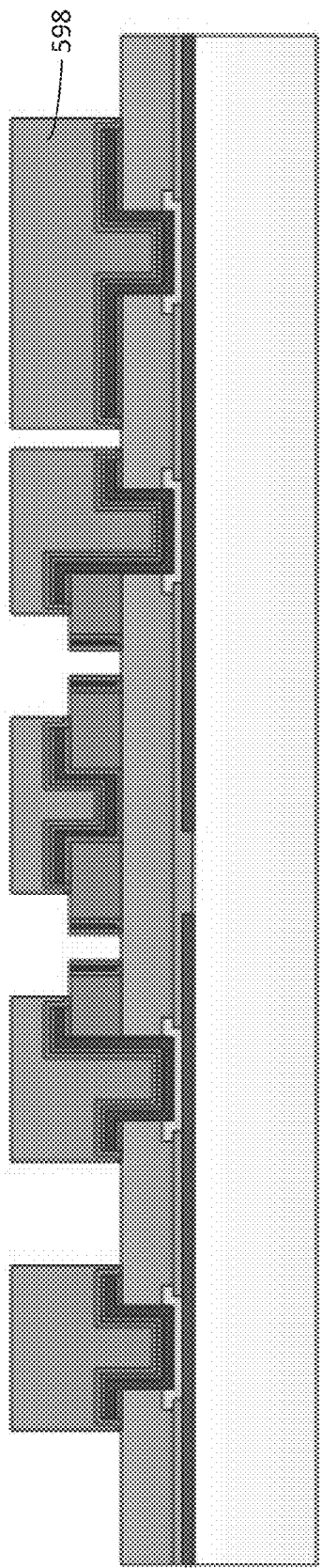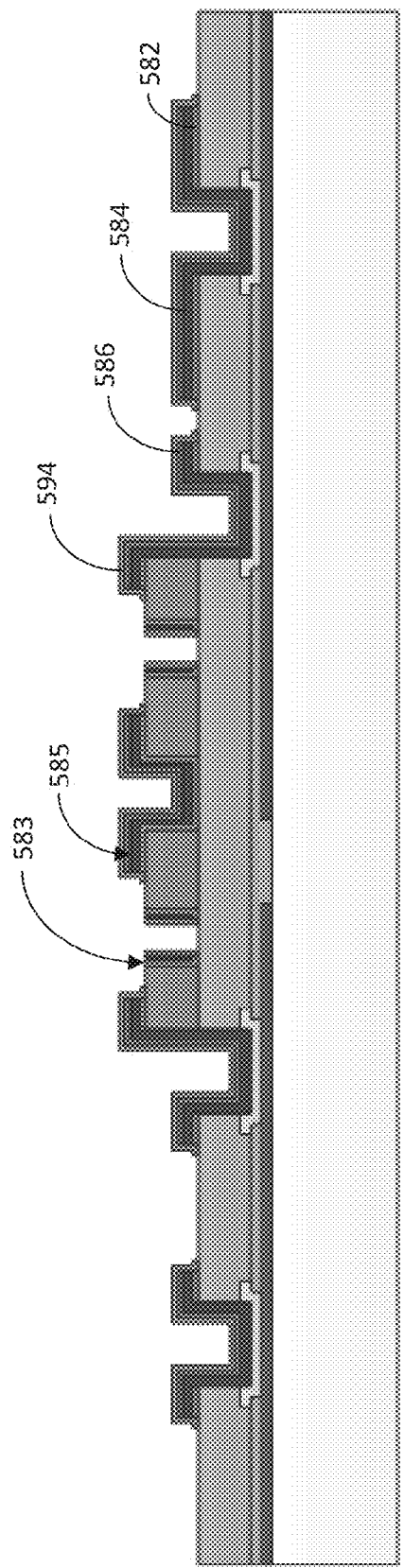

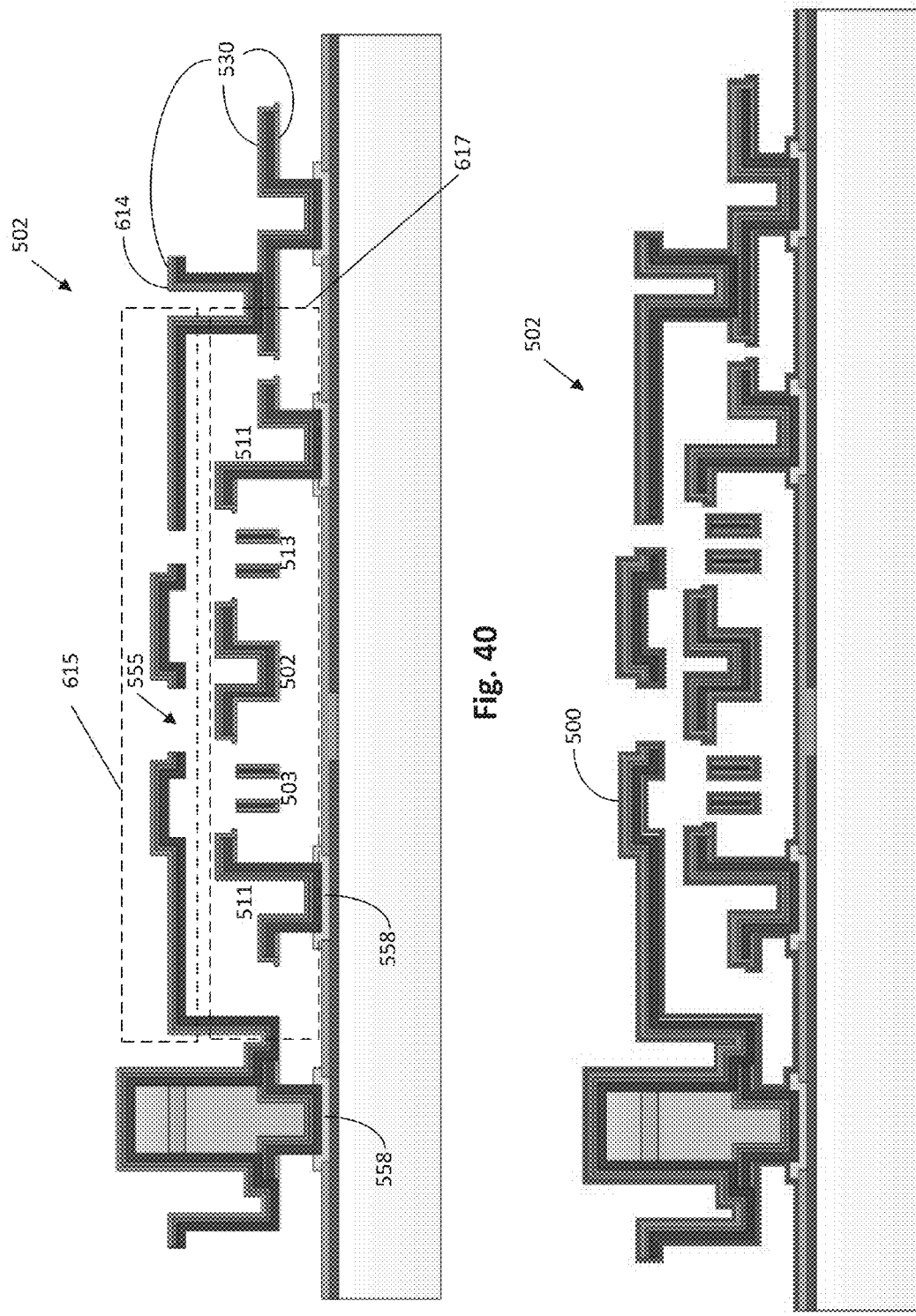

PASSIVATED MICROELECTROMECHANICAL STRUCTURES AND METHODS

PRIORITY CLAIM

This application claims priority to, and is a continuation-in-part of, U.S. application Ser. No. 14/502,255, filed Sep. 30, 2014, and entitled "PASSIVATED MICROELECTROMECHANICAL STRUCTURES AND METHODS," which is hereby incorporated by reference in its entirety and for all purposes.

TECHNICAL FIELD

This disclosure relates to microelectromechanical systems and in particular to microelectromechanical systems having components with passivated exterior surfaces, and to devices formed from such passivated components and processes for forming such devices.

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

Certain MEMS devices, including certain MEMS displays, require overlapping layers of structures. The overlapped layers can have a first layer that attaches to a substrate and a second layer that connects to the first layer and uses the first layer as an anchor to hold the second layer away from the substrate surface, similar to the way columns in a house can hold a roof above a foundation.

Once formed, the layers are sometimes passivated. Passivation renders a semiconductor material inert. Essentially, passivation provides an insulating coating over the semiconductor surface. Passivated semiconductor surfaces can make contact with other surfaces without creating a short circuit that can damage the device.

The current process for passivating overlapping layers is complex. To passivate both layers, a passivation agent, often a gas must travel pass the second layer to contact the first layer to passivate that first layer. Today, existing processes use Atomic Layer Deposition (ALD). However, the ALD process is slow and tends to leave particles that can cause sticking and device failure. Thus, there remains a need for improved structures and processes for forming MEMS devices.

SUMMARY

The systems, methods and devices of this disclosure each have several innovative aspects, no single one of which is solely responsible for the desirable attributes disclosed herein.

One innovative aspect of the subject matter described in this disclosure can be implemented in a MEMS device. The MEMS device may include a component, such as a shutter, an actuator, a beam, or some other component that is part of the MEMS device. The component typically is formed from a thin film of semiconductor material, such as amorphous silicon, and typically responds to an electrical control signal. In one implementation described herein, the MEMS device includes a first beam and a second beam. The first and second beams are supported by a substrate and the first beam is arranged between the substrate and the second beam. Both beams have an exterior surface that carries a layer of passivation material. The first beam and the second beam each have arms that extend toward the surface of the substrate. The arms may be thin film bodies that are connected together in an overlapping arrangement and form the sidewall of an anchor that extends from the surface of the substrate. The anchor is capable of holding the first and second beams off the surface of the substrate. In another innovative aspect, the device is formed on a substrate that includes a conductive surface and the device includes an anchor that is in contact with the conductive surface on the substrate. Both the first and second beams have a layer of conductive material and both beams attach to the anchor and the electrical layer of at least one of the beams connects to the conductive surface of the substrate.

In another innovative aspect of the subject matter described herein, processes form MEMS devices having two overlapping beams that are suspended above a substrate. The overlapping beams can include electromechanical components that respond to an electrical signal, typically to move between two or more positions. The process may form the beams with passivated exterior surfaces. The processes may deposit a layer of passivation material on the substrate. The processes may form the first beam by depositing material onto the passivation layer. Once the beam is formed, the process may cover the exposed surface of the beam with a layer of passivation material. A mold may be deposited on the first beam, and the mold may be covered with a passivation layer. The process may form the second beam by depositing material on to the passivation material. Once the second beam is formed, the process may cover the exposed surface of the second beam with a layer of passivation material. The mold may be washed away and the beams are left in place and arranged with the first beam placed adjacent the substrate and the second beam spaced away from the first beam.

In some implementations, the systems and methods described herein include devices having a substrate having a surface, a first thin film beam and a second thin film beam, the first beam being arranged between the substrate and the second thin film beam, and the first thin film beam being spaced away from the substrate and the second beam, and the first beam having a first arm and the second beam having a second arm, each arm extending toward the surface of the substrate, and the first arm being joined to and overlapping the second arm and the first and second arms forming an anchor capable of holding the first beam and the second beam a distance away from the substrate. In some implementations, the devices further include a layer of passivation material covering an exterior surface of the first beam. In some implementations, the devices have a layer of passivation material covering an exterior surface of the second beam.

In some implementations, the devices also include a conductive layer within the anchor, and the substrate has a conductive surface in contact with the conductive layer and the conductive layer extends into the first beam and the second beam. In some implementations, the conductive layer within the anchor includes a first and a second layer of conductive material coupled to the first beam and the second beam respectively.

In some implementations, the substrate includes a glass substrate and in some implementations the first beam includes a movable mechanical body that may include a movable sidewall beam having an aspect ratio of greater than about 4:1. The movable sidewall beam may include a conformal layer of passivation material having a tapered edge. In some implementations, the second beam includes one or more apertures.

In some implementations the first beam is spaced a distance of between about 0.3 µm and 10 µm from the second beam and in some implementations the device has a plurality of spacers for holding a plate away from the second beam. In some implementations, the device is a display that includes a controller, a processor and a memory for creating images through light modulators formed from the first and second beams of the device.

In another aspect, the systems and methods described herein include processes for forming a thin film device. The processes may include depositing a conductive pad on a substrate, depositing a mold for forming a first thin film beam. The process may deposit a layer of passivation material on the mold, and deposit at least one thin film layer on the passivation material to form at least part of the first thin film beam. The process may deposit a layer of passivation material over the first thin film beam, deposit a mold over the layer of passivation material for forming a second thin film beam, and deposit at least one thin film layer over the mold to form a second thin film beam. The process may release the first thin film beam and the second thin film beam from the mold to form a first beam having a passivation material on an exterior surface and being spaced from the substrate and a second beam spaced from and overlapping the first beam. In some implementations, the process may have the conductive pad in physical contact with the first thin film beam or the second thin film beam.

In some implementations, the process may etch the first thin film beam to form components of a MEMS device. In some implementations, the process may deposit at least one thin film layer on to the passivation material and may deposit a layer of passivation material, a layer of amorphous silicon and a layer of metal.

In some implementations, the process may deposit at least one thin film layer includes forming a light modulator for modulating light. The process may form a via through the first thin film beam and the second thin film beam and extending to the conductive pad, and form an anchor within the via for supporting the first thin film beam and the second thin film beam. The process may further form a side wall of the anchor from an arm connected to the first thin film beam and from an arm connected to the second thin film beam.

The process may further provide within the arm of the first thin film beam or the arm of the second thin film beam a conductive material for connecting the first thin film beam or the second thin film beam to the conductive pad. The process may have one of the first thin film beams and the second thin film beams connects to the conductive pad and the other thin film beam is spaced away from the conductive pad and electrically connected to the thin film beam connected to the conductive pad.

Another innovative aspect of the subject matter described in this disclosure can be implemented in a MEMS device including a substrate, a first thin film beam over the substrate, a second thin film beam over the first thin film beam, an inner passivation layer partially covering an exterior surface of the second thin film beam and partially covering an exterior surface of the first thin film beam, and an outer passivation layer over the inner passivation layer and covering the inner passivation layer, the exterior surface of the second thin film beam, and the exterior surface of the first thin film beam. The first thin film beam includes one or more electrodes and is arranged between the substrate and the second thin film beam and spaced away from the substrate and the second thin film beam, where the second thin film beam includes one or more apertures.

In some implementations, each of the one or more electrodes includes a top surface, a bottom surface, and sidewalls, the inner passivation layer covering at least the sidewalls of the one or more electrodes, and the outer passivation layer covering at least the top and bottom surfaces of the one or more electrodes. In some implementations, the first thin film beam includes a first conductive layer, where the substrate includes a conductive surface in contact with the first conductive layer. In some implementations, the first thin film beam further includes a second conductive layer, the second conductive layer being identical in composition with the first conductive layer and connected to the second thin film beam. In some implementations, the second conductive layer is an etch stop layer. In some implementations, the first thin film beam further includes a metallic layer between the first conductive layer and the second conductive layer, one or more of the first conductive layer, the metallic layer, and the second conductive layer being substantially opaque to light. In some implementations, a thickness of the second passivation layer is less than about 1000 Å.

Another innovative aspect of the subject matter described in this disclosure can be implemented in a MEMS device including a substrate, a first thin film beam over the substrate, a second thin film beam over the first thin film beam, first means for passivating the MEMS device partially covering an exterior surface of the second thin film beam and partially covering an exterior surface of the first thin film beam, and second means for passivating the MEMS device over the first passivating means, the second passivating means covering the first passivating means, the exterior surface of the second thin film beam, and the exterior surface of the first thin film beam. The first thin film beam includes one or more electrodes and is arranged between the substrate and the second thin film beam and spaced away from the substrate and the second thin film beam, where the second thin film beam includes one or more apertures.

In some implementations, each of the one or more electrodes includes a top surface, a bottom surface, and sidewalls, the first passivating means covering at least the sidewalls of the one or more electrodes, and the second passivating means covering at least the top and bottom surfaces of the one or more electrodes. In some implementations, the first thin film beam includes a first conductive layer, where the substrate includes a conductive surface in contact with the first conductive layer.

Another innovative aspect of the subject matter described in this disclosure can be implemented in a method of manufacturing a MEMS device including providing a substrate, forming a first mold for forming a first thin film beam over the substrate, forming a first pre-release layer of passivating material on the first mold, forming the first thin film beam over the first mold and the first pre-release layer of passivating material, forming a second pre-release layer of passivating material over the first thin film beam, forming a second mold over the second layer of passivating material for forming a second thin film beam, forming the second thin film beam over the second mold, releasing the first thin film beam and the second thin film beam from the first mold and the second mold so that the first layer and the second layer of passivating material partially covers an exterior surface of the first thin film beam, the first thin film beam being spaced from the substrate and the second thin film beam spaced from and overlapping the first thin film beam, and forming a post-release layer of passivating material to cover the exterior surface of the second thin film beam and the first thin film beam.

In some implementations, the method further includes a third pre-release layer of passivating material over the second thin film beam prior to releasing the first and the second thin film beams. In some implementations, forming the first thin film beam includes depositing a first mask over portions of the first pre-release layer of passivating material, etching at least some of the first pre-release layer of passivating material, depositing a conductive layer over the first pre-release layer of passivating material and over the first mold, and depositing a metallic layer on the conductive layer. In some implementations, forming the first thin film beam includes anisotropically etching at least some of the first pre-release layer of passivating material, depositing a first conductive layer over the first pre-release layer of passivating material and the first mold, depositing a metallic layer on the first conductive layer, and depositing a second conductive layer on the metallic layer, the second conductive layer being identical in composition with the first conductive layer.

Details of one or more implementations of the subject matter described in this disclosure are set forth in the accompanying drawings and the description below. Other features, aspects and advantages will become apparent from the description, the drawings and the claims. Note that the relative dimensions of the following figures may not be drawn to scale.

BRIEF DESCRIPTION OF THE DRAWINGS

FIG. 4 shows a cross-sectional view of a substrate having a conductive surface.

FIG. 5 shows the substrate of FIG. 4 having a layer of photoresist.

FIG. 16 shows an anchor layer of resist deposited over the first beam.

FIG. 17 shows the surface exposed by the anchor layer as etched.

FIG. 26 is a flow chart of a process for forming a stacked via.

FIGS. 27A and 27 B show an alternative implementation of a stacked via.

FIGS. 28-41 show cross-sectional schematic views illustrating various stages of manufacturing an example MEMS device, according to some implementations.

Like reference numbers and designations in the various drawings indicate like elements.

DETAILED DESCRIPTION

Figure 1A:
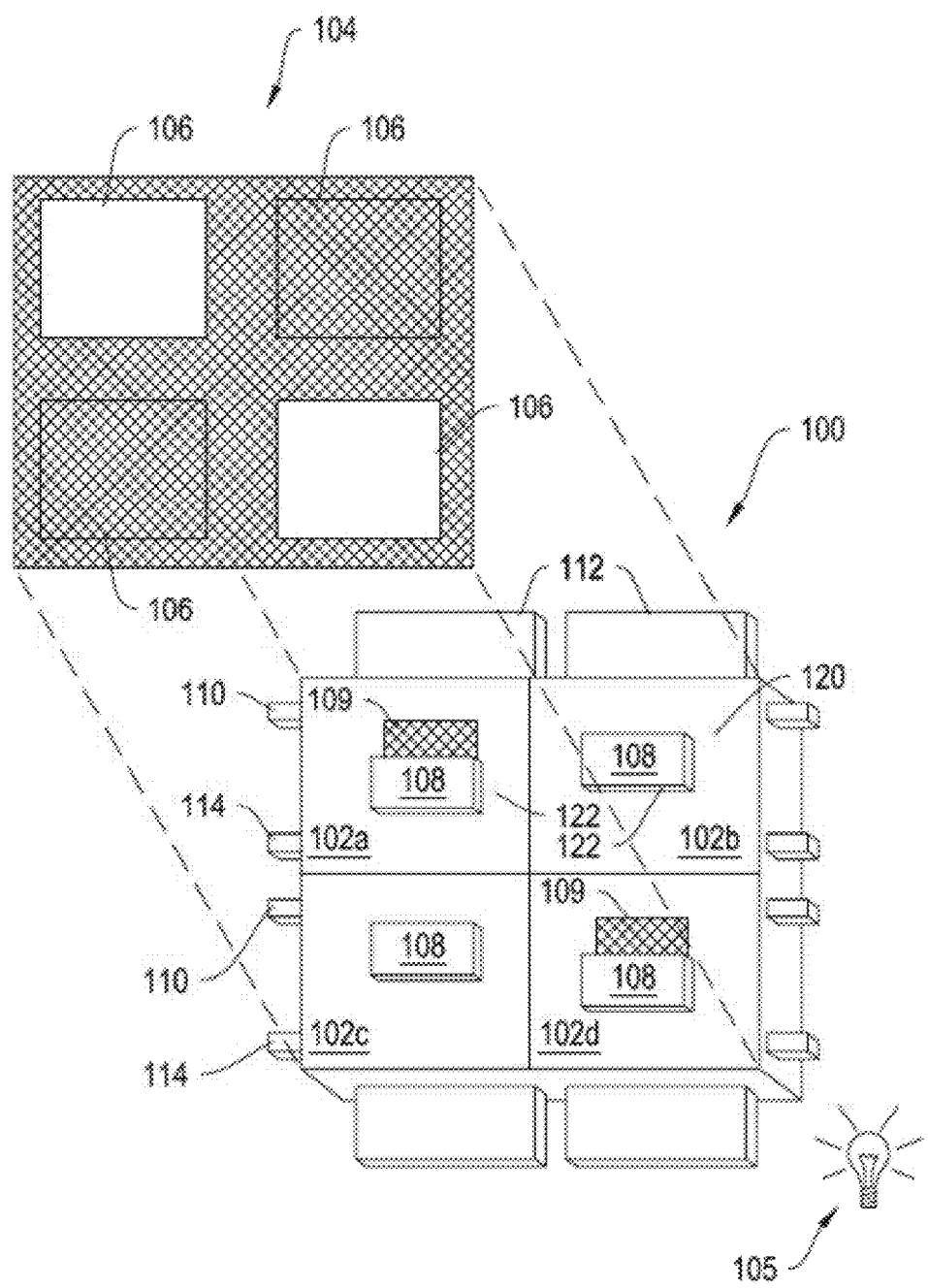
FIG. 1A shows a schematic diagram of an example direct-view microelectromechanical systems (MEMS)-based display apparatus.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that is capable of displaying an image, whether in motion (such as video) or stationary (such as still images), and whether textual, graphical or pictorial. The concepts and examples provided in this disclosure may be applicable to a variety of displays, such as liquid crystal displays (LCDs), organic light-emitting diode (OLED) displays, field emission displays, and electromechanical systems (EMS) and microelectromechanical (MEMS)-based displays, in addition to displays incorporating features from one or more display technologies.

The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

The devices, systems and methods described herein, in one aspect, include MEMS devices that have two beams arranged over a substrate surface. The thin film beams have a passivation coating on an exterior surface of the beam. Typically, the beams are arranged to have a first beam positioned above the surface of a substrate and the second beam is positioned above the first beam. The terms "above" or "below" are relative terms in as much as whether a beam is seen as above or below depends upon the orientation of the larger MEMS device. In either case, both beams are spaced a distance from the surface of the substrate and the first beam is disposed between the substrate and the second beam. In some implementations, the first and second beams may be planes of thin films, such as amorphous silicon (aSi). In some implementations, the beams are thin films formed into microelectromechanical components. Typically these components are movable structures that respond to electrical control signals.

Components in a MEMS device may have dimensions that are measured in microns and be measured from a few to millions of microns. The components can be any mechanical or electrical components, such as a shutter, mirror, actuator, aperture, motor, cantilever beam or any component of a mechanical and/or electrical system.

In some implementations, the MEMS device can include one or more passivation layers formed prior to release, and one or more additional passivation layers formed after release.

Particular implementations of the subject matter described in this disclosure can be implemented to realize one or more of the following potential advantages. In one aspect, the processes can eliminate or reduce the need for passivation process after the release of the beams. Additionally, by shaping the passivation coating by using a deposit and etch process, the process can eliminate or reduce the need for a pad open process to expose covered pads or apertures. Additionally, the process may improve yield by reducing the creation of loose particles caused by complex passivation processes. Additionally, providing a passivation layer after release can eliminate or otherwise reduce the occurrence of leakage paths that may result from exposed surfaces in the first or second thin film beams.

FIG. 1A shows a schematic diagram of an example direct-view MEMS-based display apparatus 100. The display apparatus 100 includes a plurality of light modulators 102a-102d (generally light modulators 102) arranged in rows and columns. In the display apparatus 100, the light modulators 102a and 102d are in the open state, allowing light to pass. The light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e., by use of a front light.

In some implementations, each light modulator 102 corresponds to a pixel 106 in the image 104. In some other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide a luminance level in an image 104. With respect to an image, a pixel corresponds to the smallest picture element defined by the resolution of image. With respect to structural components of the display apparatus 100, the term pixel refers to the combined mechanical and electrical components utilized to modulate the light that forms a single pixel of the image.

The display apparatus 100 is a direct-view display in that it may not include imaging optics typically found in projection applications. In a projection display, the image formed on the surface of the display apparatus is projected onto a screen or onto a wall. The display apparatus is substantially smaller than the projected image. In a direct view display, the image can be seen by looking directly at the display apparatus, which contains the light modulators and optionally a backlight or front light for enhancing brightness and/or contrast seen on the display.

Direct-view displays may operate in either a transmissive or reflective mode. In a transmissive display, the light modulators filter or selectively block light which originates from a lamp or lamps positioned behind the display. The light from the lamps is optionally injected into a lightguide or backlight so that each pixel can be uniformly illuminated. Transmissive direct-view displays are often built onto transparent substrates to facilitate a sandwich assembly arrangement where one substrate, containing the light modulators, is positioned over the backlight. In some implementations, the transparent substrate can be a glass substrate (sometimes referred to as a glass plate or panel), or a plastic substrate. The glass substrate may be or include, for example, a borosilicate glass, wine glass, fused silica, a soda lime glass, quartz, artificial quartz, Pyrex, or other suitable glass material.

Each light modulator 102 can include a shutter 108 and an aperture 109. To illuminate a pixel 106 in the image 104, the shutter 108 is positioned such that it allows light to pass through the aperture 109. To keep a pixel 106 unlit, the shutter 108 is positioned such that it obstructs the passage of light through the aperture 109. The aperture 109 is defined by an opening patterned through a reflective or light-absorbing material in each light modulator 102.

The display apparatus also includes a control matrix coupled to the substrate and to the light modulators for controlling the movement of the shutters. The control matrix includes a series of electrical interconnects (such as interconnects 110, 112 and 114), including at least one write-enable interconnect 110 (also referred to as a scan line interconnect) per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the write-enabling voltage, $V_{WE}$), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In some other implementations, the data voltage pulses control switches, such as transistors or other non-linear circuit elements that control the application of separate drive voltages, which are typically higher in magnitude than the data voltages, to the light modulators 102. The application of these drive voltages results in the electrostatic driven movement of the shutters 108.

The control matrix also may include, without limitation, circuitry, such as a transistor and a capacitor associated with each shutter assembly. In some implementations, the gate of each transistor can be electrically connected to a scan line interconnect. In some implementations, the source of each transistor can be electrically connected to a corresponding data interconnect. In some implementations, the drain of each transistor may be electrically connected in parallel to an electrode of a corresponding capacitor and to an electrode of a corresponding actuator. In some implementations, the other electrode of the capacitor and the actuator associated with each shutter assembly may be connected to a common or ground potential. In some other implementations, the transistor can be replaced with a semiconducting diode, or a metal-insulator-metal switching element.

Figure 1B:
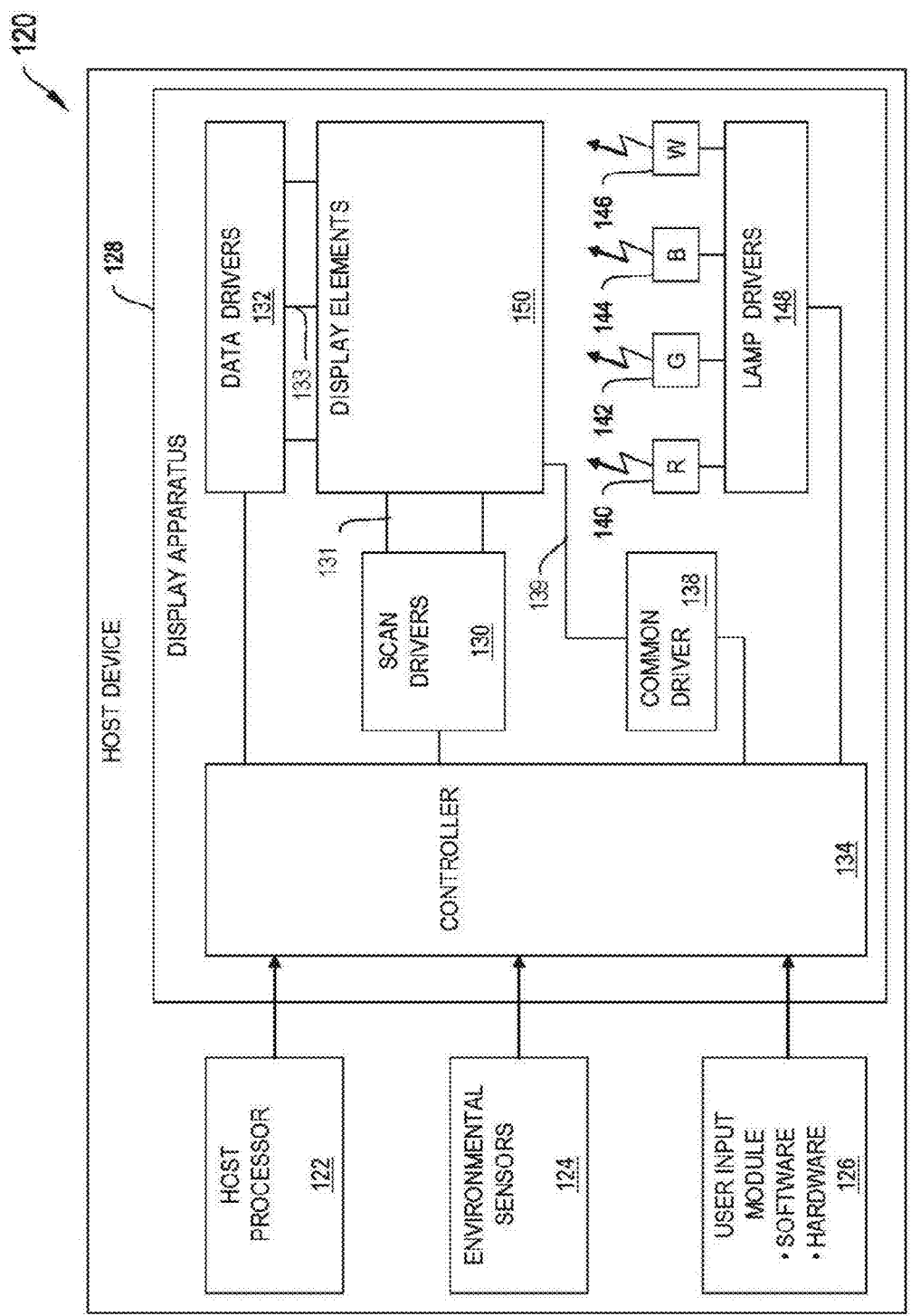
FIG. 1B shows a block diagram of an example host device.

FIG. 1B shows a block diagram of an example host device 120 (i.e., cell phone, smart phone, PDA, MP3 player, tablet, e-reader, netbook, notebook, watch, wearable device, laptop, television, or other electronic device). The host device 120 includes a display apparatus 128 (such as the display apparatus 100 shown in FIG. 1A), a host processor 122, environmental sensors 124, a user input module 126, and a power source.

The display apparatus 128 includes a plurality of scan drivers 130 (also referred to as write enabling voltage sources), a plurality of data drivers 132 (also referred to as data voltage sources), a controller 134, common drivers 138, lamps 140-146, lamp drivers 148 and an array of display elements 150, such as the light modulators 102 shown in FIG. 1A. The scan drivers 130 apply write enabling voltages to scan line interconnects 131. The data drivers 132 apply data voltages to the data interconnects 133.

In some implementations of the display apparatus, the data drivers 132 are capable of providing analog data voltages to the array of display elements 150, especially where the luminance level of the image is to be derived in analog fashion. In analog operation, the display elements are designed such that when a range of intermediate voltages is applied through the data interconnects 133, there results a range of intermediate illumination states or luminance levels in the resulting image. In some other implementations, the data drivers 132 are capable of applying a reduced set, such as 2, 3 or 4, of digital voltage levels to the data interconnects 133. In implementations in which the display elements are shutter-based light modulators, such as the light modulators 102 shown in FIG. 1A, these voltage levels are designed to set, in digital fashion, an open state, a closed state, or other discrete state to each of the shutters 108. In some implementations, the drivers are capable of switching between analog and digital modes.

The scan drivers 130 and the data drivers 132 are connected to a digital controller circuit 134 (also referred to as the controller 134). The controller 134 sends data to the data drivers 132 in a mostly serial fashion, organized in sequences, which in some implementations may be predetermined, grouped by rows and by image frames. The data drivers 132 can include series-to-parallel data converters, level-shifting, and for some applications digital-to-analog voltage converters.

The display apparatus optionally includes a set of common drivers 138, also referred to as common voltage sources. In some implementations, the common drivers 138 provide a DC common potential to all display elements within the array 150 of display elements, for instance by supplying voltage to a series of common interconnects 139. In some other implementations, the common drivers 138, following commands from the controller 134, issue voltage pulses or signals to the array of display elements 150, for instance global actuation pulses which are capable of driving and/or initiating simultaneous actuation of all display elements in multiple rows and columns of the array.

Each of the drivers (such as scan drivers 130, data drivers 132 and common drivers 138) for different display functions can be time-synchronized by the controller 134. Timing commands from the controller 134 coordinate the illumination of red, green, blue and white lamps (140, 142, 144 and 146 respectively) via lamp drivers 148, the write-enabling and sequencing of specific rows within the array of display elements 150, the output of voltages from the data drivers 132, and the output of voltages that provide for display element actuation. In some implementations, the lamps are light emitting diodes (LEDs).

The controller 134 determines the sequencing or addressing scheme by which each of the display elements can be re-set to the illumination levels appropriate to a new image 104. New images 104 can be set at periodic intervals. For instance, for video displays, color images or frames of video are refreshed at frequencies ranging from 10 to 300 Hertz (Hz). In some implementations, the setting of an image frame to the array of display elements 150 is synchronized with the illumination of the lamps 140, 142, 144 and 146 such that alternate image frames are illuminated with an alternating series of colors, such as red, green, blue and white. The image frames for each respective color are referred to as color subframes. In this method, referred to as the field sequential color method, if the color subframes are alternated at frequencies in excess of 20 Hz, the human visual system (HVS) will average the alternating frame images into the perception of an image having a broad and continuous range of colors. In some other implementations, the lamps can employ primary colors other than red, green, blue and white. In some implementations, fewer than four, or more than four lamps with primary colors can be employed in the display apparatus 128.

In some implementations, where the display apparatus 128 is designed for the digital switching of shutters, such as the shutters 108 shown in FIG. 1A, between open and closed states, the controller 134 forms an image by the method of time division gray scale. In some other implementations, the display apparatus 128 can provide gray scale through the use of multiple display elements per pixel.

In some implementations, the data for an image state is loaded by the controller 134 to the array of display elements 150 by a sequential addressing of individual rows, also referred to as scan lines. For each row or scan line in the sequence, the scan driver 130 applies a write-enable voltage to the write enable interconnect 131 for that row of the array of display elements 150, and subsequently the data driver 132 supplies data voltages, corresponding to desired shutter states, for each column in the selected row of the array. This addressing process can repeat until data has been loaded for all rows in the array of display elements 150. In some implementations, the sequence of selected rows for data loading is linear, proceeding from top to bottom in the array of display elements 150. In some other implementations, the sequence of selected rows is pseudo-randomized, in order to mitigate potential visual artifacts. And in some other implementations, the sequencing is organized by blocks, where, for a block, the data for a certain fraction of the image is loaded to the array of display elements 150. For example, the sequence can be implemented to address every fifth row of the array of the display elements 150 in sequence.

In some implementations, the addressing process for loading image data to the array of display elements 150 is separated in time from the process of actuating the display elements. In such an implementation, the array of display elements 150 may include data memory elements for each display element, and the control matrix may include a global actuation interconnect for carrying trigger signals, from the common driver 138, to initiate simultaneous actuation of the display elements according to data stored in the memory elements.

In some implementations, the array of display elements 150 and the control matrix that controls the display elements may be arranged in configurations other than rectangular rows and columns. For example, the display elements can be arranged in hexagonal arrays or curvilinear rows and columns.

The host processor 122 generally controls the operations of the host device 120. For example, the host processor 122 may be a general or special purpose processor for controlling a portable electronic device. With respect to the display apparatus 128, included within the host device 120, the host processor 122 outputs image data as well as additional data about the host device 120. Such information may include data from environmental sensors 124, such as ambient light or temperature; information about the host device 120, including, for example, an operating mode of the host or the amount of power remaining in the host device's power source; information about the content of the image data; information about the type of image data; and/or instructions for the display apparatus 128 for use in selecting an imaging mode.

In some implementations, the user input module 126 enables the conveyance of personal preferences of a user to the controller 134, either directly, or via the host processor 122. In some implementations, the user input module 126 is controlled by software in which a user inputs personal preferences, for example, color, contrast, power, brightness, content, and other display settings and parameters preferences. In some other implementations, the user input module 126 is controlled by hardware in which a user inputs personal preferences. In some implementations, the user may input these preferences via voice commands, one or more buttons, switches or dials, or with touch-capability. The plurality of data inputs to the controller 134 direct the controller to provide data to the various drivers 130, 132, 138 and 148 which correspond to optimal imaging characteristics.

The environmental sensor module 124 also can be included as part of the host device 120. The environmental sensor module 124 can be capable of receiving data about the ambient environment, such as temperature and or ambient lighting conditions. The sensor module 124 can be programmed, for example, to distinguish whether the device is operating in an indoor or office environment versus an outdoor environment in bright daylight versus an outdoor environment at nighttime. The sensor module 124 communicates this information to the display controller 134, so that the controller 134 can optimize the viewing conditions in response to the ambient environment.

Figure 2A:
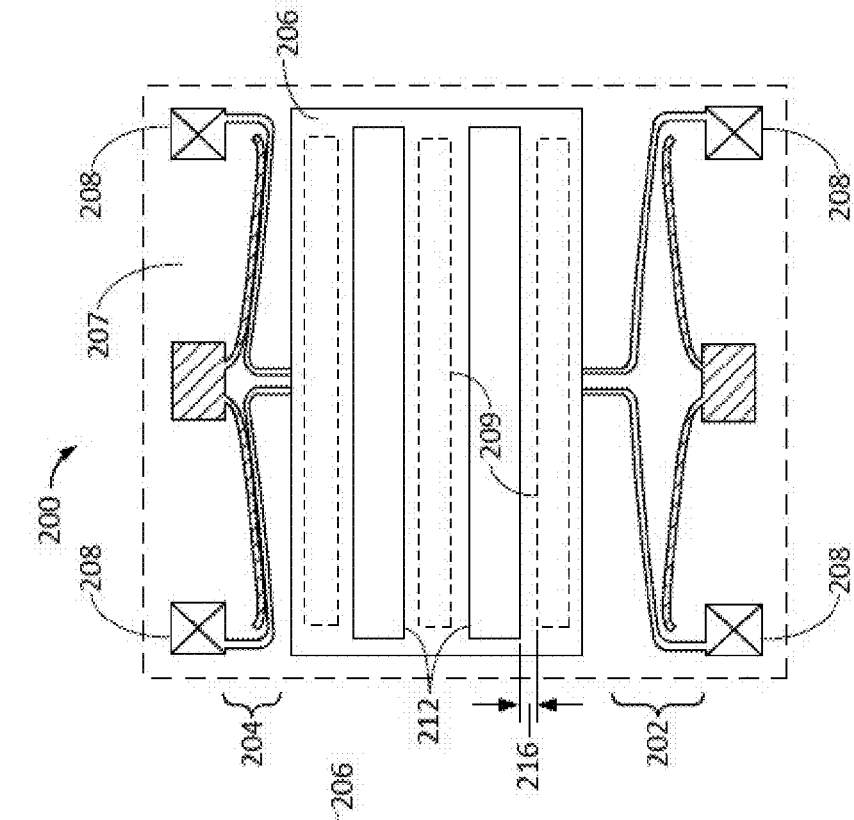
FIGS. 2A and 2B show views of an example dual actuator shutter assembly.
Figure 2B:
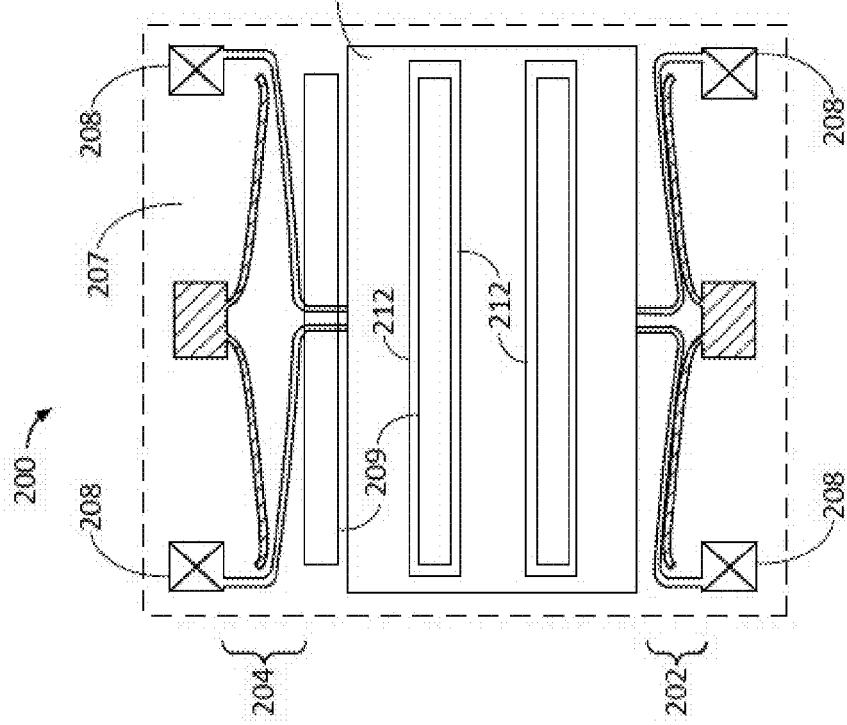

FIGS. 2A and 2B show views of an example dual actuator shutter assembly 200. The dual actuator shutter assembly 200, as depicted in FIG. 2A, is in an open state. FIG. 2B shows the dual actuator shutter assembly 200 in a closed state. The shutter assembly 200 includes actuators 202 and 204 on either side of a shutter 206. Each actuator 202 and 204 is independently controlled. A first actuator, a shutter-open actuator 202, serves to open the shutter 206. A second opposing actuator, the shutter-close actuator 204, serves to close the shutter 206. Each of the actuators 202 and 204 can be implemented as compliant beam electrode actuators. The actuators 202 and 204 open and close the shutter 206 by driving the shutter 206 substantially in a plane parallel to an aperture layer 207 over which the shutter is suspended. The shutter 206 is suspended a short distance over the aperture layer 207 by anchors 208 attached to the actuators 202 and 204. Having the actuators 202 and 204 attach to opposing ends of the shutter 206 along its axis of movement reduces out of plane motion of the shutter 206 and confines the motion substantially to a plane parallel to the substrate (not depicted).

In the depicted implementation, the shutter 206 includes two shutter apertures 212 through which light can pass. The aperture layer 207 includes a set of three apertures 209. In FIG. 2A, the shutter assembly 200 is in the open state and, as such, the shutter-open actuator 202 has been actuated, the shutter-close actuator 204 is in its relaxed position, and the centerlines of the shutter apertures 212 coincide with the centerlines of two of the aperture layer apertures 209. In FIG. 2B, the shutter assembly 200 has been moved to the closed state and, as such, the shutter-open actuator 202 is in its relaxed position, the shutter-close actuator 204 has been actuated, and the light blocking portions of the shutter 206 are now in position to block transmission of light through the apertures 209 (depicted as dotted lines).

Each aperture has at least one edge around its periphery. For example, the rectangular apertures 209 have four edges. In some implementations, in which circular, elliptical, oval, or other curved apertures are formed in the aperture layer 207, each aperture may have a single edge. In some other implementations, the apertures need not be separated or disjointed in the mathematical sense, but instead can be connected. That is to say, while portions or shaped sections of the aperture may maintain a correspondence to each shutter, several of these sections may be connected such that a single continuous perimeter of the aperture is shared by multiple shutters.

In order to allow light with a variety of exit angles to pass through the apertures 212 and 209 in the open state, the width or size of the shutter apertures 212 can be designed to be larger than a corresponding width or size of apertures 209 in the aperture layer 207. In order to effectively block light from escaping in the closed state, the light blocking portions of the shutter 206 can be designed to overlap the edges of the apertures 209. FIG. 2B shows an overlap 216, which in some implementations can be predefined, between the edge of light blocking portions in the shutter 206 and one edge of the aperture 209 formed in the aperture layer 207.

The electrostatic actuators 202 and 204 are designed so that their voltage-displacement behavior provides a bi-stable characteristic to the shutter assembly 200. For each of the shutter-open and shutter-close actuators, there exists a range of voltages below the actuation voltage, which if applied while that actuator is in the closed state (with the shutter being either open or closed), will hold the actuator closed and the shutter in position, even after a drive voltage is applied to the opposing actuator. The minimum voltage needed to maintain a shutter's position against such an opposing force is referred to as a maintenance voltage $V_m$.

Figure 3A:
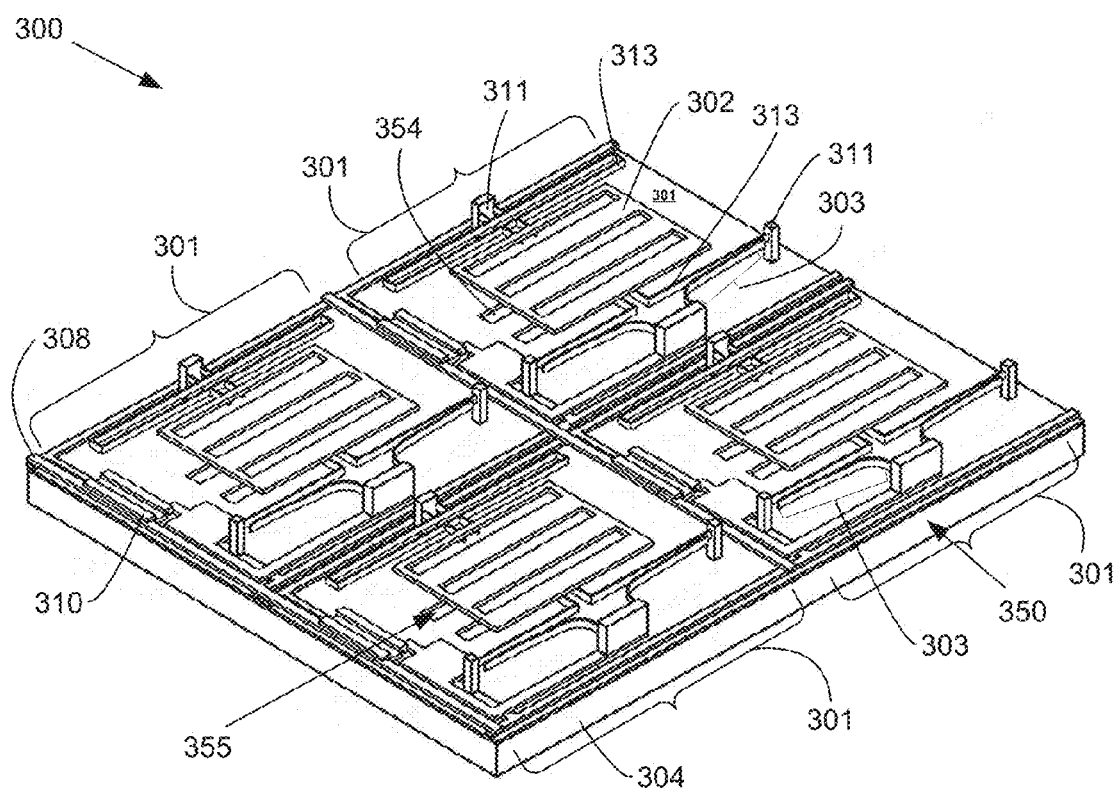
FIGS. 3A and 3B show a MEMS shutter assembly formed on a substrate.
Figure 3B:
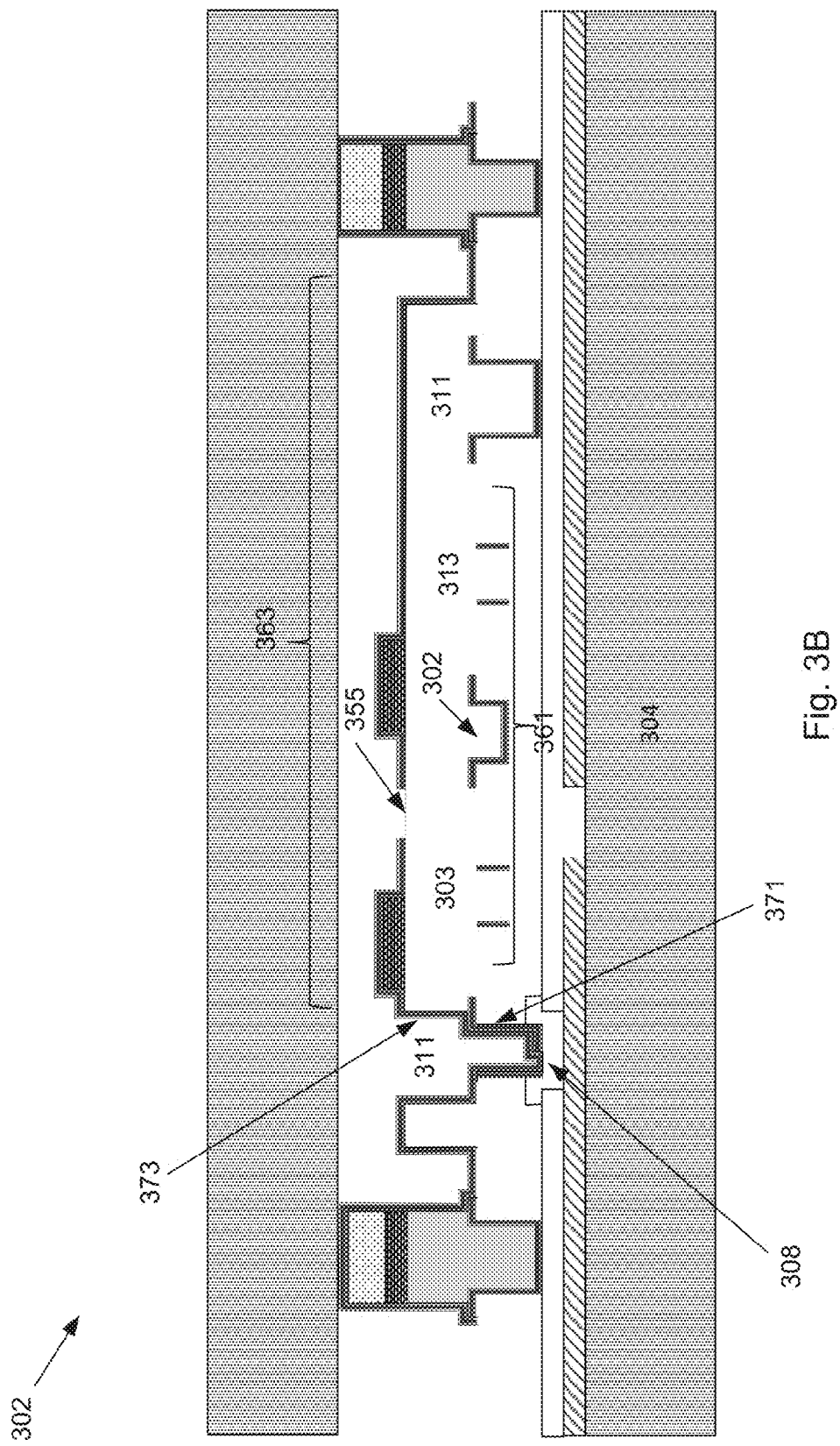

The systems and methods described herein may be employed to form any type of microelectromechancial device, including any device having features with dimensions comparable to the dimensions that are achieved using processes for forming semiconductor devices, such as processes employed for forming patterns of semiconductor material on a surface. A MEMS device can include, without limitations, a light modulator, a microphone, a sensor, piezoresistors, piezoelectric crystals, devices for electromechanical actuation, filters, devices for signal transduction and any other type of component typically employed with semiconductor based electronic devices. For the sake of illustration only, the systems and methods described herein will be discussed with reference to a MEMS shutter assembly for use in a display. FIGS. 3A and 3B show a MEMS shutter assembly formed on a substrate. In particular, FIG. 3A is an isometric view of a portion of an array 300 of shutter assemblies, where each shutter assembly may provide a pixel within an image of a display. The array 300 of shutter assemblies includes four pixels 301 arranged in rows and columns, but a typical display will have thousands of pixels. Each pixel 301 is a semiconductor device fabricated on the surface of a substrate 304. In particular, each pixel 301 is a semiconductor device that includes an aperture 354 and a shutter assembly 302, both of which have been fabricated on the substrate 304. The pixels 301 include components such as the shutter assembly 302, an actuator 303, the apertures 354 and electrical interconnect components, such as the depicted data interconnect 308. The individual components of each pixel 301, such as the actuator 303, or the shutter assembly 302 include semiconductor components manufactured using a process flow that forms the components as elements carried on the surface of the aperture layer 350. The aperture layer 350 is a component as well and is deposited and patterned onto the substrate 304. The aperture layer 350 provides apertures that light can pass through to create an image. In some implementations, the substrate 304 may be a transparent substrate, such as glass, silica, plastic, or some other material suitable for receiving a layer of semiconductor material that can act as the aperture layer 350 and be processed to form the different components that make up each pixel 301. Optionally, a control matrix as described with reference to FIGS. 1A and 1B, may be fabricated on the aperture layer 350 and different components such as thin film switches, transistors and capacitors and interconnects, such as the data interconnect 308 may be formed on the aperture layer 350. The processes employed to fabricate these components can be the typical processes known in the art of manufacturing for active matrix arrays for use in displays.

The aperture layer 350 may consist of thin film materials that are process-compatible with the active matrix fabricated on that aperture layer 350. The aperture layer can have holes, such as the apertures 355 that may be formed by etching portions of the aperture layer 350 until the substrate 304 is exposed. The processes for fabricating holes, such as the apertures 355 can be the same thin film processing techniques used to fabricate the active matrix on the aperture layer 350, and only mask designs or pixel layouts need to be changed to accommodate the formation of aperture holes.

Typically, the aperture layer 350 is deposited as a single thin film onto the substrate 304. Deposition may be accomplished by evaporation, sputtering, chemical vapor deposition, or any suitable technique. The aperture layer 350 may be any suitable semiconductor material, such as amorphous or polycrystalline silicon (Si), geranium (Ge), a gallium arsenide (GaAs) material, or any other suitable material that can be deposited in films having in excess of 500 nm.

FIG. 3A further depicts that the pixels 301 are MEMS devices that include mechanical components that are movable relative to the aperture layer 350. In one process, the components of the pixels 301 are formed using a mold that can support the deposition of semiconductor materials that can be patterned and formed to create the individual components of the pixels 301. For example, molds may be used to create plateaus that will support the deposition of a semiconductor material, such amorphous silicon (aSi). The aSi may be laid on the plateau as a thin film. The deposited thin film may be hardened and the mold supporting that thin film may be etched, washed, or otherwise removed to the leave the thin film in place to act as the shutter 302. The shutter 302 is spaced a distance away from the surface of the aperture layer 350. To that end, anchors 311 are formed on the surface of the aperture 350 and extend from the surface of the aperture layer 350. Sidewall beams 313 connect between the anchors 311 and the shutter 302 to hold the shutter 302 in place and away from the surface of the aperture layer 350. The sidewall beams can be movable beams having an aspect ratio of greater than about 4 to 1, and perhaps more than 16 to 1, to provide narrow profile and a flexible beam that can be moved by application of an electromotive force. The anchors 311 may attach to the substrate 304 to provide a stable and secure attachment for the components, such as the shutter 302, that are supported by the anchor 311. The anchor 311 may connect to a conductive surface on the substrate 304. The conductive surface can couple the anchor 311 into electrical communication with the driver circuits and other elements that can apply electrical signals to the pixel 301 through the anchor 311.

FIG. 3A illustrates one implementation of a MEMS device, and this illustrated MEMS device has two layers of components. A first layer, the aperture layer 350, lays over the substrate 304 and provides a layer of semiconductor material that includes apertures 355.

A second layer is positioned above the aperture layer 350 and overlaps a portion of the aperture layer. This second layer includes the shutter 302 and the actuators 303 as well as other components held in place a distance away from the aperture layer 350. In some implementations the first layer and the second layer are formed by depositing a first layer of material or a set of layers of material on a mold and then building a second mold on that layer or layers. Materials may be deposited on that second mold to form the second layer of components. By removing the first and second molds, the two layers of components are released to leave the aperture layer 350 proximate the substrate 304 and the shutter 302 and the actuator 303 above the substrate layer 350.

In some implementations, the exterior surfaces of the components in the first and second layers have a passivation coating. The passivation coating is deposited on to the first and/or second mold to form an exterior surface of one of the layers of components. After release, the first layer of components and second layer of components have a passivated exterior and do not require a passivation process. This can reduce the possibility that deposition of a passivation material over the movable components, such as the actuators 303, interferes with operation of those components.

FIG. 3B shows one shutter assembly 302 in cross-section. The shutter assembly 302 includes a first layer 361 of components including the actuators 303, the spring 313 and the shutter 302, and a second layer 363 of components, which include the apertures 355. Both layers 361 and 363 connect to the anchor 311. Both layers 361 and 363 have a layer of passivation material covering at least a portion of the exterior surface of the layer. As discussed above, the layers 361 and 363 may be formed from one or more thin films of semiconductor material. The layer 361 includes an arm 371, formed of thin films of semiconductor material, and extending toward the surface of the substrate 304. The arm 371 forms a portion of the sidewall of the anchor 311. The layer 363 has an arm 373 formed of thin films of semiconductor material and extending toward the surface of the substrate 304. The thin films of arm 373 overlap and connect to the thin films of arm 371 and form a portion of the sidewall of anchor 311. The bottom wall of anchor 311 contacts the conductive surface of the interconnect 308. The anchor 311 holds the layers 361 and 363 away from the surface of the substrate 304 and in an overlapping arrangement.

To form the components of the pixel 301, resist material is deposited on the surface of the substrate 304 to form a mold. The mold may be used to cast the different components of the pixel 301, and can provide the shape, or at least part of the shape of each component of the pixel 301. A layer of passivation material may be deposited over the mold and additional thin film layers may be deposited to build layers on the passivation layer and form the components within the layer. The result of these depositions is a thin film structure, typically a beam, built on top of the mold with an exterior layer of passivation material.

Another mold may be formed over this first beam and that mold may allow for the formation of another beam that includes the apertures 355 of the pixel 301. To this end, one or more layers of material may be deposited on this other mold and these layers may be covered with a layer of passivation material. Once the deposited layers have formed the components on the mold, the mold material is washed, etched or otherwise removed to leave the components in place with a passivated exterior surface and attached to the substrate.

FIG. 4 shows a cross-sectional view of a substrate having a conductive surface. FIG. 4 shows one stage of device fabrication of some implementations of the devices of the type described herein, including, for example, devices that have a substrate with a conductive surface and with two thin film beams, both of which are spaced away from the substrate and held away from the substrate by an anchor. The two beams may be arranged so that one beam overlaps the other beam. In some implementations, the anchor has a sidewall that is formed from the arms that are extending from the two beams. The arms may be joined and overlapping to form a thin film beam that provides one sidewall of the anchor. In particular, FIG. 4 shows a substrate 350 having a layer of metal 352 deposited on the substrate 350, and a layer of passivation material 354 deposited on the metal layer 352. In one implementation, the substrate is formed of glass. The glass substrate can be formed of display grade glass, soda lime glass, among other examples. In some implementations, the glass substrate has a thickness greater than or equal to about 0.2 millimeters (mm), to provide the desired amount of rigidity. In alternative implementations, other materials such as silicon, plastic, or metal can be used in place of or in addition to glass as the material for the rigid substrate. In some implementations, the glass substrate includes a coating such as SiO2, SiNx, and/or various metals. The substrate can also be formed of a ceramic, such as AlOx, YOx, BNx, SiCx, AlNx, or GaNx. In other implementations, the substrate is formed of a compound semiconductor, such as GaAs, GaP, or GaN. In further implementations, the substrate is a Si wafer, for example, with a thickness greater than or equal to about 0.1 mm or 0.2 mm. One or more coatings such as SiO2, SiNx, and/or some materials can be applied to the Si wafer. In further implementations, metal substrates formed of various kinds of metals such as stainless steel, Al, Ti, Cr, Cu, W, Ni, V, Mo, Co, Ta, Fe, Pt, Au, Zn, Sn and/or alloys of such metals, for instance, AlCu, AlSi, AlCu, AlTi, AlSc, AlNd, AlCr, AlCo, AlTiSi, AlCuSi, AlSc, AlY, CrCu, CrMo, CrRu, CrTa, CrTi, CrV, CoNi, NiV, AlFe, NiFe, WSi, and WTi can be used. The various substrates described herein can be laminated, in some implementations.] The metal layer 352 has a recess 356 that is filled with material from the passivation layer 354. The passivation layer 354 has a recess as well that is filled with a conductive material 358. The conductive material 358 forms a pad that contacts the metal layer 352. In one implementation, the conductive material 358 is indium tin oxide (ITO), or some other suitable material for providing an electrical connection with the metal layer 352 and providing a conductive surface within the passivation layer 354. In other implementations, the conductive material 358 may be zinc oxides (ZnOx), Titanium (Ti), titanium nitrides (TiNx), molybdeum nitrides (MoNx), tantalum and tantalum nitrides (Ta, TaNx), and multilayers of diffusion barrier and aluminum (Al). A diffusion barrier may be Ti, Mo, TiNx, MoNx, Ta and TaNx. The metal layer 352 may be a layer of metal material, such as aluminum (Al), copper (Cu), cobalt (Co), tantalum (Ta), titanium (Ti), molybdenum (Mo), gold (Au), silver (Ag), multilayers of these materials, combinations of these materials and alloys of these materials or some other material that conducts electrical signals sufficiently well to provide electrical signals to the components of the pixel 301. The metal layer 352 may be a single layer of material or a composite of materials, including materials typically provided to control diffusion and improve conductivity of the metal layer 352.

As noted above, the substrate 350 may be glass, plastic, silica containing material, single crystal or amorphous silicon (aSi), other single crystalline materials such as quartz or gallium arsenide (GaAs), or any other suitable substrate material that can receive a thin film of deposited material. In some implementations the substrate 350 is formed of a transparent material such as optically transmissive forms of aluminum oxide ($Al_2O_3$), silicon oxide ($SiO_2$), silicon nitride ($Si_3N_4$) or other suitable materials. The passivation layer 354 may be any suitable passivation material. Typically the passivation layer is silicon nitride (SiNx). The SiNx can form a nitride layer on the surface of the metal layer 352 and may act as a protective layer on the surface of the metal. In some implementations, the passivation layer 354 may also include $SiO_2$, SiOxNy and spin on glass (SOG). Optionally, a polymer coating may be used. In some implementations the polymer coating may include a high temperature polymer, such as polyimide, benzoclyclobutene (BCB), and multi-layers of polymer and dielectric films such as SiNx. Further optionally, in some implementations this dielectric layer maybe formed on the passivation layer to provide resistance to ashing, such as oxygen ashing. In some implementations, such a dielectric layer may include SiNx, SiO2 or SiONx. The passivation layer 354 typically provides electrical stability by isolating components of the MEMS device from electrical and chemical conditions that may be in the environment in which the MEMS device is operating. The thickness of the metal layer 352 and the passivation layer 354 may be selected according to techniques known in the art and any suitable thickness can be employed without departing from the scope hereof. The metal layer 352 provides a conductive surface that is in contact with the conductive material 358. The thickness of the metal layer may typically be 1000 Å-1 um and in some examples may be 300 Å-3 um. The conductive material 358 may be an indium tin oxide (ITO) material which typically is a tin doped indium oxide, which is a heavily doped semi-conductor material that provides a transparent electrical conductor.

FIG. 5 shows the substrate of FIG. 4 having a layer of photoresist. In particular, FIG. 5 shows a layer of photoresist 362 that covers a portion of the passivation layer 355 on the substrate 350. The photoresist 362 may be spun on the substrate 350 and patterned to provide a mold for features of the first layer of components. The photoresist layer 362 includes a via 364 that exposes the conductive material 358. Additionally, the photoresist layer 362 includes vias 366 that expose the passivation layer 355. The vias 366 and 364 allow for the deposition of materials onto the layers connected to the substrate 350. This provides locations for a component, such as an anchor, that can connect to the substrate 350. These anchors may be used to support the beams that will be suspended over the surface of the substrate 350 and that will contain other components of the device, such as the shutters, actuators and apertures. In some implementations, the thickness of the photoresist layer 362 is selected to define the distance between the substrate 350 and the components, such as the shutters and actuators, that will be in the beam suspended over the surface of the substrate 350. To this end, the vias 366 and 364 can be seen as molds that form the anchors that can connect to the substrate 350 and extend from the substrate 350 and hold components like the shutter 302 away from the substrate 350.

Figure 6:
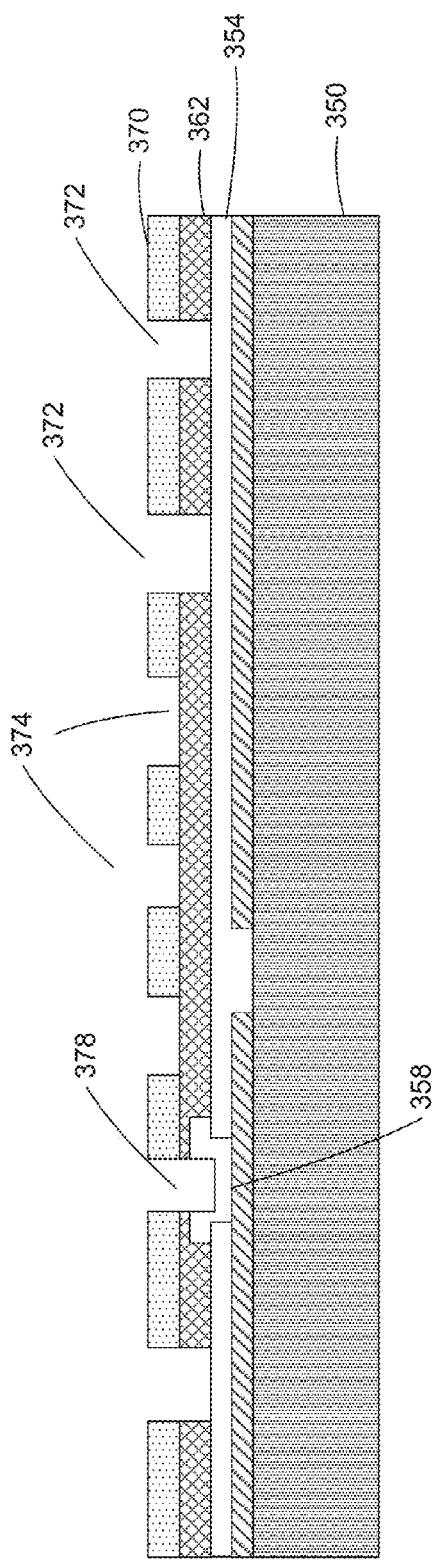
FIG. 6 shows a mold layer formed on the photoresist of FIG. 5.

FIG. 6 shows a mold layer formed on the photoresist of FIG. 5. In particular, FIG. 6 shows the mold layer 370 deposited on the photoresist layer 362. The mold layer 370 can be formed from a photoresist material that was spun over the substrate, hardened and patterned. The pattern supports the formation of components that can be used in the MEMS device. The pattern arises in part from the vias formed within the mold layer 370. In FIG. 6, the vias include vias 372 that expose the passivation layer 355, the vias 374 that expose the photoresist layer 362 and the via 378 that exposes the conductive material 358. The vias 372 and 374 and the upper surface of the mold layer 370 provide the features of the mold that will shape components of the pixel 301, like the shutter 302, and that can attach to the anchors, such as anchors 311 shown in FIG. 3A, formed by the vias 366 and 364 in the layer 362.

Figure 7:
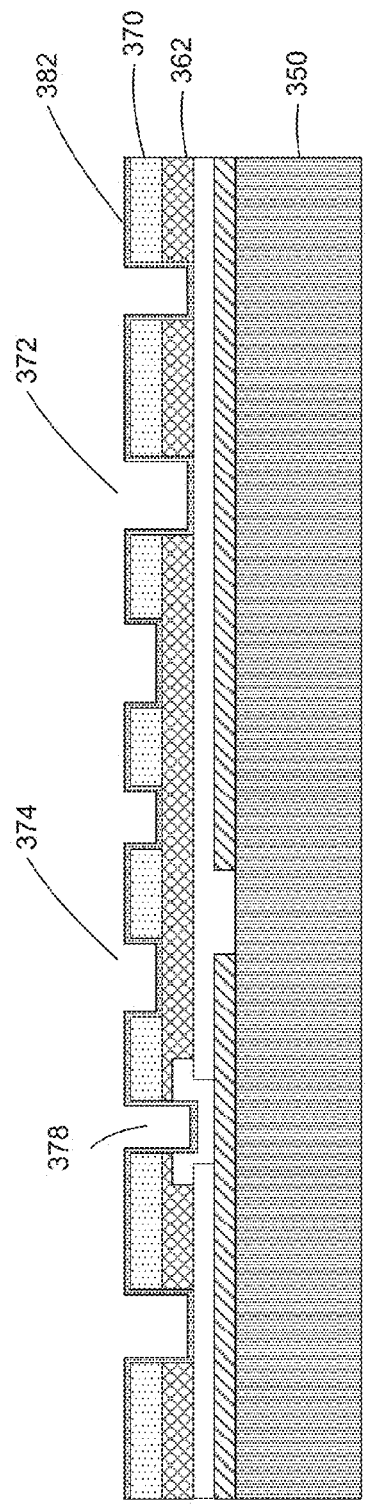
FIG. 7 shows a passivation layer deposited over the mold.

FIG. 7 shows a passivation layer over the mold. In particular, FIG. 7 shows a passivation layer 382 formed over the mold layer 370. In one implementation, the passivation layer 382 is a conformal layer of SiNx that extends over the mold layer 370 and against sidewalls of the vias 372, 378 and 374. In some other implementations the passivation layer may be SiO2, silicon oxynitride (SiNxOy), and AlOx. In some implementations the passivation layer includes a SiOxNy, and the deposition process and composition of the SiOxNy may be adjusted to achieve different ranges of mechanical stress. The passivation layer 382 is typically an electrical insulator that can act as an exterior surface for a component of the MEMS device. To arrange the passivation layer 382 as an exterior surface for components in a MEMS device, such as the pixel 301, the process deposits the passivation layer 382 as the layer that is directly in contact with the mold layer 370. As the mold layer 370 will be removed from the substrate 350 during a release process, the passivation layer 382 will be exposed to the environment of MEMS device and will be an exterior surface for the MEMS device. Typically, the process will deposit additional materials that can form the thin films that makes up components of the MEMS device, such as the shutters 302 and the aperture layer 304 depicted in FIG. 3.

Figure 8:
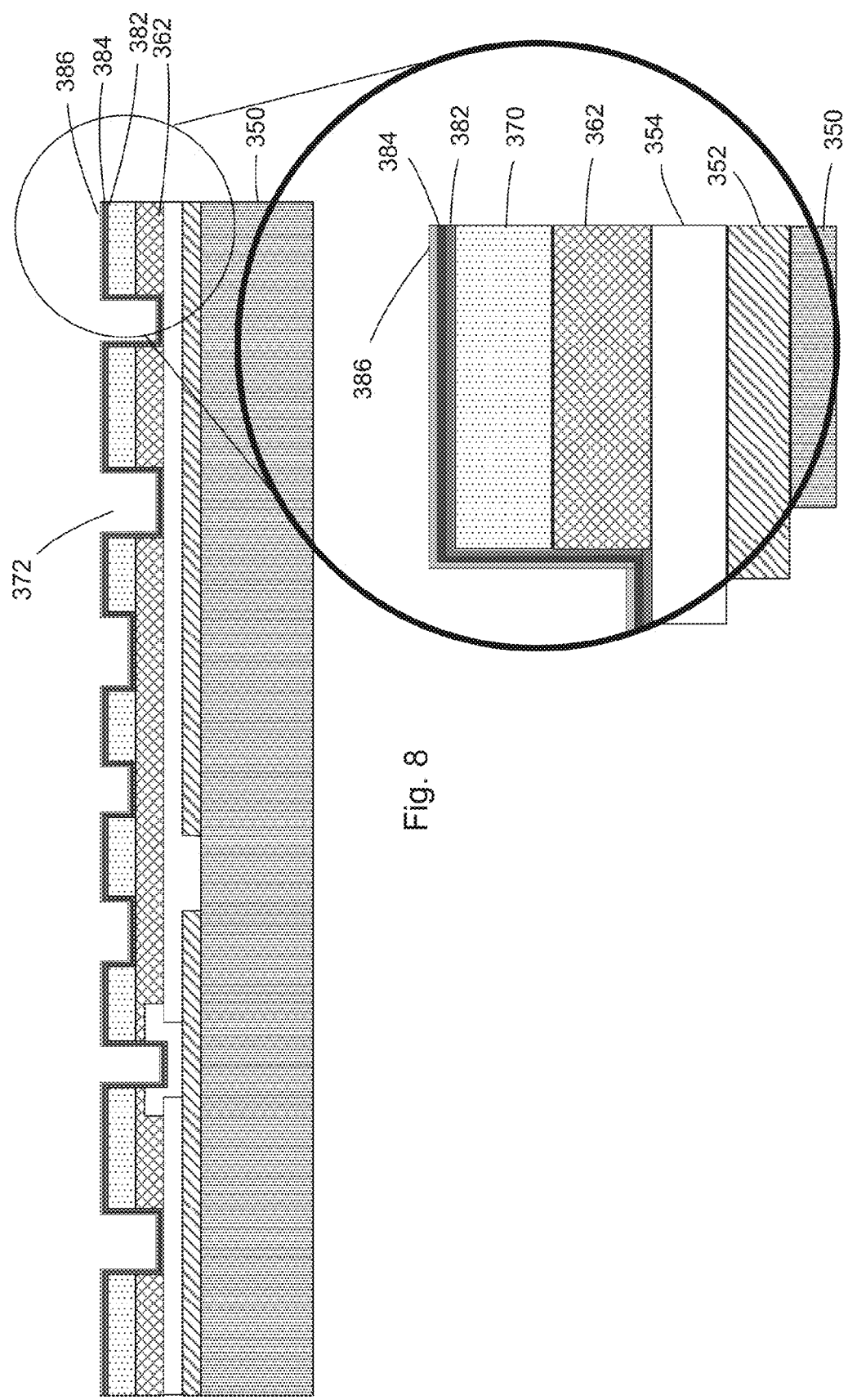
FIG. 8 shows additional layers over the mold.

FIG. 8 shows additional layers deposited over the mold. The additional layers 384 and 386 can be thin films of semiconductor materials such as aSi, titanium (Ti), aluminum (Al) or some other material suitable for forming a component of a MEMS device. In one implementation, the layer 384 is a layer of aSi that is deposited as a conformal layer over the passivation layer 382. The layer 384 of aSi may be optionally baked or otherwise hardened to take the shape of the mold 370, and thereby take the shape of components in the pixel 301. In one implementation the layer 386 is a conformal deposition of Ti. The Ti layer 386 may be an opaque layer for use with optical components, like shutters that blocks light from traveling past an aperture 354. Both the layer 384 of aSi and the layer 386 of Ti can be conductive layers that are capable of carrying an electrical signal within the MEMS components being formed over the mold 370. In some implementations where the layers 384 and 386 form portions of a shutter for blocking light, one or both of the layers may be opaque and capable of blocking light.

Figure 9:
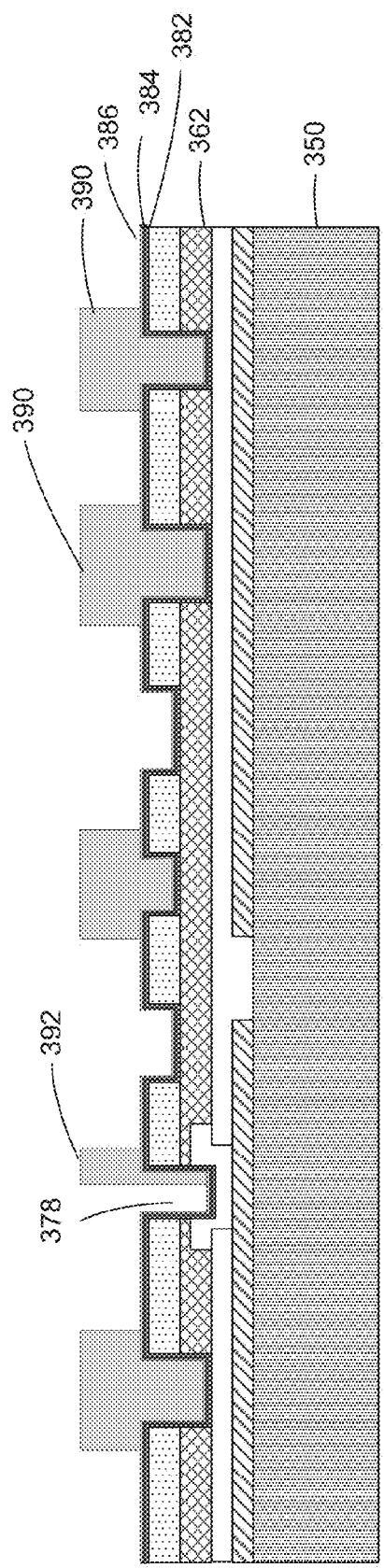
FIG. 9 depicts a pattern of etch resist on the deposited layers.

FIG. 9 depicts a pattern of etch resist on the deposited layers. In particular, FIG. 9 depicts an etch resist material deposited as a pattern of etch resist 390. The etch resist 390 fills the vias within the mold 370, except for the via 378 that is half filled by etch resist material 392 which covers one side wall and a portion of the bottom wall of the via 378. In one implementation, the half-filled via 378 is formed by fully filling the via 378 with etch resist 390 and using a patterned mask to photolithographically select half of the etch resist 390 for removal by solvent or an isotropic selective dry etch. For a positive resist made Soluble by exposure to light, a developer may be applied, such as but not being limited to KOH or tetramethylammonium hydroxide (TMAH). Once the selected etch resist 390 is removed, the via 378 is left half-filled as illustrated. The resist material 390 can be a conventional etch resist material and may be an etch resist material such as a polyamide that has been hard baked. In one implementation, the etch process employed to remove portions of the deposited layers 386, 384 and 382 may be anisotropic dry etch process that uses a chlorine base to etch titanium and amorphous silicon and may include a sulfur fluoride ($SF_6$) or a carbon fluoride ($CF_4$) based dry etch for removing a SiNx passivation layer. In any case, an etch process may be employed for the purpose of etching away portions of the thin films that were deposited upon the mold layer 370 and within the vias 372, 374 and 378.

Figure 10:
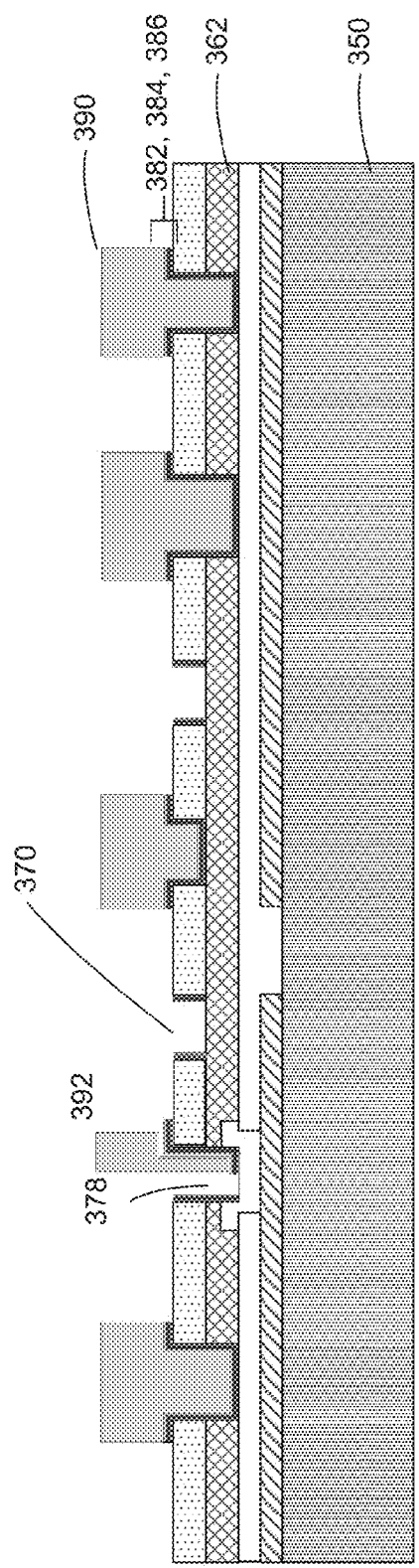
FIG. 10 depicts the etched surface of the substrate.

FIG. 10 depicts the etched surface of the substrate. In particular, FIG. 10 illustrates that the layers 386, 384 and 382 have been removed from the mold layer 370 at those locations that were not protected by the etch resist material 390. The bottom wall of the via 378 has been etched to remove the exposed portions of the layers 386, 384 and 382 and to expose the conductive surface 358. This process essentially cuts the thin film layers 382, 384 and 386, to the correct size and shape so that the thin films are shaped as they should be to form the beam of components in the pixel 301.

Figure 11:
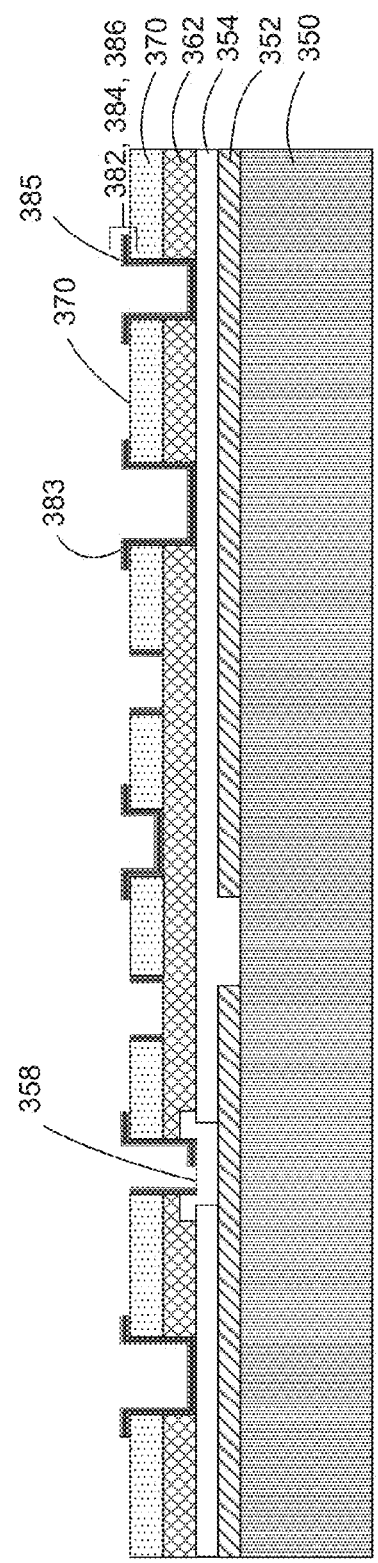
FIG. 11 depicts the substrate with the etch resist removed.

FIG. 11 depicts the substrate with the etch resist 390 and 392 removed. FIG. 11 illustrates components 383 and 385, that are components of the anchors of the MEMS device, formed over the layers 370 and 362. The components 383 and 385 are spaced away from the surface of the substrate 350 by a distance equal to the thickness of the metal layer 352 and the passivation layer 354. FIGS. 12 through 15 show a process for depositing a passivation layer over the components that were formed by the earlier process shown in FIGS. 1-11. Generally, the FIGS. 12 through 15 illustrate the process of depositing a passivation layer, and then etching that layer to have the correct shape for the second beam, such as the beam 363 of FIG. 3B.

Figure 12:
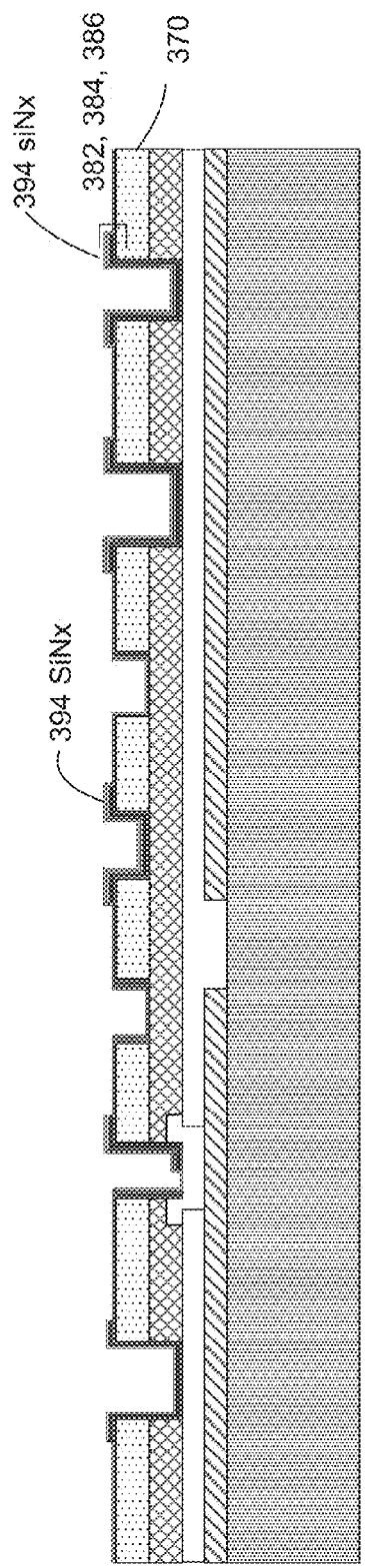
FIG. 12 shows the substrate with a second layer of passivation material.

FIG. 12 depicts the substrate with a second layer of passivation material deposited. In particular, FIG. 12 depicts a second passivation layer 394 that is deposited as a conformal layer of passivation material. The passivation layer 394 covers the exposed surface of the mold layer 370, the surface of the thin film layer 386 and extends into the vias 372, 378 and 374 to provide a conformal layer that coats sidewalls and bottom walls of these vias. Once coated with the second passivation layer 394, the process can apply an etch resist.

Figure 13:
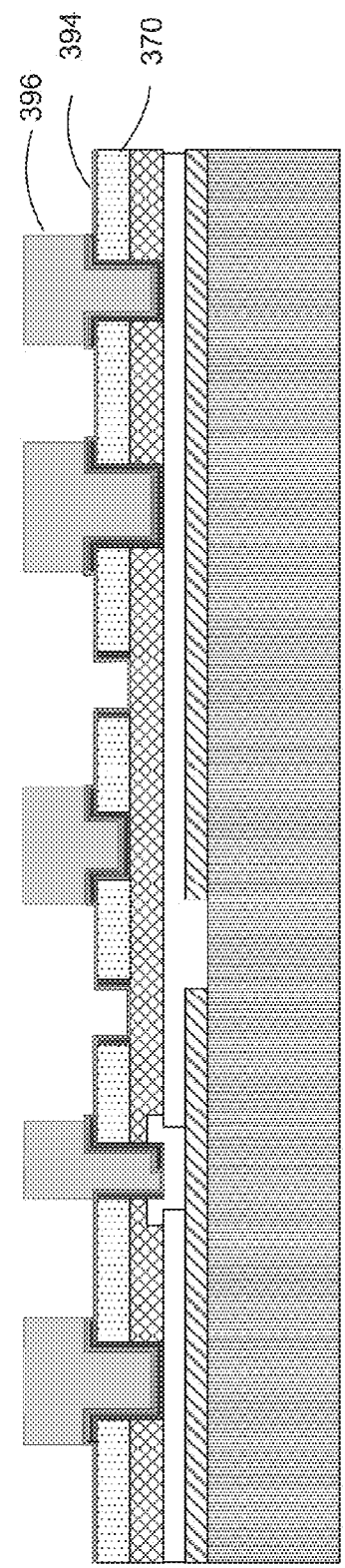
FIG. 13 shows a mask laid on the passivation layer.

FIG. 13 depicts a layer of etch resist 396 deposited at select locations to protect the second passivation layer 394 on certain features of the device, such as certain portions of the vias 372, 378 and 374 formed within the mold layer 370. The etch resist layer 396 can resist an etch process to protect material covered by the resist layer 396. Material exposed to the etch process may be removed from the substrate 350. The pattern of the resist layer 396 is selected to allow an etch process to remove portions of the passivation layer 382 from the mold layer 370 and thereby shape the passivation layer 382 to provide the components of the pixel 301 with a passivated exterior surface.

Figure 14:
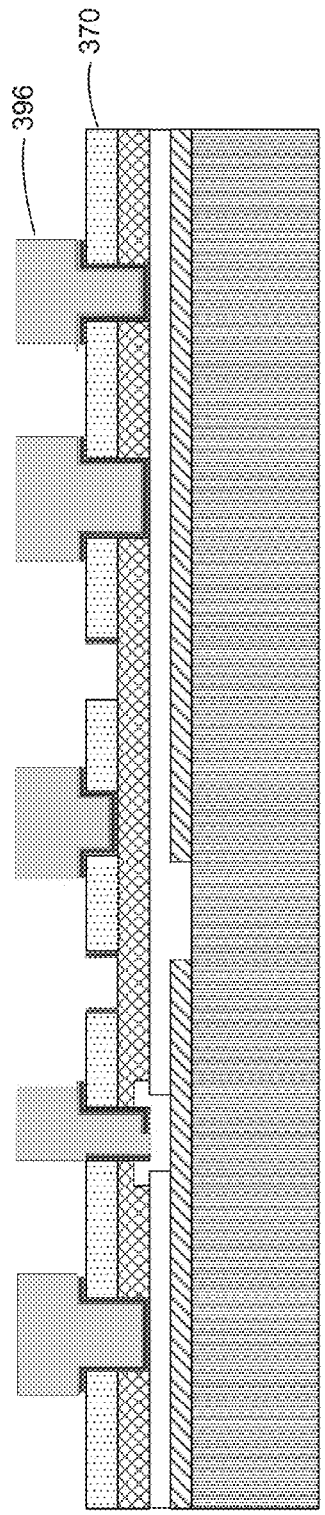
FIG. 14 shows an etched passivation layer.
Figure 15:
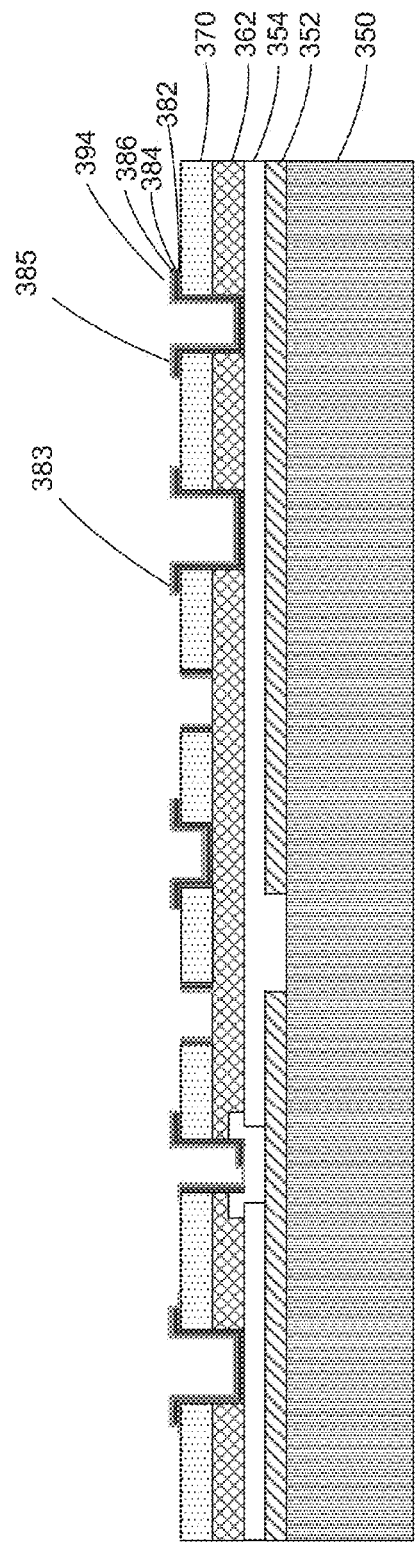
FIG. 15 shows the mask removed from the substrate.

FIG. 14 shows portions of a passivation layer 394 removed by an etch process. FIG. 14 illustrates that the exposed portions of the passivation layer 394 has been removed by an etch process. In one implementation the etch process may be anisotropic etch process, such as a $CF_4$ plasma etch process that can remove a silicon nitride (SiNx) passivation layer. FIG. 14 illustrates that the passivation layer 394 has been removed from all areas that were not covered by the etch resist 396. FIG. 15 illustrates the etch resist 396 stripped from the substrate.

FIG. 15 shows the anchor components 383 and 385 of the MEMS device with a layer of passivation, layer 394, deposited as an exterior conformed coating. The components 383 and 385 also have a layer of passivation material 382, disposed between the components 383 and 385 and the layer 370.

FIG. 16 depicts a layer of photoresist applied to the substrate. In particular, FIG. 16 depicts a layer of photoresist 400 deposited across the surface of the substrate with a pattern that can allow for subsequently deposited layers of material to form elements of components of the MEMS device.

FIG. 17 depicts the substrate after an etch process. In particular, FIG. 17 depicts the effect of an etch process that is an isotropic dry etch process that can remove a passivation layer such as a silicon nitride (SiNx) passivation layer 394. In particular, FIG. 17 shows that the via 378 has been etched to remove the passivation layer 394 from the sidewalls and a portion of the bottom wall of via 378 and expose the conducting material 358. Other sections of the SiNx material have also been etched away, leaving and exposing the layer 386 which had been earlier covered by the second passivation layer 394.

Figure 18:
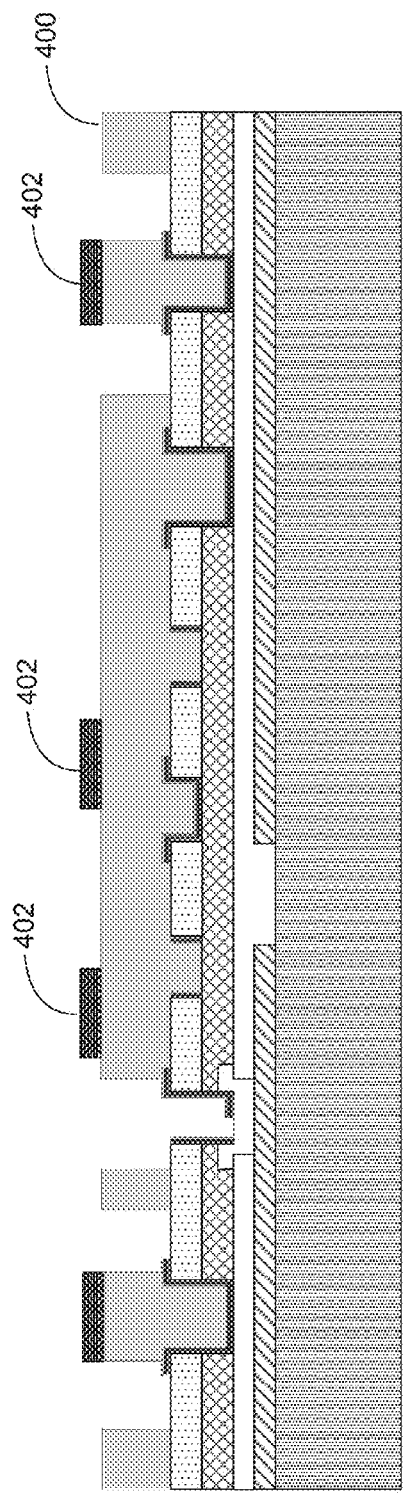
FIG. 18 shows a mold for the second beam deposited on the anchor layer.

FIG. 18 depicts a mold layer for forming components of a MEMS device. In particular, FIG. 18 depicts a mold layer 402 that has been deposited in a pattern across the surface of the photoresist 400. The mold layer 402 can provide structure that will allow a subsequently deposited set of thin film materials to have a shape suitable for forming a beam suspended over the substrate 350 and having components of a MEMS device, such as the apertures 354 illustrated in FIG. 3A.

Figure 19:
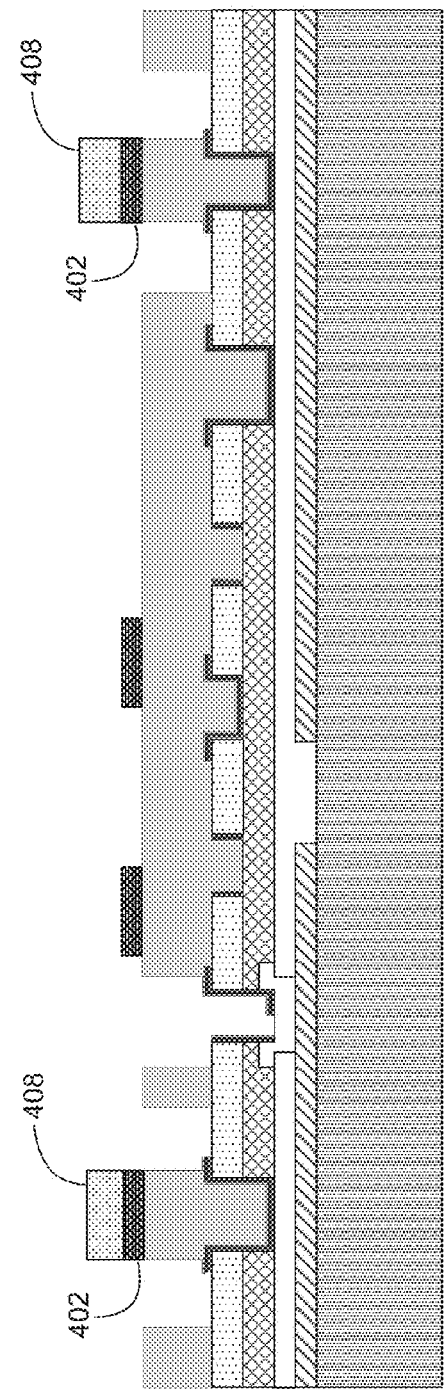
FIG. 19 shows spacers added to the mold.

FIG. 19 depicts deposition of photoresist material for the purpose of providing a spacer component. In particular, FIG. 19 depicts the deposition of spacers 408 which are portions of photoresist material located on top of certain mold sections 402. The spacer 408 can provide additional height to the via structures 372 being formed. In one implementation, the MEMS device is placed into contact with a second substrate and the spacers 408 can contact the second substrate and provide part of the mechanical support and that keeps the second substrate separate from the first substrate 350.

Figure 20:
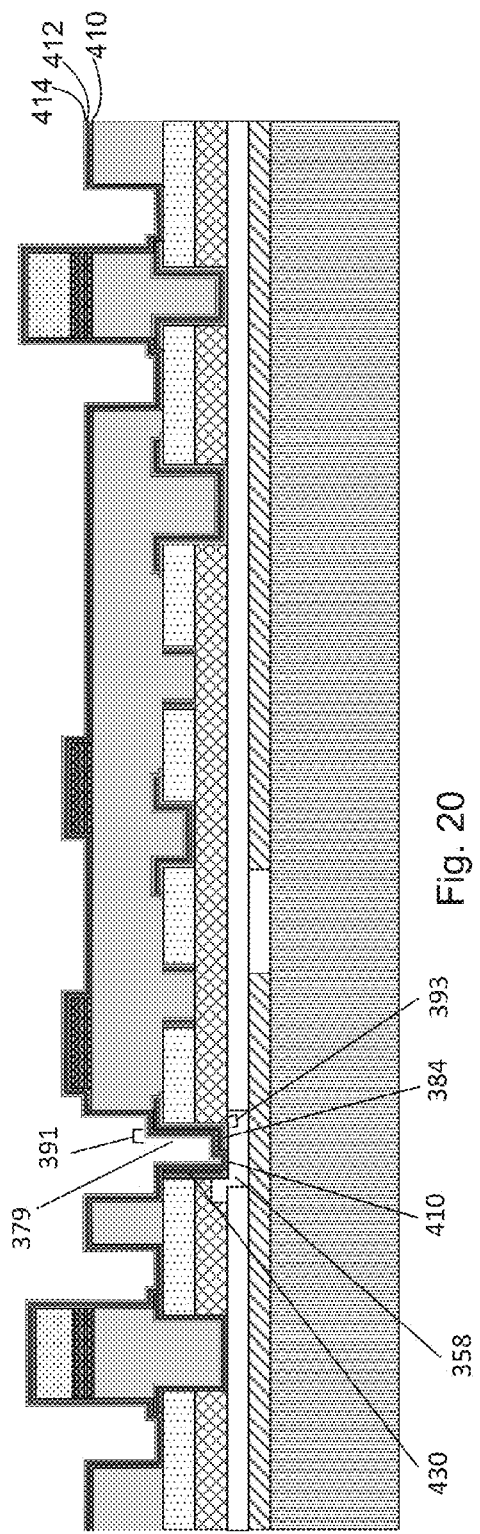
FIG. 20 shows the second beam formed on the mold.

FIG. 20 depicts the deposition of several layers of semiconductor material over the mold and spacers. In particular, FIG. 20 depicts the deposition of several layers of semiconductor material, typically an aSi layer as well as a metal layer, such as Ti metal material, and a passivation layer typically a silicon nitride layer (SiNx). The layers are depicted as one on top of the other and shown as elements 410, 412 and 414 in FIG. 20. The depicted layers are a conformal set of layers in that they follow the pattern of the mold 402 and the spacers 408 and provide conformal deposition on the bottom wall and sidewalls of the via 378. The layer 410 may be aSi and conductive. That conductive layer 410 is deposited on the bottom of the via 378 and into contact with the conducting surface 358. This allows the anchor 430 being formed within via 378 to be in electrical contact with the interconnect layer of the MEMs device. The via 378 has a sidewall 379 that has an arm 391 from the first beam stacked against and overlapping with an arm 393 extending from the second beam of components. The two arms 391 and 393 each are formed from three layers of thin films of semiconductor material (as shown by the brackets at the end of the reference line for the reference numbers 391 and 393. The arms 391 and 393 are joined in an overlapping arrangement to form the sidewall 379 of the anchor 430. The arm 391 includes conductive layer 410 that extends from the substrate 350, along the sidewall 379 and covers portions of the mold layer 400 that is used to form the second beam of components, such as the apertures 354 of FIG. 3A. The conductive layer 410 is also in contact with the conductive layer 384. The conductive layer 384 extends from the substrate 350, along the sidewall 379 and covers portions of the mold layer 370 that is used to form the first beam of components, such as the shutters 302 of FIG. 3A.

Figure 21:
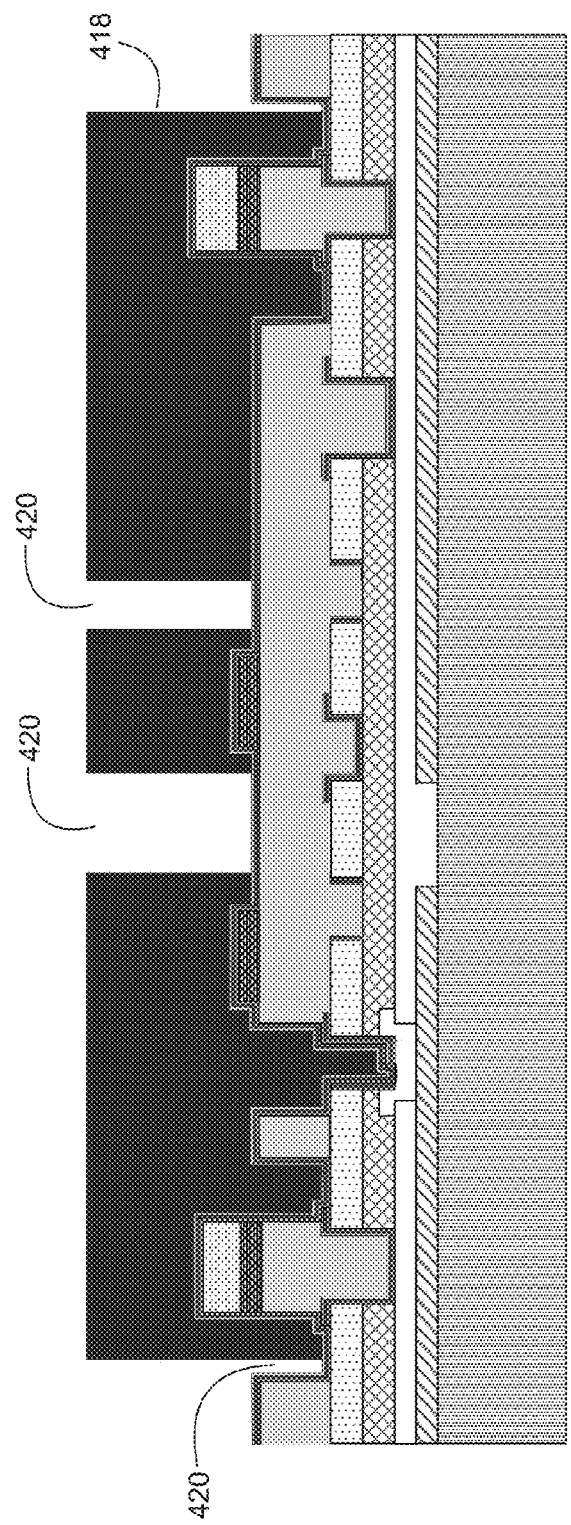
FIG. 21 shows a resist layer laid on the second beam.

FIG. 21 depicts an etch resist material 418 deposited on the substrate. The etch resist material 418 is deposited with a pattern that includes several vias 420. The vias 420 expose portions of the deposited layers 414, 412 and 410.

Figure 22:
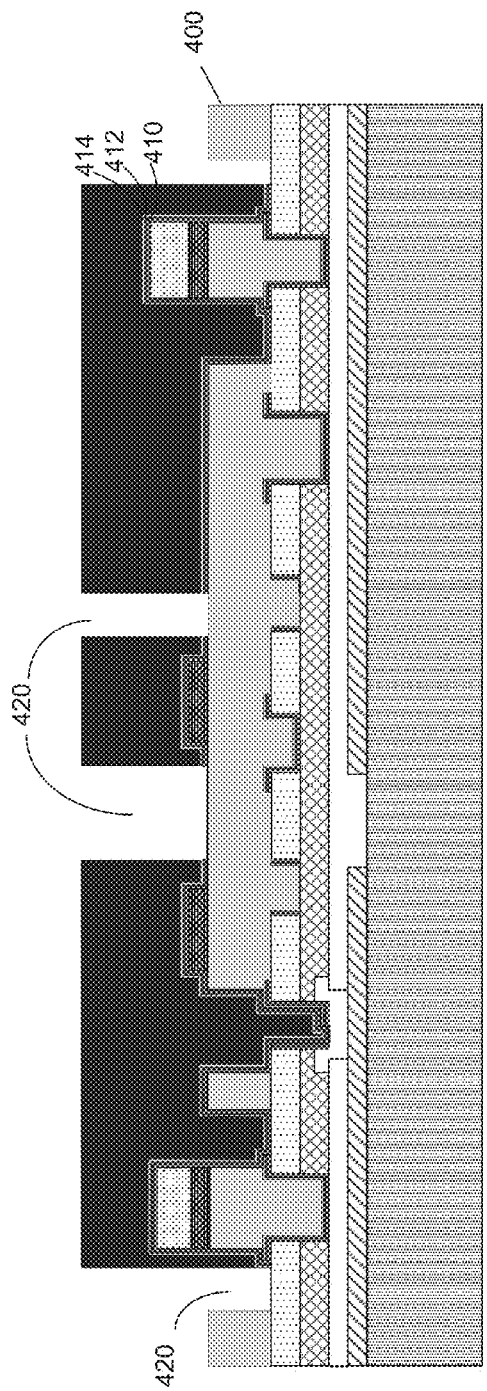
FIG. 22 shows the surface exposed by the resist layer as etched.

FIG. 22 depicts the etched surface of the substrate. In particular, FIG. 22 depicts that exposed portion of the material layers 410, 412 and 414 have been removed from the substrate by an etch process. As such, the exposed portions of these layers 410, 412 and 414 and the exposed portions of those layers in the vias 420 are removed and the underlying layer 400 is exposed.

Figure 23:
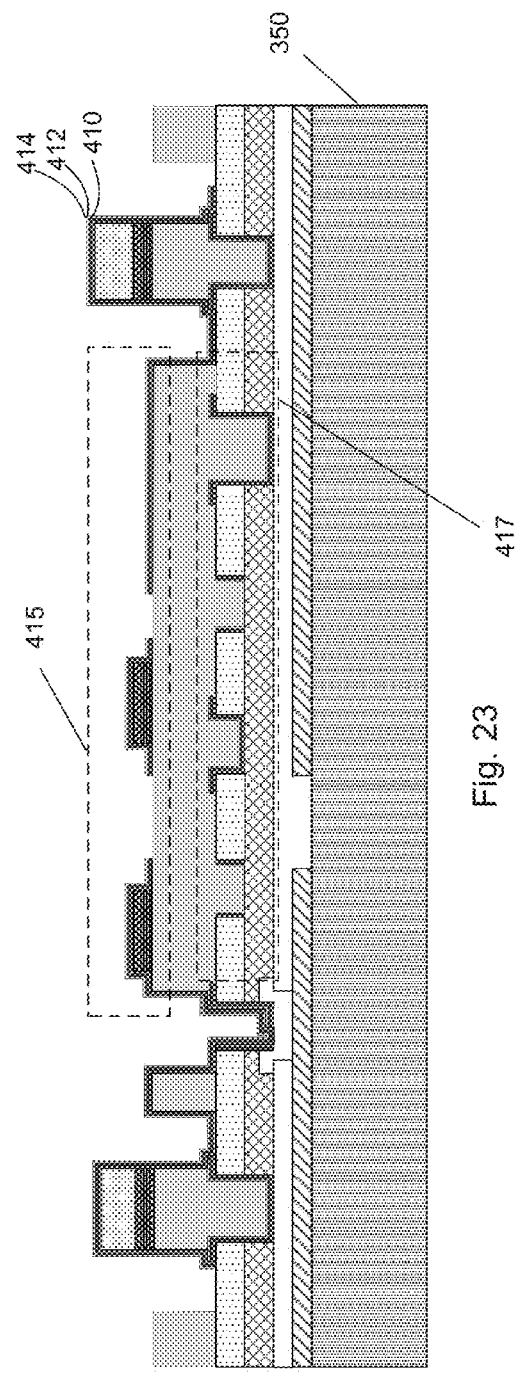
FIG. 23 shows the resist stripped from the substrate.

FIG. 23 depicts the substrate 350 with the etch resist removed. In particular, FIG. 23 depicts the components of the MEMS device formed as two thin film beams 415 and 417 having MEMS components, such as shutters and apertures. The thin film beams 415 and 417 extend essentially parallel to the surface of the substrate 350. The thin film beams 415 and 417 are both connected to the substrate 350 but separated from the substrate 350 so that the thin film beams 415 and 417 are suspended away from the surface of the substrate 350. The thin film beams 415 and 417 are also separated from each other some distance and in the illustration, beam 415 is suspended above beam 417. In between the thin film components are layers of photoresist and mold material that were used to form the shape and pattern of the thin film layers, and therefore the components of the MEMS device.

Figure 24:
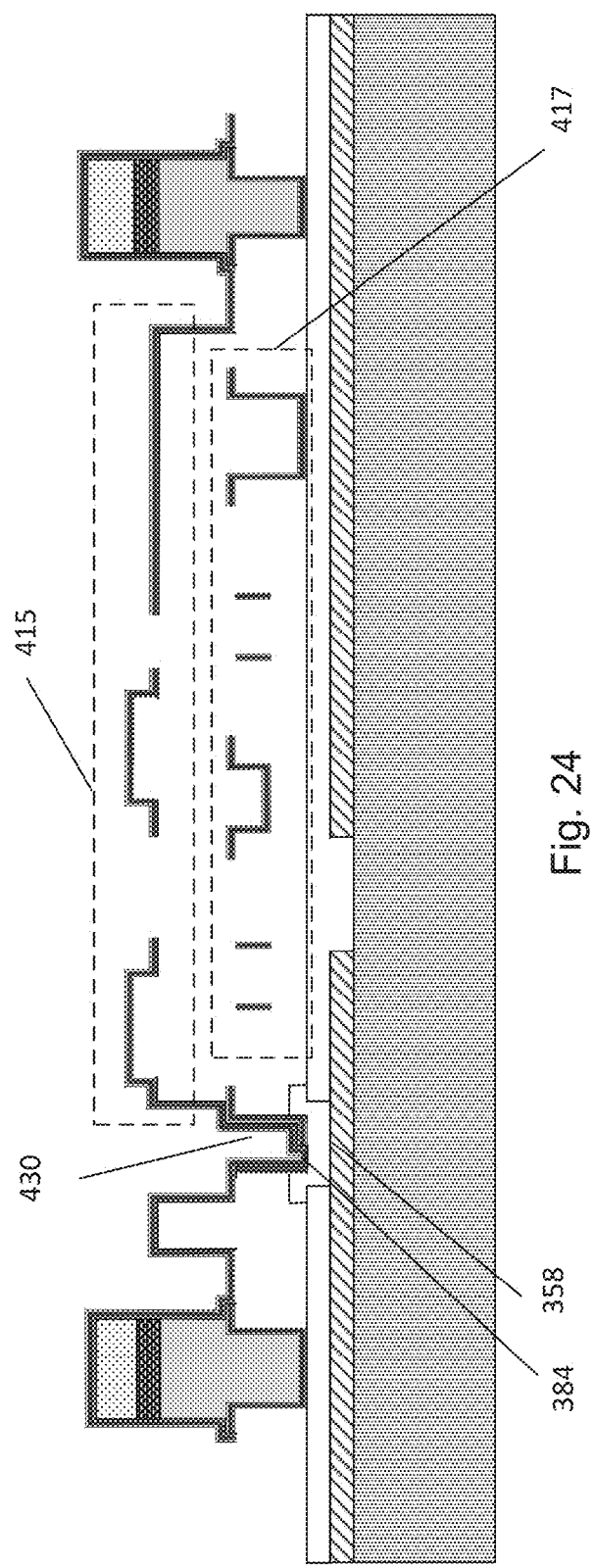
FIG. 24 shows the first beam and the second beam arranged on the substrate.

FIG. 24 shows the MEMS device with the photoresist material that made up the mold around which the devices were formed, stripped away. FIG. 24 depicts that the MEMS device includes a first thin film beam 417 and then a second thin film beam 415. The beams are arranged between and spaced a distance from the substrate 350. There is an anchor 430 that has a portion of layer 384, in some implementations a conductive layer, in contact with the conductive surface 358. The two beams 415 and 417 attach to the anchor 430 and they are held away from the substrate 350. The anchor 430 may, in some implementations, connect the beams 415 and 417 to the conductive surface 358.

The materials described above may be deposited by sputtering, chemical vapor deposition, or any other suitable technique and may extend across the entire surface of the resist material, or over portions of that surface, and how the material is deposited will depend upon the application, the pattern, and the features being created. As noted above, depositing, or any material, on a substrate may be achieved by sputtering, Chemical Vapor Deposition (CVD), electrodeposition, epitaxy, thermal oxidation, by physical reaction, Physical Vapor Deposition (PVD), atomic layer deposition, sputtering, casting, or any other technique for chemically or physically moving a material on to the substrate. Deposition may or may not be conformal, depending upon the application and goals of the process operation. The deposited materials may be passivated to prevent problems such as stiction between surfaces. Passivation may be by fluoridation, silanization, hydrogenation, or any suitable process. Typically, the deposited materials are a thin film having a thickness anywhere between a few nanometers to about 100 micrometers. The deposition of a pattern mold may be by any suitable method. In some implementations the mold may be a hard mask formed or a suitable material, such as a layer of molybdenum (Mo) that is deposited by sputtering on the surface of an annealed resist. Patterning can take place through any suitable process, such as a chemical wash or a dry etch, or any other suitable technique. Etch processes may include wet or dry etch processes. Wet etching processes may include any process that employs a solvent, such as potassium hydroxide (KOH), to dissolve material being removed from the substrate. Dry etching may include sputtering away or dissolving using reactive ions or a vapor phase etching. Both wet and dry etching processes may be anisotropic and/or isotropic.

TABLE 1

Example Passivation Deposition Process

| Material | Conditions Temperature/timing | Operation CVD, etc. |
| --- | --- | --- |
| SiNx | Before beam 1 deposition and after beam 1 etch and strip. 220° C. as baseline in some examples, and typically between 100° C.-220° C. In some implementations the higher temperature may be based in part on the bake temperature for the mold resist. | Plasma CVD, PVD, Evaporation, |
| SiOxNy | Before beam 1 deposition and after beam 1 etch and strip. 220° C. as baseline in some examples, and typically between 100° C.-220° C. In some implementations the higher temperature may be based in part on the bake temperature for the mold resist. | Plasma CVD, PVD, Evaporation, |
| SiO2 | Before beam 1 deposition and after beam 1 etch and strip. 220° C. as baseline in some examples, and typically between 100° C.-220° C. In some implementations the higher temperature may be based in part on the bake temperature for the mold resist. | Plasma CVD, PVD, Evaporation, |
| AlOx | Before beam 1 deposition and after beam 1 etch and strip. 105-120° C. in some examples for H$_2$O/TMA ALD system. Optionally, physically etched by high bias plasma etch. Anodization: After Al deposition, anodization to convert Al to Al2O3. | ALD, PVD, Anodization |
| Diamond Like Carbon | Before beam 1 deposition and after beam 1 etch and strip. 220° C. as baseline in some examples, and typically between 100° C.-220° C. In some implementations the higher temperature may be based in part on the bake temperature for the mold resist. | Plasma CVD |
| AlNx | Before beam 1 deposition and after beam 1 etch and strip. 220° C. as baseline in some examples, and typically between 100° C.-220° C. In some implementations the higher temperature may be based in part on the bake temperature for the mold resist. | Reactive Sputter, Evaporation, Nitration by NH$_3$ plasma after Al deposition. |

Figure 25:
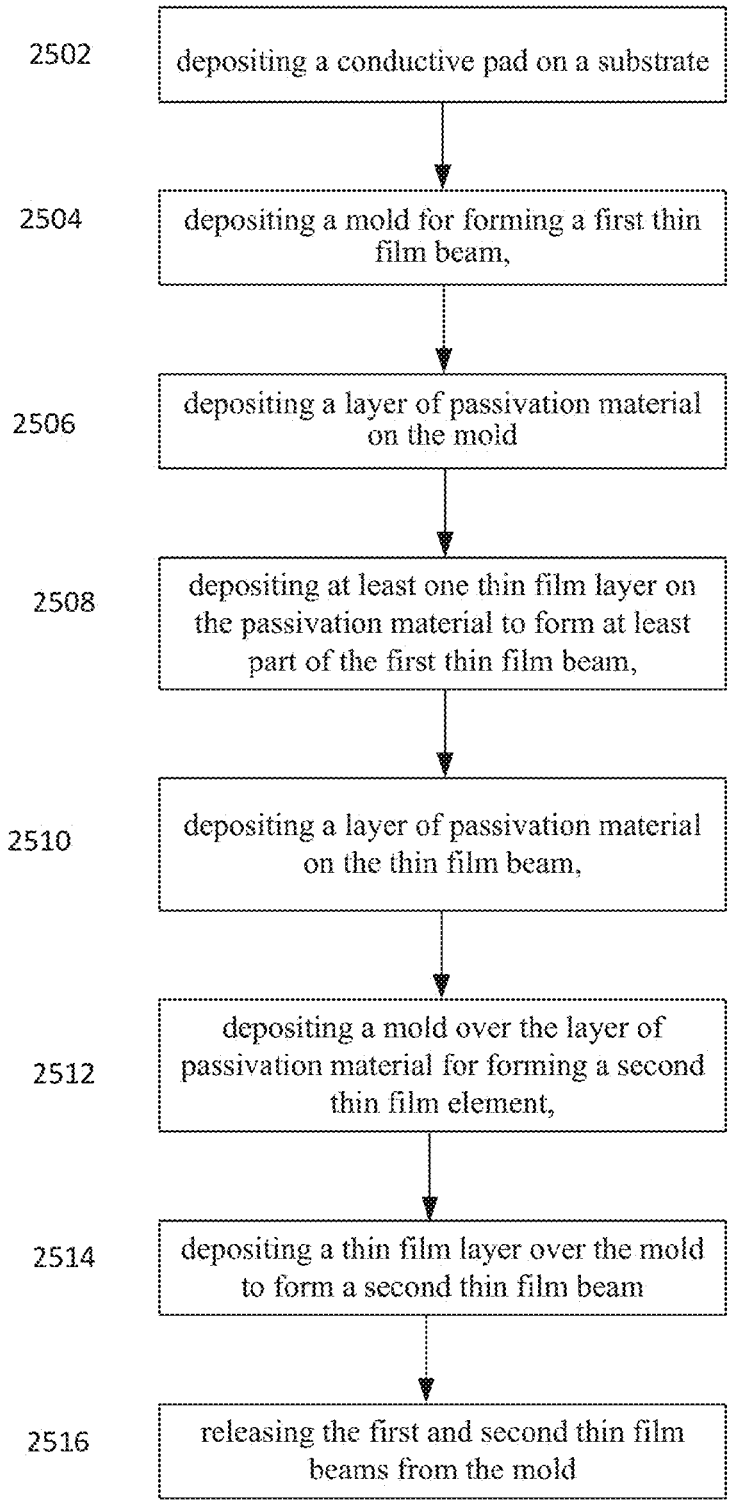
FIG. 25 is a flow chart of a process for forming a MEMS device first beam and a second beam.

FIG. 25 is a flow chart of a process for forming a MEMS device first beam and a second beam. Specifically, FIG. 25 shows a process 2500 that starts at operation 2502 and provides a substrate having a conductive pad on a substrate. In operation 2504, a mold is deposited on the substrate to form a first thin film beam. The mold may be, in some implementations, laid down as a layer of resist material that is patterned to provide the shape and form of the different components that make up the device. In operation 2506, a layer of passivation material is deposited on the mold. In operation 2508, the process deposits at least one thin film layer on the passivation material to form at least part of the first thin film beam. The thickness of the layers being deposited, whether to form the mold or the beam, may vary according to the application being addressed. In one implementation, the operation 2504 deposits layers of resist material that are between 2 and 5 microns in thickness, and in operations 2506 and 2508, layers of passivation material or other semiconductor material that are between about 25 and 125 angstroms are deposited. Depositing may be achieved by sputtering, CVD, PVD, or any other technique, including those earlier mentioned, for chemically or physically moving a material on to the substrate. The first thin film beam may be formed by depositing a series of layers of material, each layer being a thin film layer that joins to the layer it is deposited on. The layers will follow the pattern of the mold and provide the material that will form the different components that are being cast through the mold. The process 2500 in operation 2510 then deposits a layer of passivation material over the first thin film beam. The passivation material, as described above, may be any suitable passivation material that can provide a passivation coating to the beam being formed from the layers deposited over the mold. The process 2500 in operation 2512 deposits a mold over the layer of passivation material for forming a second thin film beam. This second mold can have a pattern that will form the components that will be part of the second beam of the device. In operation 2514, the process deposits at least one thin film layer over the mold to form a second thin film beam, and in operation 2516, the process releases the first thin film beam and the second thin film beam from the mold to form a first beam having a passivation material on an exterior surface and being spaced from the substrate and a second beam spaced from and overlapping the first beam.

The process 2500 illustrates a process that forms a MEMS device having two overlapping beams. However, the process 2500 is not limited to forming a device with two beams or with overlapping beams and may be used to form devices having more than two beams and beams which do not overlap and are laterally spaced from each other.

FIG. 26 is a flow chart of a process for forming a stacked via. Specifically, FIG. 26 shows a flow chart for a process for making a MEMS device, such as the device manufactured using the process 2500 described with reference to FIG. 25, and providing that MEMS device with a stacked via that can support two or more beams and suspend the beams away from the surface of a substrate. The process 2600 has an operation 2602 that forms a via through a first thin film beam and a second thin film beam and extends the via to expose the conductive pad on the substrate. The operation 2602 provides the via to form an anchor within the via for supporting the first thin film beam and the second thin film beam. In operation 2604, the process forms a side wall of the anchor from an arm that is connected to the first thin film beam and from an arm that is connected to the second thin film beam. In operation 2606 the arm of the first thin film beam or the arm of the second thin film beam is provided with a conductive material for connecting the first thin film beam or the second thin film beam to the conductive pad. In operation 2608, either the first or the second thin film beam is connected to the conductive pad and the other thin film beam is spaced away from the conductive pad and electrically connected to the thin film beam that is connected to the conductive pad. This provides an anchor that extends to both beams and can carry electrical signals to both beams.

Figure 27A:
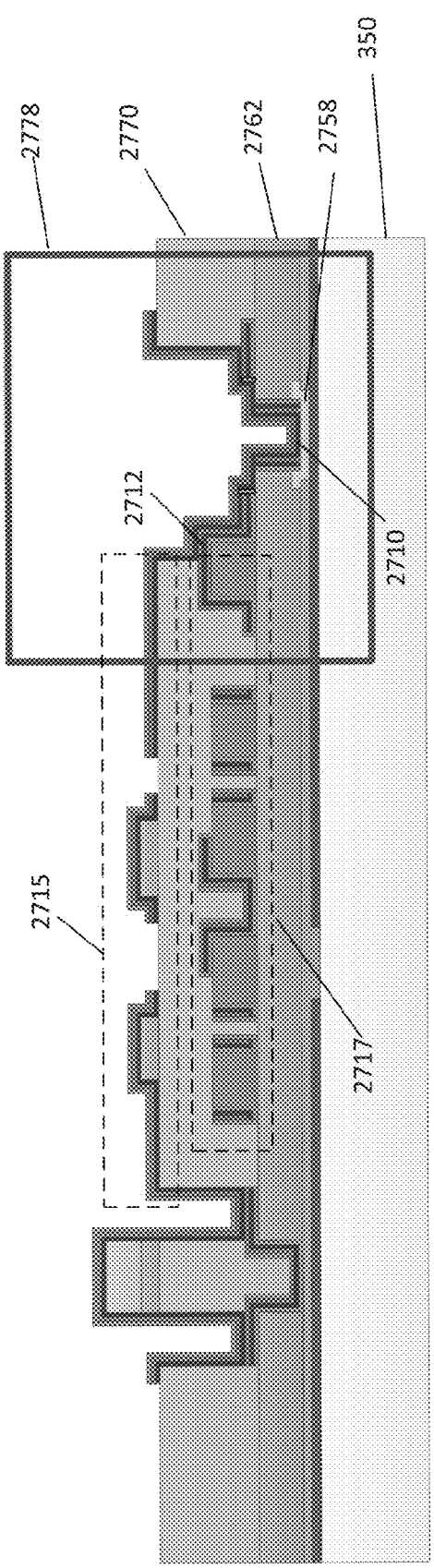

FIGS. 27A and 27B show an alternative implementation of a stacked via. FIG. 27A shows a via 2778, outlined with a box. This via 2778 may be formed using the process flow described with reference to FIG. 26, however the via 2778 employs a top surface of beam 2717 and a bottom surface of beam 2715 as electrical contacts for connecting components within beam 2715 and 2717 to the conductive layer 2758 on the substrate 350. To this end, the via 2778 includes a series of conformal thin film layers including a layer 2710 of conductive material, such as aSi. The depicted layers are a conformal set of layers in that they follow the pattern formed by the resist layers 2770 and 2762. The conductive layer 2710 is deposited on the bottom of the via 2778 and placed into contact with the conducting surface 2758. This allows for an anchor to be formed within via 2778 and to have that anchor be in electrical contact with the interconnect layer of the MEMs device. The via 2778 connects to and supports the first beam 2717 and connects to and supports the second beam 2717. The layer 2710 extends into the second beam 2715. The layer 2710 also contacts and makes an electrical connection to a layer 2712 that also may be a conductive material such as aSi and that extends through the first beam 2717. FIG. 27B shows the anchor 2711 formed by releasing the conformal layers deposited on the via 2778 formed in the resist layers 2770 and 2762 and shown in FIG. 27A. The anchor 2711 has a layer 2714 of passivation material around its exterior. The anchor 2711 holds the two beams 2715 and 2717 away from the surface of the substrate and connects the two beams to the conductive layer 2758.

FIGS. 28-41 show cross-sectional schematic views illustrating various stages of manufacturing an example MEMS device 502, according to some implementations. The MEMS device 502 may form one or more light modulators within a display. For example, the MEMS device 502 may include a first thin film beam 617 and a second thin film beam 615 that form one or more light modulators within the display. The MEMS device 502 may form one or more pixels within the display. The stages for manufacturing the MEMS device 502 may include different, fewer, or additional operations than illustrated in FIGS. 28-41.

Figure 28:
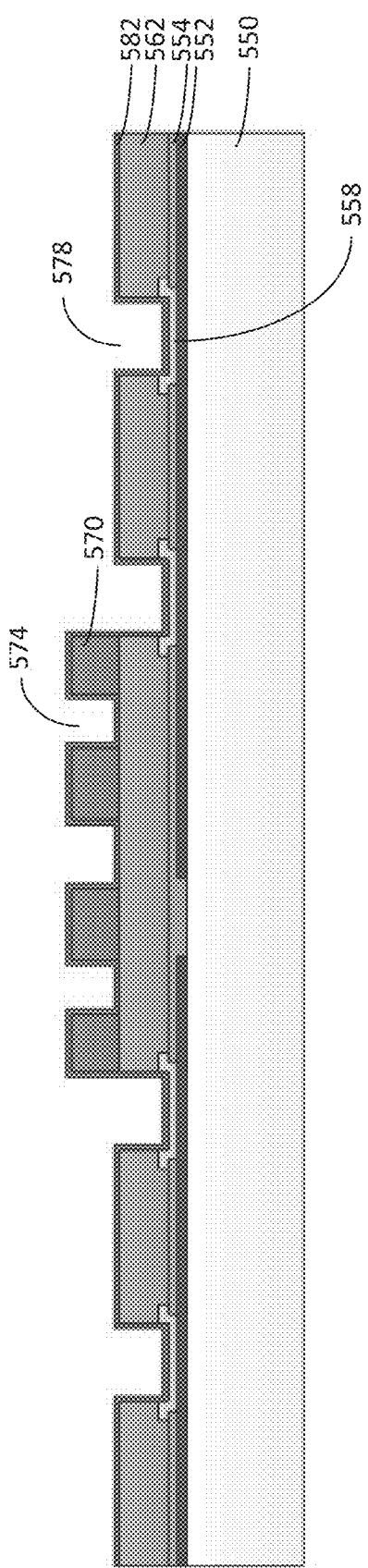

FIG. 28 shows an example of a partially fabricated MEMS device. The partially fabricated MEMS device can include a substrate 550, a metal layer 552 on the substrate 550, and an insulating layer 554 on the metal layer 552. In some implementations, the substrate 550 can include any suitable substrate material, such as glass. The insulating layer 554 may be recessed and filled with conductive material 558, where the conductive material 558 forms a pad that contacts the metal layer 552. In some implementations, the conductive material 558 includes ITO or some other suitable material for providing an electrical connection with the metal layer 552. The conductive material 558 can conduct electrical signals sufficiently to provide electrical signals to components of the pixels of the display. A first mold can be formed over a portion of the insulating layer 554, where the first mold can include a layer of photoresist 562. The layer of photoresist 562 can include vias 578 that can expose the conductive material 558. The vias 578 permit deposition of materials onto the conductive material 558. The first mold can further include a mold layer 570, where the mold layer 570 can be formed of a photoresist material and formed over the layer of photoresist 562. The mold layer 570 can include trenches 574 that expose portions of the layer of photoresist 562. The trenches 574 and vias 578 provide features of the first mold that can shape components of the MEMS device, such as the shutter. The first mold can be patterned for forming a first thin film beam of the MEMS device. A first passivation layer 582 is formed on the first mold and on the conductive material 558. The first passivation layer 582 is conformally deposited on the first mold, including the layer of photoresist 562 and the mold layer 570. The first passivation layer 582 can be made of any suitable passivation material described earlier herein. The first passivation layer 582 may be conformal along the sidewalls of the trenches 574 and vias 578 and also contact the conductive material 558. The first passivation layer 582 may be a passivation layer provided prior to release of the MEMS device. The partially fabricated MEMS device may be similar to the partially fabricated MEMS device described with respect to FIGS. 4-7.

Figure 29:
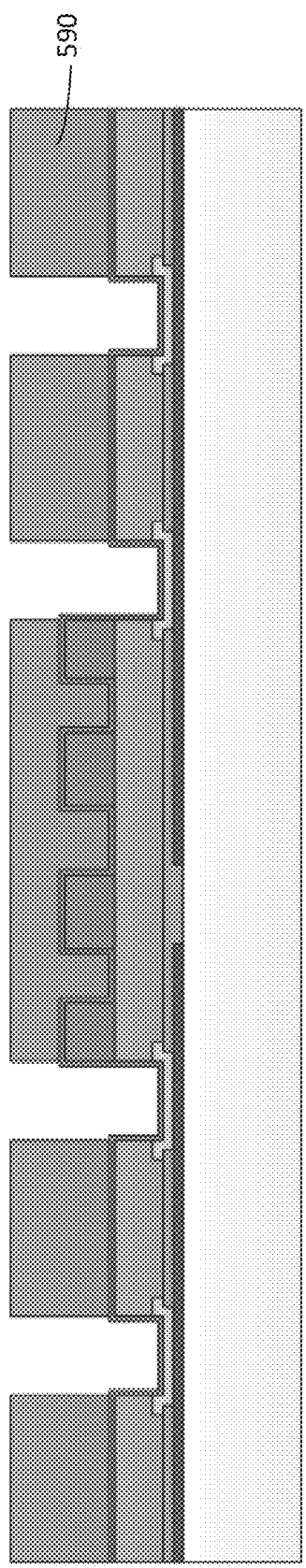

In FIG. 29, a first mask 590 may be formed over the first mold. The first mask 590 may be disposed over select locations so as to be formed over the mold layer 570 and the layer of photoresist 562. In some implementations, the first mask 590 can be formed in and over the trenches 574, but not formed in the vias 578 so that a contact etch can be performed. The first mask 590 can be deposited over the first passivation layer 582. The first mask 590 can be made of a suitable etch resist material to allow for an etch process to remove portions of the first passivation layer 582 within the vias 578.

Figure 30:
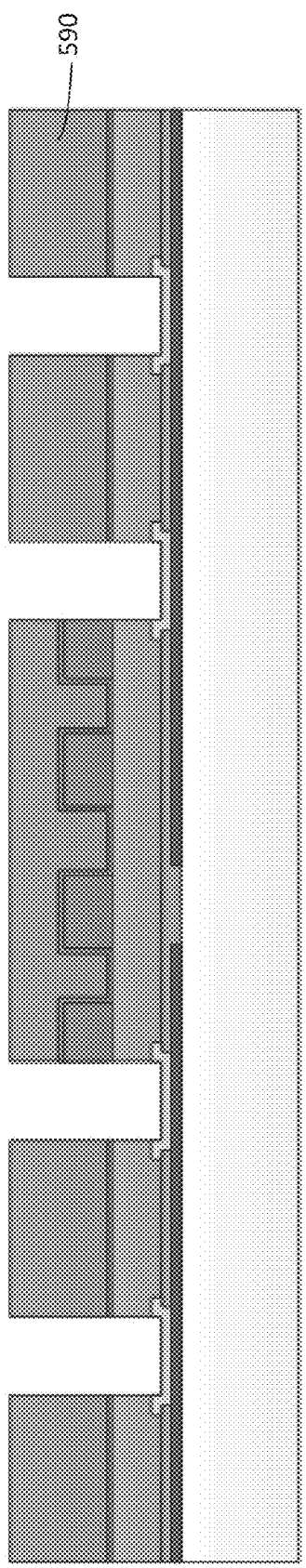

FIG. 30 shows the partially fabricated MEMS device after removal of the first passivation layer 582 within the vias 578. An etch process, such as a selective dry etch process, can remove some of the first passivation layer 582 to expose the conductive material 558. Portions of the first passivation layer 582 not protected by the first mask 590 are etched away or otherwise removed. However, it will be understood by a person of ordinary skill in the art that removal of the portions of the first passivation layer 582 within the vias 578 may occur without the first mask 590. In some implementations, a portion of the first passivation layer 582 on the conductive material 558 may be removed using an anisotropic etch process without the first mask 590. In some implementations, another portion of the first passivation layer 582 may remain on the sidewalls of the vias 578.

Figure 31:
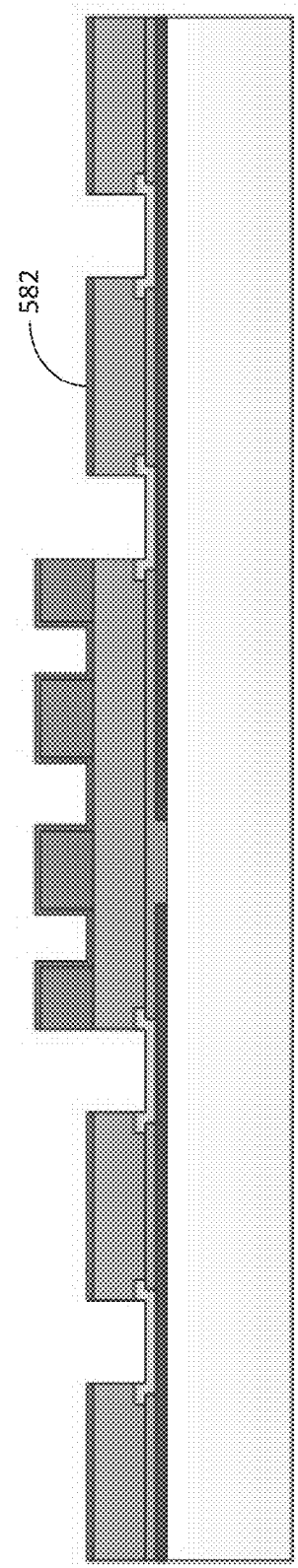

FIG. 31 shows the partially fabricated MEMS device after the first mask 590 is removed. The etch resist material of the first mask 590 may be stripped so that the first passivation layer 582 is exposed. The first passivation layer 582 remains on the first mold, but not along the sidewalls of the via 578 or on the conductive material 558.

Figure 32:
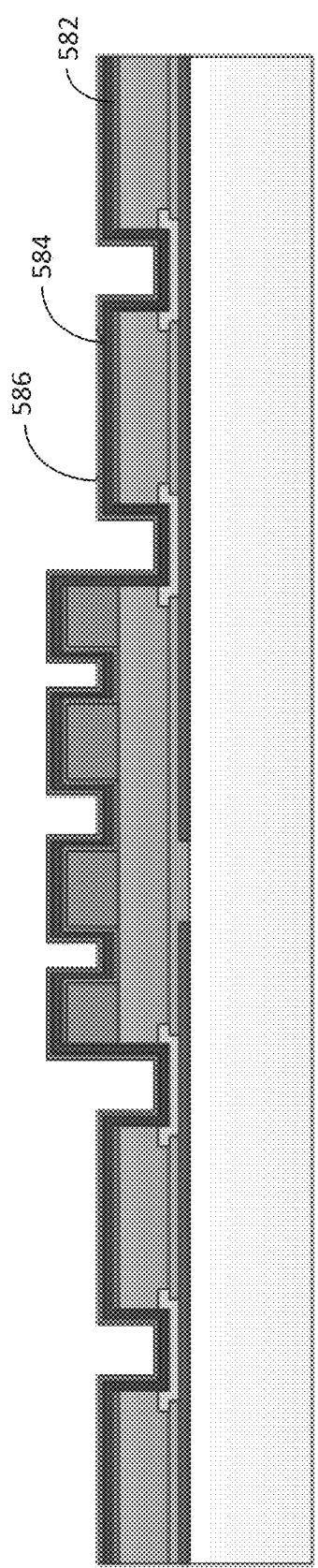
Figure 33:
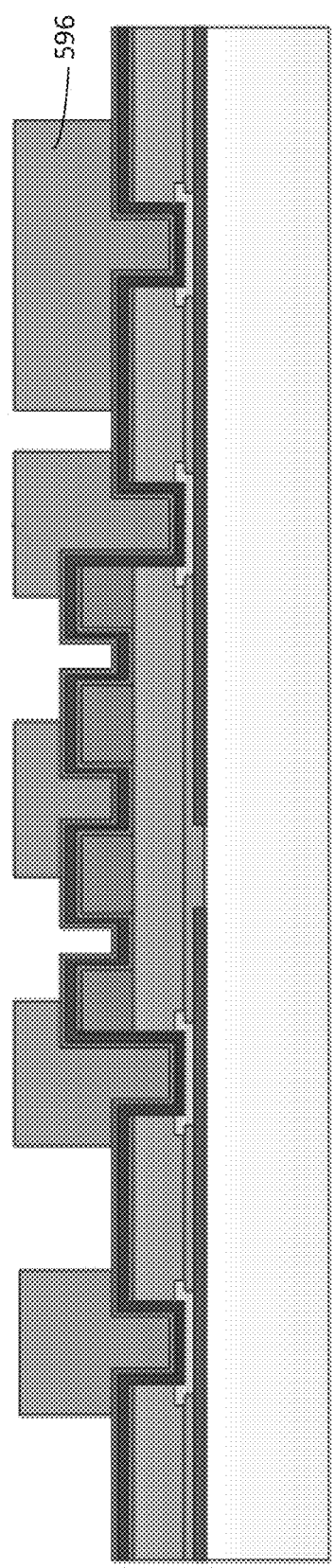

In FIG. 32, additional layers are deposited over the first mold. A conductive layer 584 is formed over the first mold, including over the layer of photoresist 562 and the mold layer 570. The conductive layer 584 can include any suitable material for carrying an electrical signal within the MEMS device, such as aSi, Ti, or Al. The conductive layer 584 may be conformally deposited on the first passivation layer 582 as well as along the sidewalls of the vias 578 and on the conductive material 558. Thus, the conductive layer 584 may be in electrical contact with the conductive material 558. A metallic layer 586 may be formed on the conductive layer 584. The metallic layer 586 may be conformally deposited on the conductive layer 584. In some implementations, the metallic layer 586 may also be conductive and capable of carrying an electrical signal within the MEMS device. In some implementations, the metallic layer 586 may be opaque or otherwise capable of substantially blocking the transmission of visible light. In some implementations, one or both of the metallic layer 586 and the conductive layer 584 may be substantially opaque, where one or both of the metallic layer 586 and the conductive layer 584 is capable of substantially blocking the transmission of visible light. For example, one or both of the metallic layer 586 and the conductive layer 584 may be capable of blocking 80% or more, 90% or more, or 95% or more of visible light. The layers 584 and 586 may form the constituent layers of the first thin film beam of the MEMS device.

Figure 34:
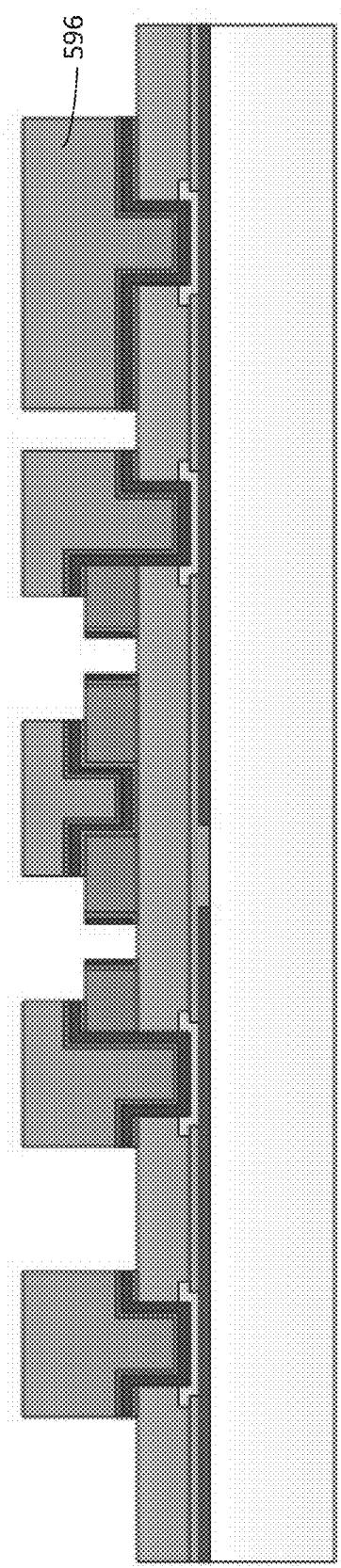

After the deposition of layers 582, 584, and 586, a second mask 596 may be formed over the layers 582, 584, and 586 for patterning and forming the first thin film beam. As illustrated in FIG. 34, the second mask 596 may be formed over the layers 582, 584, and 586 in a pattern for forming components of the first thin film beam of the MEMS device. In some implementations, the second mask 596 may be formed over the vias 578 and at least one of the trenches 574. In some implementations, the second mask 596 may include any suitable etch resist material.

In FIG. 34, an etch process is performed to remove portions of the metallic layer 586 and the conductive layer 584 not covered by the second mask 596. The etch process can include any suitable etch process, such as a dry etch or a wet etch. The etch process can remove both the metallic layer 586 and the conductive layer 584 over the top surfaces of the first mold. In some implementations, the etch process can remove the metallic layer 586 from the sidewalls of the trenches 574 while leaving the conductive layer 584 on the sidewalls of the trenches 574 intact. The etch process can be an anisotropic etch process to leave portions of the conductive layer 584 and the first passivation layer 582 on the sidewalls of the trenches 574.

Figure 35:
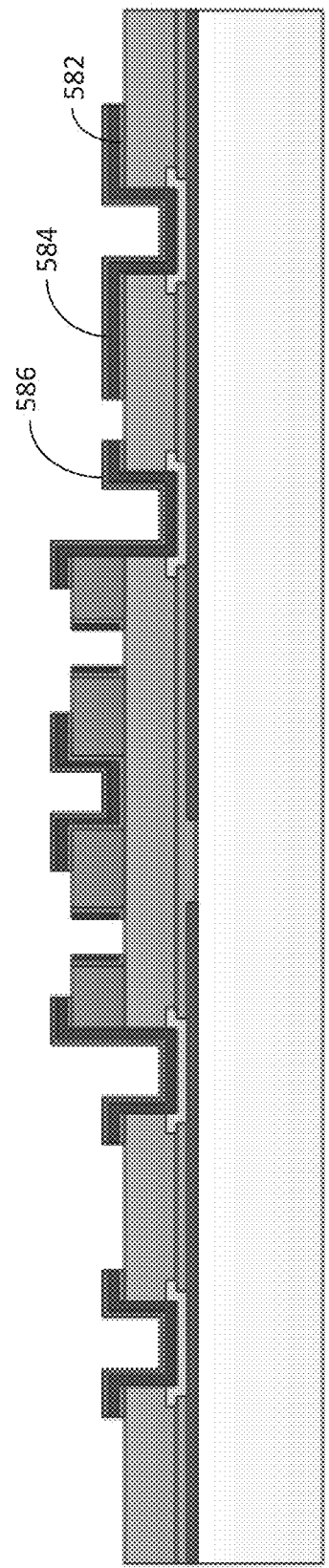

FIG. 35 shows the partially fabricated MEMS device after the second mask 596 is removed. The etch resist material of the second mask 596 may be stripped so that the layers 582, 584, and 586 are exposed. Remaining portions of the conductive layer 584 and/or the metallic layer 586 can form the first thin film beam of the MEMS device.

Figure 36:
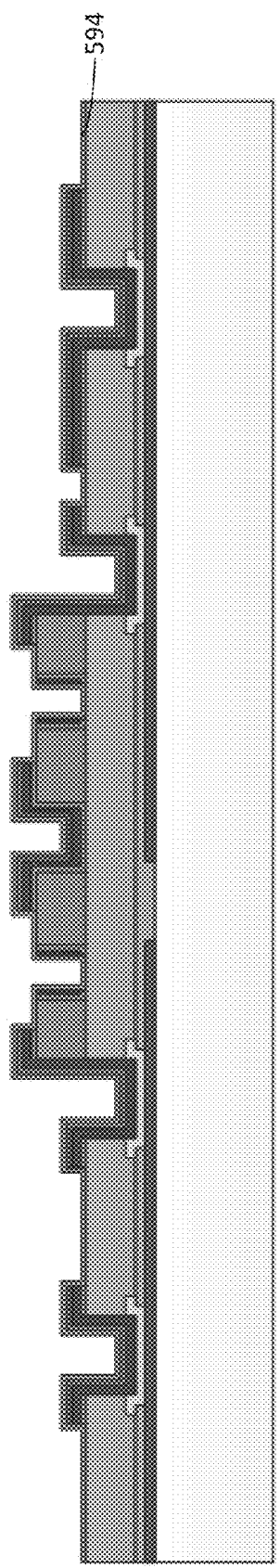

A second passivation layer 594 is formed over the first thin film beam as illustrated in FIG. 36. The second passivation layer 594 may be conformally deposited on the first thin film beam and over the first mold. In FIG. 36, the second passivation layer 594 covers exposed surfaces of the layer of photoresist 562, the mold layer 570, the conductive layer 584, and the metallic layer 586. In some implementations, the second passivation layer 594 conformally covers the sidewalls and bottom walls of the trenches 574. The second passivation layer 594 can be made of any suitable passivation material described earlier herein.

Figure 37:
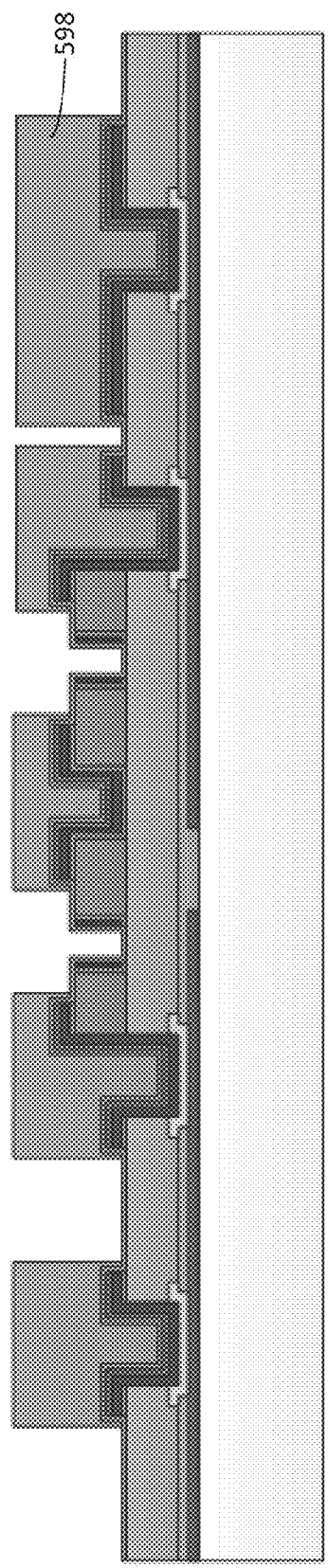

In FIG. 37, a third mask 598 is formed for selectively removing portions of the second passivation layer 594. The third mask 598 can include an etch resist material and formed at select locations to protect the second passivation layer 594 on certain features of the MEMS device. The pattern of the third mask 598 can be formed to allow an etch process to remove portions of the second passivation layer 594 from the first mold. That way, components of the first thin film beam can have at least a partially passivated exterior surface. In some implementations, the third mask 598 can be formed over locations where the second passivation layer 594 is formed over both the metallic layer 586 and the conductive layer 584.

In FIG. 38, portions of the second passivation layer 594 are removed by an etch process. The etch process can remove the portions of the second passivation layer 594 not covered by the third mask 598. However, it will be understood by a person of ordinary skill in the art that some portions of the second passivation layer 594 may be removed without the third mask 598. In some implementations, such portions of the second passivation layer 594 may be removed without the third mask 598 by an anisotropic etch process so that the second passivation layer 594 may remain intact on sidewalls of the partially fabricated MEMS device. In some implementations, the etch process can be an anisotropic dry etch process, such as a $CF_4$ plasma etch process.

FIG. 39 shows the partially fabricated MEMS device with first thin film beam, where the first thin film beam includes components 583 and 585 that are passivated by the first passivation layer 582 and the second passivation layer 594. The third mask 598 is removed in FIG. 39, where the etch resist material of the third mask 598 may be stripped. Between components 583 and 585 are passivating materials. The passivating materials can prevent electrical shorts. In some implementations, the components 583 and 585 of the first thin film beam can include one or more actuators, shutters, and anchors. One or more anchors may connect to the substrate 550 at the conductive material 558 to provide a stable and secure attachment for the first thin film beam. One or more shutters may be a movable mechanical component configured to substantially prevent transmission of visible light, such as transmission of visible light through one or more apertures. The shutters may be movable between an open and closed position, where one or more actuators can be implemented for controlling movement of the shutters. The one or more actuators may include electrodes, where the electrodes can carry electrical signals for controlling the movement of the shutters.

FIG. 40 shows an example of a MEMS device 502 with a first thin film beam 617 and a second thin film beam 615 over the first thin film beam 617. The MEMS device 502 may be released from the first mold and from a second mold. The first thin film beam 617 includes one or more electrodes 503 and 513. In some implementations, the one or more electrodes 503 and 513 can include movable sidewall beams having an aspect ratio of greater than about 4 to 1, and perhaps more than 16 to 1, to provide narrow profile and a flexible beam that can be moved by application of an electromotive force. In some implementations, the first thin film beam 617 further includes one or more shutters 502. The second thin film beam 615 is positioned over the first thin film beam 617, where the first thin film beam 617 is arranged between the substrate 550 and the second thin film beam 615 and spaced away from the substrate 550 and the second thin film beam 615. The second thin film beam 615 is shown spaced over the first thin film beam 617 and overlapping the first thin film beam 617. The second thin film beam 615 includes one or more apertures 555. The one or more shutters 502 may be configured to substantially prevent light from traveling through the one or more apertures 555. An inner passivation layer 530 partially covers an exterior surface of the second thin film beam 615 and partially covers an exterior surface of the first thin film beam 617.

In some implementations, the first thin film beam 617 includes a first arm and the second thin film beam 615 includes a second arm, each arm extending towards the surface of the substrate 550, where the first arm is joined to and overlapping the second arm to form an anchor capable of holding the first thin film beam 617 and the second thin film beam 615 at a distance away from the substrate 550.

Fabrication of the second thin film beam 615 may be similar to the fabrication of the second thin film beam 415 in FIG. 24, where the process flow can be similar to the process flow shown in FIGS. 15-23. After forming the first thin film beam 617 over the first mold and covering the first thin film beam 617 with passivation layers 582 and 594, the second thin film beam 615 can be formed over the first thin film beam 617. A second mold is formed over the first thin film beam 617. Then at least an additional conductive layer and an additional metallic layer is deposited and patterned over the second mold to form the second thin film beam 615. In some implementations, a third passivation layer 614 is formed over the second thin film beam 615. The third passivation layer 614 can include any suitable passivation material as described earlier herein. The MEMS device 502 can be released by removing the first mold and the second mold, as shown in FIG. 40. The passivation layers 582, 594, and 614 are formed prior to release. The inner passivation layer 530 can include the passivation layers 582, 594, and 614.

In FIG. 40, the one or more electrodes 503, 513 may have one or more exposed surfaces. The one or more exposed surfaces may not be passivated, which can lead to a leakage path for electrical currents. The leakage path may result due to a difference in electric potentials between electrodes. Each of the one or more electrodes 503 and 513 may have a top surface, a bottom surface, and sidewalls. As shown in FIG. 40, the top surfaces of the electrodes 503 and 513 may be exposed, while the sidewalls and bottom surfaces of the electrodes 503 and 513 are passivated by the first passivation layer 582 or the second passivation layer 594. To cap the top surfaces of the electrodes 503 and 513 and any other exposed surfaces in the first thin film beam 617 and the second thin film beam 615, an additional layer of passivation material may be provided to the MEMS device 502 after release.

FIG. 41 shows the MEMS device 502 with a post-release passivation layer 500. After release of the MEMS device 502, the post-release passivation layer 500 may be formed to cover the exterior surfaces of the first thin film beam 617 and the second thin film beam 615. In addition, the post-release passivation layer 500 may constitute an outer passivation layer that covers the inner passivation layer 530. The post-release passivation layer 500 may be conformally deposited on exposed surfaces of the MEMS device 502 by CVD, such as plasma CVD. However, it will be understood by a person of ordinary skill in the art that any suitable deposition technique may be applied. The post-release passivation layer 500 may include any suitable passivating material as described earlier herein. In some implementations, the MEMS device 502 can include a plurality of spacers for holding a plate away from the second thin film beam 615.

Deposition of the post-release passivation layer 500 may occur on all surfaces of the MEMS device 502, as shown in FIG. 41. Put another way, the post-release passivation layer 500 coats everywhere on the MEMS device 502. However, the coating may not be uniform across all surfaces of the MEMS device 502. For example, the one or more apertures 555 combined with the one or more shutters 502 may present difficulties for coating some of the surfaces more than others. Precursors for CVD may have to come under and around the one or more apertures 555 and the one or more shutters 502 to coat some of the surfaces of the MEMS device 502. The post-release passivation layer 500 ensures coverage of exposed surfaces of the MEMS device 500. As shown in FIG. 41, the post-release passivation layer 500 can cover top surfaces of the one or more electrodes 503 and 513. In some implementations, the post-release passivation layer 500 may be relatively thin, such as less than about 1000 Å, less than about 500 Å, or between about 200 Å and about 400 Å. Thus, even though the deposition of the post-release passivation layer 500 may be non-uniform, the impact of such non-uniformity may be small when the post-release passivation layer 500 is relatively thin. In contrast, the inner passivation layer 530 may have a thickness of less than about 2000 Å, such as between about 300 Å and about 1000 Å.

FIG. 41 shows the MEMS device 502 fully encapsulated and passivated. Rather than simply applying pre-release passivation layers to exterior surfaces in FIGS. 4-27, FIGS. 28-41 show various stages of manufacturing the MEMS device 502 by applying both pre-release passivation layers 582, 594, and 614 and a post-release passivation layer 500. In some implementations, if only pre-release passivation layers 582, 594, and 614 were applied, some surfaces of the MEMS device 502 may be left exposed, such as the top surfaces of the electrodes 503 and 513. In some implementations, if only post-release passivation layer 500 were applied, non-uniformities from coating the MEMS device 502 may have a more substantial impact. To coat everywhere in the MEMS device 502 without pre-release passivation layers 582, 594, and 614, thicker deposition of the post-release passivation layer 500 may be applied. However, thicker deposition of the post-release passivation layer 500 can result in, for example, distortion in the one or more apertures 555. In addition, thicker deposition of the post-release passivation layer 500 can lead to device performance non-uniformity. For example, edges of the MEMS device 502 can get much thicker, which can lead to higher pull-in voltages and different shutter speeds. Furthermore, a non-uniform post-release passivation layer 500 can cause tip gap non-uniformity.

Figure 42A:
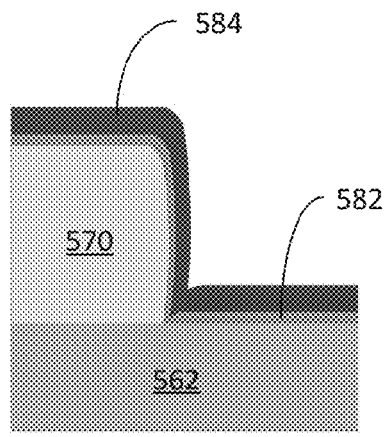
FIGS. 42A-42D show cross-sectional schematic views illustrating various stages of passivating a thin film beam on a mold.

FIGS. 42A-42D show cross-sectional schematic views illustrating various stages of passivating a thin film beam on a mold. In FIG. 42A, a first passivation layer 582 is conformally deposited on a top surface and sidewalls of a mold layer 570 and is conformally deposited on a top surface of a layer of photoresist 562. In some implementations, the first passivation layer 582 can include $SiN_x$. Furthermore, a conductive layer 584 can be conformally deposited on the first passivation layer 582. In some implementations, the conductive layer 584 can include aSi.

Figure 42B:
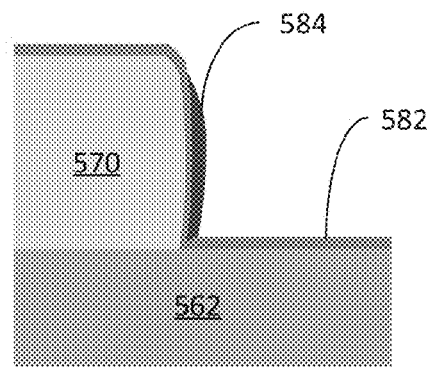

In FIG. 42B, portions of the conductive layer 584 are removed while the first passivation layer 582 remains conformal along the top surfaces and sidewalls of the mold layer 570 and the layer of photoresist 562. Another portion of the conductive layer 584 remains intact that is on the first passivation layer 582 and adjacent to the sidewalls of the mold layer 570.

Figure 42C:
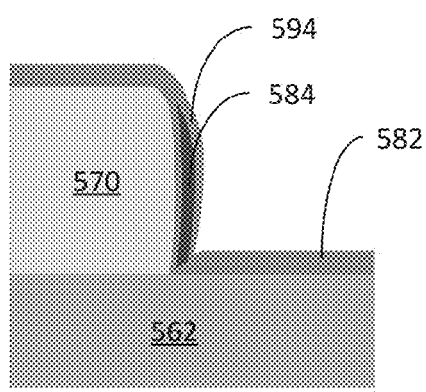

In FIG. 42C, a second passivation layer 594 is conformally deposited on the first passivation layer 582 and on the conductive layer 584. In some implementations, the second passivation layer 594 can have the same composition as the first passivation layer 582. The second passivation layer 594 can cover exposed surfaces of the conductive layer 584 and add to the thickness of the first passivation layer 582.

Figure 42D:
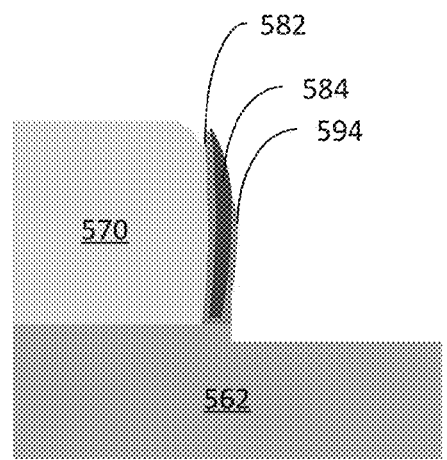

In FIG. 42D, portions of the second passivation layer 594 and the first passivation layer 582 are removed from the top surfaces of the mold layer 570 and the layer of photoresist 562. However, removal of the portions of the second passivation layer 594 and the first passivation layer 582 can also leave portions of the conductive layer 584 exposed. This can result in some surfaces of a MEMS device not being passivated, which can lead to leakage of electrical currents. In some implementations, components that are not passivated in a MEMS device can even lead to an electrical short. Exposed surfaces of the conductive layer 584 can similarly result from the process flow shown in FIGS. 28-40. Thus, a post-release passivation layer 500 can provide a coating for covering any such exposed surfaces to eliminate or otherwise reduce leakage paths in a MEMS device.

FIGS. 43-52 show cross-sectional schematic views illustrating various stages of manufacturing an example MEMS device 702, according to some other implementations. The process flow in FIGS. 43-52 can be similar to the process flow in FIGS. 28-41, except with fewer masks. The MEMS device 702 may form one or more light modulators within a display. In some implementations, the MEMS device 702 can include a first thin film beam 817 and a second thin film beam 815 that form the one or more light modulators within the display. The MEMS device 702 may form one or more pixels within the display. The stages for manufacturing the MEMS device 702 may include different, fewer, or additional operations than illustrated in FIGS. 43-52.

Figure 43:
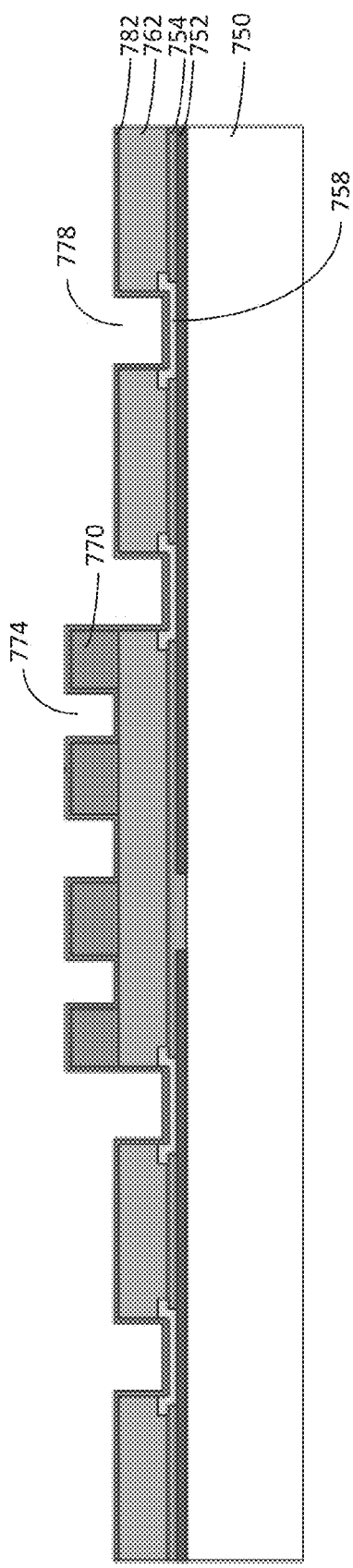
FIGS. 43-52 show cross-sectional schematic views illustrating various stages of manufacturing an example MEMS device, according to some other implementations.

FIG. 43 shows an example of a partially fabricated MEMS device. The partially fabricated MEMS device can include a substrate 750, a metal layer 752, an insulating layer 754, conductive material 758, a layer of photoresist 762, a mold layer 770, a first passivation layer 782, and trenches 774, and vias 778. The layer of photoresist 762 and the mold layer 770 can form a first mold, where the first mold includes features for shaping components of the MEMS device. The partially fabricated MEMS device in FIG. 43 can be similar to the partially fabricated MEMS device in FIG. 28. Therefore, how the substrate 750, the metal layer 752, the insulating layer 754, the conductive material 758, the layer of photoresist 762, the mold layer 770, the first passivation layer 782, and the trenches 774 and vias 778 are formed and arranged can be similar how the substrate 550, the metal layer 552, the insulating layer 554, the conductive material 558, the layer of photoresist 562, the mold layer 570, the first passivation layer 582, and the trenches 574 and vias 578 are formed and arranged.

Figure 44:
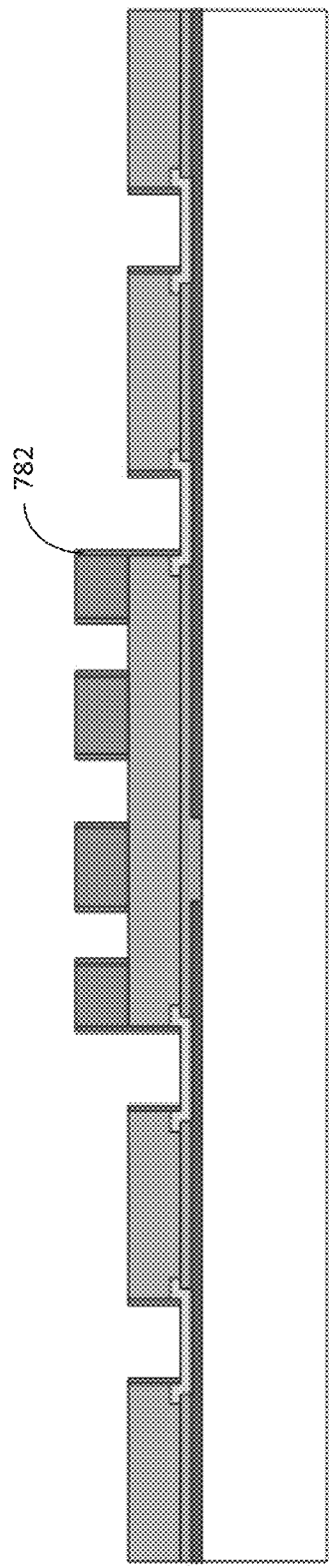

In FIG. 44, portions of the first passivation layer 782 are removed in the partially fabricated MEMS device. No mask is applied in removing such portions of the first passivation layer 782. Rather, an etch process, such as an anisotropic dry etch process, is applied to remove the portions of the first passivation layer 782. The first passivation layer 782 may be etched from the top surfaces of the first mold, including the top surfaces of the layer of photoresist 762 and the mold layer 770, as well as from the conductive material 758. Other portions of the first passivation layer 782 may remain intact on the sidewalls of the trenches 774 and vias 778.

Figure 45:
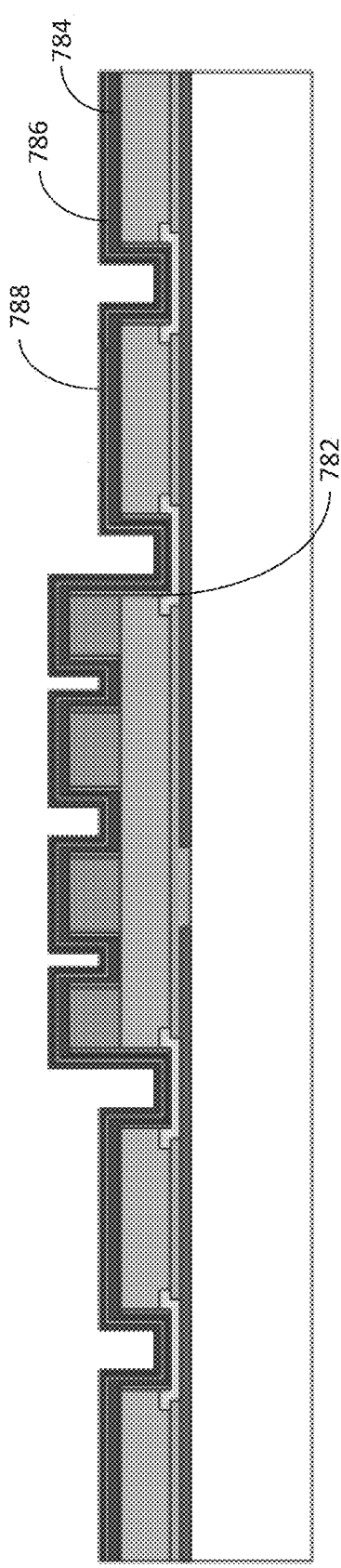

In FIG. 45, additional layers are formed over the first mold. A conductive layer 784 is formed over the first mold and the first passivation layer 782, where the conductive layer 784 can be conformally deposited on the layer of photoresist 762, the mold layer 770, the first passivation layer 782, and the conductive material 758. In some implementations, the conductive layer 784 can include aSi. Thus, the conductive layer 784 may be in electrical contact with the conductive material 758. A metallic layer 786 may be formed on the conductive layer 784, where the metallic layer 786 is conformal along the conductive layer 784. In some implementations, the metallic layer 786 can include Ti. Further, an etch stop layer 788 may be formed on the metallic layer 786, where the etch stop layer 788 is conformal along the metallic layer 786. In some implementations, the etch stop layer 788 may be identical in composition with the conductive layer 784. For example, the etch stop layer 788 can include aSi. The etch stop layer 788 may also be referred to as a second conductive layer 788. The etch stop layer 788 may function as an etch stop and protect the metallic layer 786. In some implementations, one or more of the layers 784, 786, and 788 may be opaque or substantially opaque. For example, one or more of the conductive layer 784, the metallic layer 786, and the etch stop layer 788 may be capable of blocking 80% or more, 90% or more, or 95% or more of visible light. The layers 784, 786, and 788 may form the constituent layers of the first thin film beam of the MEMS device.

Figure 46:
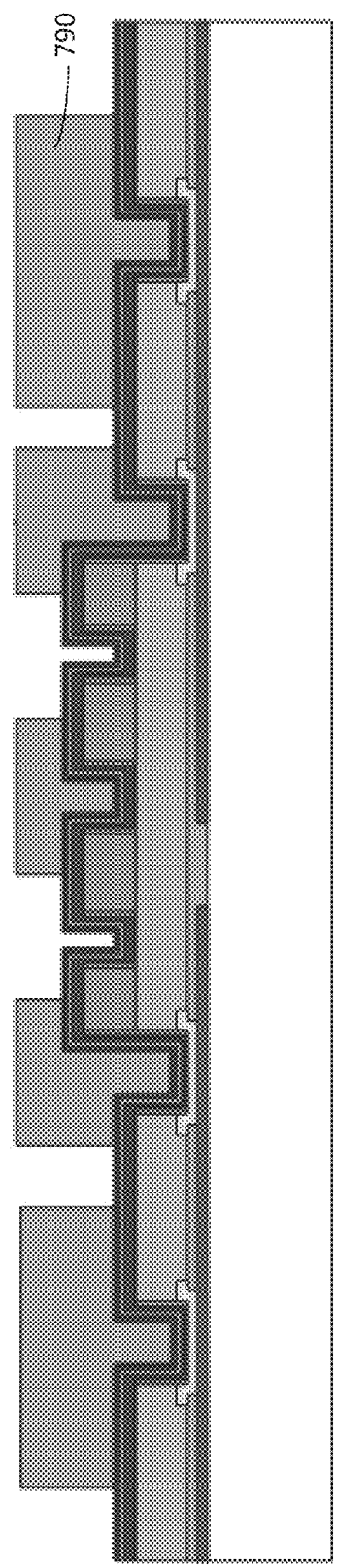

FIG. 46 shows a partially fabricated MEMS device with a first mask 790 formed over the layers 782, 784, and 786 for forming the first thin film beam. As illustrated in FIG. 46, the first mask 790 may be provided over select locations for forming the first thin film beam. In some implementations, the first mask 790 may be formed over the vias 778 and at least one of the trenches 774. In some implementations, the first mask 790 may include any suitable etch resist material.

Figure 47:
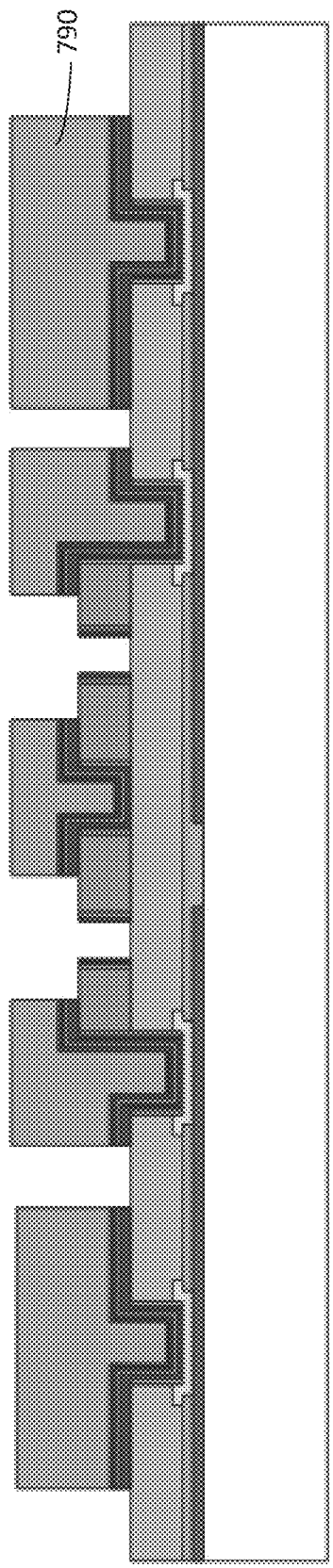

Portions of the layers 784, 786, and 788 are removed in FIG. 47, including portions not covered by the first mask 790. An etch process can include any suitable etch process, such as a dry etch or a wet etch. The etch process can remove the conductive layer 784, the metallic layer 786, and the etch stop layer 788 from the top surfaces of the first mold. In some implementations, the etch process can remove the metallic layer 786 and the etch stop layer 788 on the sidewalls of the trenches 774 while leaving the conductive layer 784 on the sidewalls of the trenches 774 intact. In some implementations, the etch process can include an isotropic etch of the etch stop layer 788, an isotropic etch of the metallic layer 786, and an anisotropic etch of the conductive layer 784. The anisotropic etch of the conductive layer 784 can leave portions of the conductive layer 784 and the first passivation layer 782 on the sidewalls of the trenches 774 intact.

Figure 48:
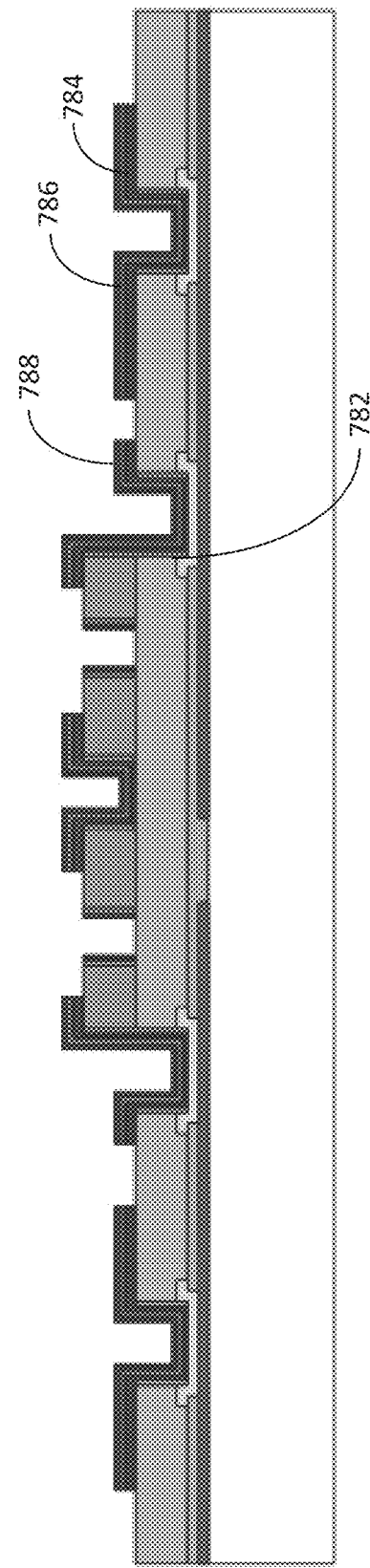

FIG. 48 shows the partially fabricated MEMS device after the first mask 790 is removed. The etch resist material of the first mask 790 may be stripped so that layers 782, 784, 786, and/or 788 are exposed. Remaining portions of the conductive layer 784, the metallic layer 786, and/or the etch stop layer 788 form components of the first thin film beam of the MEMS device.

Figure 49:
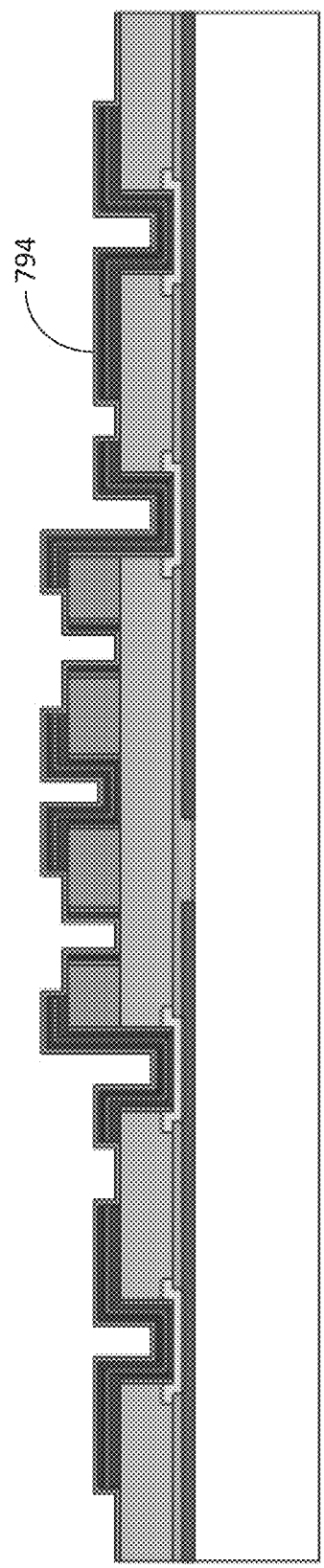

In FIG. 49, a second passivation layer 794 is formed over the first thin film beam. The second passivation layer 794 may be conformally deposited on the first thin film beam and over the first mold. In some implementations, the second passivation layer 794 covers exposed surfaces of the layer of photoresist 762, the mold layer 770, the first passivation layer 782, the conductive layer 784, the metallic layer 786, and the etch stop layer 788. In some implementations, the second passivation layer 794 conformally covers the sidewalls and bottom walls of the trenches 774. The second passivation layer 794 may be made of any suitable passivation material described earlier herein.

Figure 50:
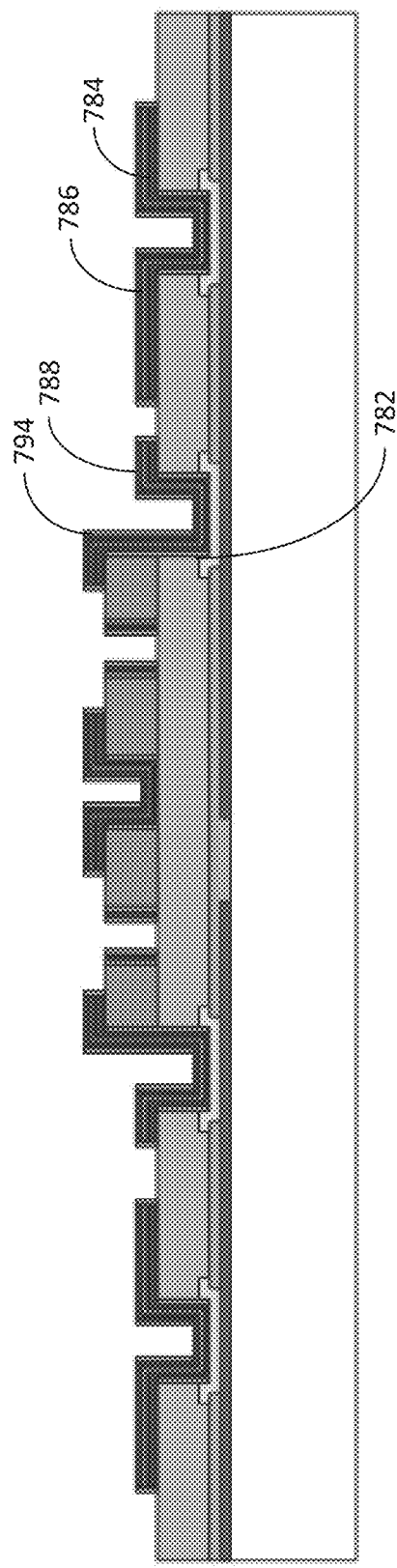

FIG. 50 shows a partially fabricated MEMS device with portions of the second passivation layer 794 removed. No mask is applied in removing such portions of the second passivation layer 794. Instead, an etch process, such as an anisotropic dry etch process, is applied to remove the portions of the second passivation layer 794. The second passivation layer 794 may be etched from the top surfaces of the first thin film beam, including the top surfaces of the etch stop layer 788 and the conductive layer 784. The second passivation layer 794 may also be etched from the top surfaces of the layer of photoresist 762 and the mold layer 770. The etch stop layer 788 may serve as an etch stop so that the portions of the second passivation layer 794 are removed without removing the layers 784 and 786 of the first thin film beam. Other portions of the second passivation layer 794 may remain intact on the sidewalls of the trenches 774 and vias 778.

Figures 51, 52:
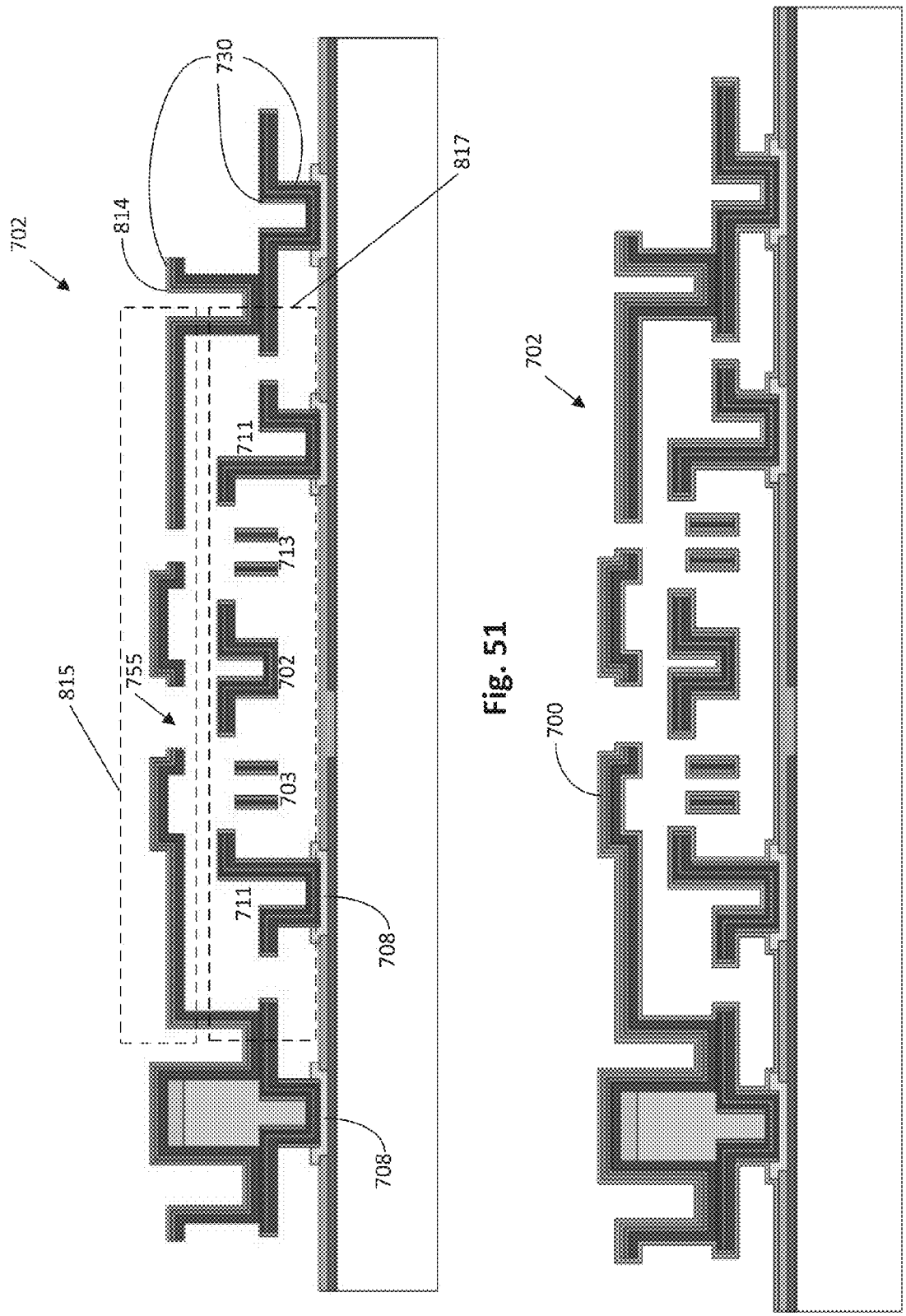

FIG. 51 shows an example of a MEMS device 702 with a first thin film beam 817 and a second thin film beam 815 over the first thin film beam 817. The MEMS device 702 may be released from the first mold and a second mold. The first thin film beam 817 includes one or more electrodes 703 and 713. In some implementations, the one or more electrodes 703 and 713 can include movable sidewall beams having an aspect ratio of greater than about 4 to 1, and perhaps more than 16 to 1, to provide narrow profile and a flexible beam that can be moved by application of an electromotive force. In some implementations, the first thin film beam 817 includes one or more shutters 702. The second thin film beam 815 is positioned over the first thin film beam 817, where the first thin film beam 817 is arranged between the substrate 750 and the second thin film beam 815 and spaced away from the substrate 750 and the second thin film beam 815. The second thin film beam 815 is shown spaced over the first thin film beam 817 and overlapping the first thin film beam 817. The second thin film beam 815 includes one or more apertures 755. The one or more shutters 702 may be configured to substantially prevent light from traveling through the one or more apertures 755. An inner passivation layer 730 partially covers an exterior surface of the second thin film beam 815 and partially covers an exterior surface of the first thin film beam 817.

In some implementations, the first thin film beam 817 includes a first arm and the second thin film beam 815 includes a second arm, each arm extending towards the surface of the substrate 750, where the first arm is joined to and overlapping the second arm to form an anchor capable of holding the first thin film beam 817 and the second thin film beam 815 at a distance away from the substrate 750. The second thin film beam 815 may be connected to the etch stop layer 788 at the anchor.

Fabrication of the second thin film beam 815 may be similar to the fabrication of the thin film beam 415 in FIG. 24, where the process flow can be similar to the process flow shown in FIGS. 15-23. After forming the first thin film beam 817 over the first mold and covering the first thin film beam 817 with passivation layers 782 and 794, the second thin film beam 815 can be formed over the first thin film beam 817. A second mold is formed over the first thin film beam 817. Then at least an additional conductive layer and an additional metallic layer is deposited and patterned over the second mold to form the second thin film beam 815. In some implementations, a third passivation layer 814 is formed over the second thin film beam 815. The third passivation layer 814 can include any suitable passivation material discussed earlier herein. The MEMS device 702 can be released by removing the first mold and the second mold, as shown in FIG. 51. The passivation layers 782, 794, and 814 are formed prior to release.

In FIG. 51, the one or more electrodes 703 and 713 may have one or more exposed surfaces. The one or more exposed surfaces may not be passivated, which can lead to a leakage path for electrical currents. As shown in FIG. 51, the top surfaces and the bottom surfaces of the electrodes 703 and 713 may be exposed, while the sidewalls of the electrodes 703 and 713 are passivated by the first passivation layer 782 or the second passivation layer 794. Moreover, the top and bottom surfaces of the one or more shutters 702 may be exposed. To passivate any exposed surfaces in the first thin film beam 817 and the second thin film beam 815, an additional layer of passivation material may be provided to the MEMS device 702 after release.

FIG. 52 shows the MEMS device 702 with a post-release passivation layer 500. After release of the MEMS device 702, the post-release passivation layer 700 may be formed to cover the exterior surfaces of the first thin film beam 817 and the second thin film beam 815. In addition, the post-release passivation layer 700 may constitute an outer passivation layer that covers the inner passivation layer 730. The post-release passivation layer 700 may be conformally deposited on exposed surfaces of the MEMS device 702 by CVD, such as plasma CVD. However, it will be understood by a person of ordinary skill in the art that any suitable deposition technique may be applied. The post-release passivation layer 700 may include any suitable passivating material as described earlier herein. In some implementations, the MEMS device 702 can include a plurality of spacers for holding a plate away from the second thin film beam 815.

Deposition of the post-release passivation layer 700 may occur on all surfaces of the MEMS device 702, as shown in FIG. 52. Put another way, the post-release passivation layer 700 coats everywhere on the MEMS device 702. The post-release passivation layer 700 may cover top surfaces and bottom surfaces of the one or more electrodes 703 and 713 as well as the top surfaces and bottom surfaces of the one or more shutters 702. In some implementations, the post-release passivation layer 700 may be relatively thin, such as less than about 1000 Å, less than about 500 Å, or between about 200 Å and about 400 Å. In contrast, the inner passivation layer 730 may have a thickness of less than about 2000 Å, such as between about 300 Å and about 1000 Å. Aspects of the post-release passivation layer 700 in FIG. 52 may be similar to the post-release passivation layer 500 in FIG. 41.

Figure 53A:
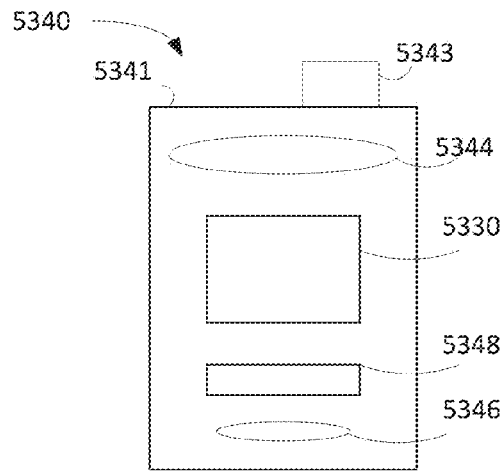
FIGS. 53A and 53B show system block diagrams of an example display device that includes a plurality of display elements.
Figure 53B:
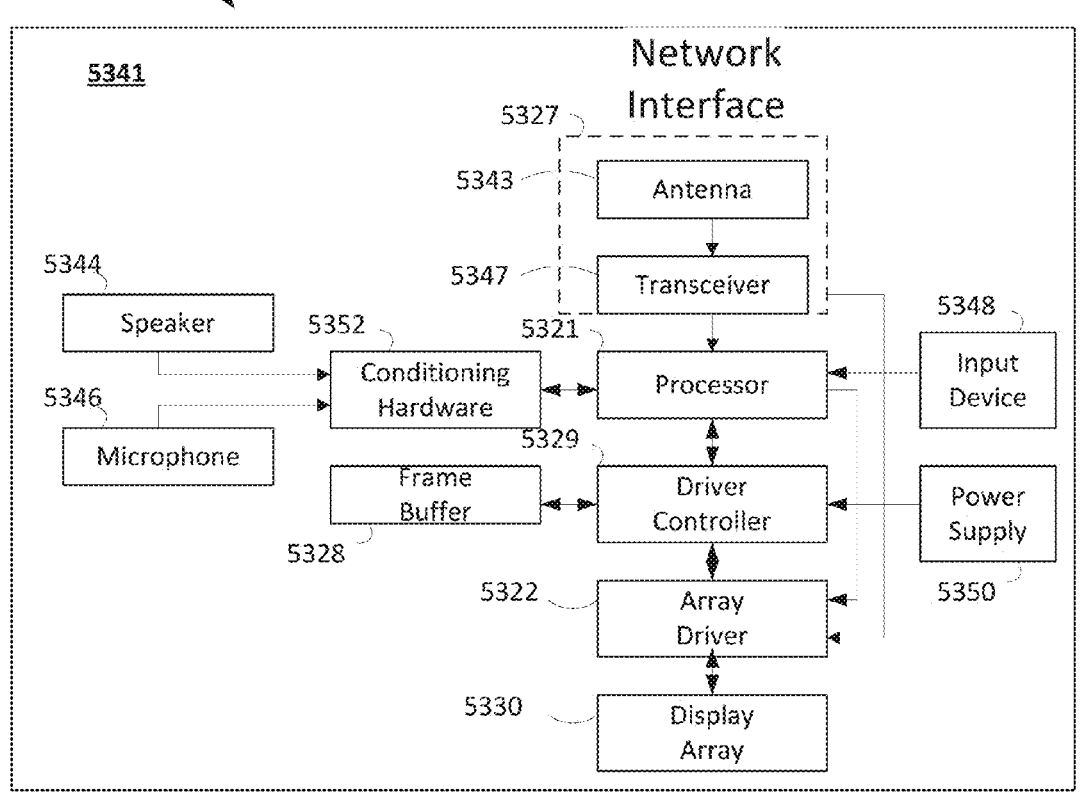

FIGS. 53A and 53B show system block diagrams of an example display device 5340 that includes a plurality of display elements. The display device 5340 can be, for example, a smart phone, a cellular or mobile telephone. However, the same components of the display device 5340 or slight variations thereof are also illustrative of various types of display devices such as televisions, computers, tablets, e-readers, hand-held devices and portable media devices.

The display device 5340 includes a housing 5341, a display 5330, an antenna 5343, a speaker 5345, an input device 5348 and a microphone 5346. The housing 5341 can be formed from any of a variety of manufacturing processes, including injection molding, and vacuum forming. In addition, the housing 5341 may be made from any of a variety of materials, including, but not limited to: plastic, metal, glass, rubber and ceramic, or a combination thereof. The housing 5341 can include removable portions (not shown) that may be interchanged with other removable portions of different color, or containing different logos, pictures, or symbols.

The display 5330 may be any of a variety of displays, including a bi-stable or analog display, as described herein. The display 5330 also can be capable of including a flat-panel display, such as plasma, electroluminescent (EL) displays, OLED, super twisted nematic (STN) display, LCD, or thin-film transistor (TFT) LCD, or a non-flat-panel display, such as a cathode ray tube (CRT) or other tube device. In addition, the display 5330 can include a mechanical light modulator-based display, as described herein.

The components of the display device 5340 are schematically illustrated in FIG. 53B. The display device 5340 includes a housing 5341 and can include additional components at least partially enclosed therein. For example, the display device 5340 includes a network interface 5327 that includes an antenna 5343 which can be coupled to a transceiver 5347. The network interface 5327 may be a source for image data that could be displayed on the display device 5340. Accordingly, the network interface 5327 is one example of an image source module, but the processor 5321 and the input device 5348 also may serve as an image source module. The transceiver 5347 is connected to a processor 5321, which is connected to conditioning hardware 5352. The conditioning hardware 5352 may be configured to condition a signal (such as filter or otherwise manipulate a signal). The conditioning hardware 5352 can be connected to a speaker 5345 and a microphone 5346. The processor 5321 also can be connected to an input device 5348 and a driver controller 5329. The driver controller 5329 can be coupled to a frame buffer 5328, and to an array driver 5322, which in turn can be coupled to a display array 5330. One or more elements in the display device 5340, including elements not specifically depicted in FIG. 53A, can be capable of functioning as a memory device and be capable of communicating with the processor 5321. In some implementations, a power supply 5350 can provide power to substantially all components in the particular display device 5340 design.

The network interface 5327 includes the antenna 43 and the transceiver 5347 so that the display device 5340 can communicate with one or more devices over a network. The network interface 5327 also may have some processing capabilities to relieve, for example, data processing requirements of the processor 5321. The antenna 5343 can transmit and receive signals. In some implementations, the antenna 5343 transmits and receives RF signals according to any of the IEEE 16.11 standards, or any of the IEEE 802.11 standards. In some other implementations, the antenna 5343 transmits and receives RF signals according to the Bluetooth® standard. In the case of a cellular telephone, the antenna 5343 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G, or further implementations thereof, technology. The transceiver 5347 can pre-process the signals received from the antenna 5343 so that they may be received by and further manipulated by the processor 5321. The transceiver 5347 also can process signals received from the processor 5321 so that they may be transmitted from the display device 5340 via the antenna 5343.

In some implementations, the transceiver 5347 can be replaced by a receiver. In addition, in some implementations, the network interface 5327 can be replaced by an image source, which can store or generate image data to be sent to the processor 5321. The processor 5321 can control the overall operation of the display device 5340. The processor 5321 receives data, such as compressed image data from the network interface 5327 or an image source, and processes the data into raw image data or into a format that can be readily processed into raw image data. The processor 5321 can send the processed data to the driver controller 5329 or to the frame buffer 5328 for storage. Raw data typically refers to the information that identifies the image characteristics at each location within an image. For example, such image characteristics can include color, saturation and gray-scale level.

The processor 5321 can include a microcontroller, CPU, or logic unit to control operation of the display device 5340. The conditioning hardware 5352 may include amplifiers and filters for transmitting signals to the speaker 5345, and for receiving signals from the microphone 5346. The conditioning hardware 5352 may be discrete components within the display device 5340, or may be incorporated within the processor 5321 or other components.

The driver controller 5329 can take the raw image data generated by the processor 5321 either directly from the processor 5321 or from the frame buffer 5328 and can re-format the raw image data appropriately for high speed transmission to the array driver 5322. In some implementations, the driver controller 5329 can re-format the raw image data into a data flow having a raster-like format, such that it has a time order suitable for scanning across the display array 5330. Then the driver controller 5329 sends the formatted information to the array driver 5322. Although a driver controller 5329 is often associated with the system processor 5321 as a stand-alone Integrated Circuit (IC), such controllers may be implemented in many ways. For example, controllers may be embedded in the processor 5321 as hardware, embedded in the processor 5321 as software, or fully integrated in hardware with the array driver 5322.

The array driver 5322 can receive the formatted information from the driver controller 5329 and can re-format the video data into a parallel set of waveforms that are applied many times per second to the hundreds, and sometimes thousands (or more), of leads coming from the display's x-y matrix of display elements. In some implementations, the array driver 5322 and the display array 5330 are a part of a display module. In some implementations, the driver controller 5329, the array driver 5322, and the display array 5330 are a part of the display module.

In some implementations, the driver controller 5329, the array driver 5322, and the display array 5330 are appropriate for any of the types of displays described herein. For example, the driver controller 5329 can be a conventional display controller or a bi-stable display controller (such as a mechanical light modulator display element controller). Additionally, the array driver 5322 can be a conventional driver or a bi-stable display driver (such as a mechanical light modulator display element controller). Moreover, the display array 5330 can be a conventional display array or a bi-stable display array (such as a display including an array of mechanical light modulator display elements). In some implementations, the driver controller 5329 can be integrated with the array driver 5322. Such an implementation can be useful in highly integrated systems, for example, mobile phones, portable-electronic devices, watches or small-area displays.

In some implementations, the input device 5348 can be configured to allow, for example, a user to control the operation of the display device 5340. The input device 5348 can include a keypad, such as a QWERTY keyboard or a telephone keypad, a button, a switch, a rocker, a touch-sensitive screen, a touch-sensitive screen integrated with the display array 5330, or a pressure- or heat-sensitive membrane. The microphone 5346 can be configured as an input device for the display device 5340. In some implementations, voice commands through the microphone 5346 can be used for controlling operations of the display device 5340. Additionally, in some implementations, voice commands can be used for controlling display parameters and settings.

The power supply 5350 can include a variety of energy storage devices. For example, the power supply 5350 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 5350 also can be a renewable energy source, a capacitor, or a solar cell, including a plastic solar cell or solar-cell paint. The power supply 5350 also can be configured to receive power from a wall outlet.

In some implementations, control programmability resides in the driver controller 5329 which can be located in several places in the electronic display system. In some other implementations, control programmability resides in the array driver 5322. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A microelectromechanical systems (MEMS) device comprising:
    a substrate;
    a first thin film beam over the substrate, wherein the first thin film beam includes one or more electrodes;
    a second thin film beam over the first thin film beam, the first thin film beam being arranged between the substrate and the second thin film beam and spaced away from the substrate and the second thin film beam, wherein the second thin film beam includes one or more apertures;
    an inner passivation layer partially covering an exterior surface of the second thin film beam and partially covering an exterior surface of the first thin film beam, wherein a portion of the first thin film beam and a portion of the second thin film beam are uncovered by the inner passivation layer; and
    an outer passivation layer over the inner passivation layer, the outer passivation layer covering the inner passivation layer and the uncovered portion of the first thin film beam and the uncovered portion of the second thin film beam.

2. The MEMS device of claim 1, wherein each of the one or more electrodes includes a top surface, a bottom surface, and sidewalls, the inner passivation layer covering at least the sidewalls of the one or more electrodes, and the outer passivation layer covering at least the top and bottom surfaces of the one or more electrodes.

3. The MEMS device of claim 1, wherein the first thin film beam includes a first conductive layer, wherein the substrate includes a conductive surface in contact with the first conductive layer.

4. The MEMS device of claim 1, wherein the first thin film beam further includes a second conductive layer, the second conductive layer being identical in composition with the first conductive layer and connected to the second thin film beam.

5. The MEMS device of claim 4, wherein the second conductive layer is an etch stop layer.

6. The MEMS device of claim 4, wherein the first thin film beam further includes a metallic layer between the first conductive layer and the second conductive layer, one or more of the first conductive layer, the metallic layer, and the second conductive layer being substantially opaque to light.

7. The MEMS device of claim 1, wherein the first thin film beam includes a shutter, the shutter being configured to substantially prevent light from traveling through the one or more apertures.

8. The MEMS device of claim 1, wherein a thickness of the second passivation layer is less than about 1000 Å.

9. The MEMS device of claim 1, wherein the first thin film beam includes a first arm and the second thin film beam includes a second arm, each arm extending towards the surface of the substrate, the first arm being joined to and overlapping the second arm, the first arm and the second arm forming an anchor capable of holding the first thin film beam and the second thin film beam a distance away from the substrate.

10. The MEMS device of claim 1, wherein the one or more electrodes include movable sidewall beams having an aspect ratio of greater than about 4:1.

11. The MEMS device of claim 1, wherein the substrate includes a glass substrate.

12. The MEMS device of claim 1, further comprising a plurality of spacers for holding a plate away from the second thin film beam.

13. The MEMS device of claim 1, further comprising
    a processor capable of communicating with the display, the processor being capable of processing image data, and
    a memory device capable of communicating with the processor.

14. The MEMS device of claim 13, further comprising
    a driver circuit capable of sending at least one signal to the display; and
    a controller capable of sending at least a portion of the image data to the driver circuit.

15. The MEMS device of claim 13, further comprising an image source module capable of sending the image data to the processor, wherein the image source module includes at least one of a receiver, transceiver, and transmitter.

16. The MEMS device of claim 13, further comprising an input device capable of receiving input data and communicating the input data to the processor.

17. A MEMS device comprising:
- a substrate;
- a first thin film beam over the substrate, wherein the first thin film beam includes one or more electrodes;
- a second thin film beam over the first thin film beam, the first thin film beam being arranged between the substrate and the second thin film beam and spaced away from the substrate and the second thin film beam, wherein the second thin film beam includes one or more apertures;
- first means for passivating the MEMS device partially covering an exterior surface of the second thin film beam and partially covering an exterior surface of the first thin film beam, wherein a portion of the first thin film beam and a portion of the second thin film beam are uncovered by the first passivating means; and
- second means for passivating the MEMS device over the first passivating means, the second passivating means covering the first passivating means layer and the uncovered portion of the first thin film beam and the uncovered portion of the second thin film beam.

18. The MEMS device of claim 17, wherein each of the one or more electrodes includes a top surface, a bottom surface, and sidewalls, the first passivating means covering at least the sidewalls of the one or more electrodes, and the second passivating means covering at least the top and bottom surfaces of the one or more electrodes.

19. The MEMS device of claim 17, wherein the first thin film beam includes a first conductive layer, wherein the substrate includes a conductive surface in contact with the first conductive layer.

20. A device comprising:
- a substrate;
- a conductive pad over the substrate;
- at least one first thin film layer contacting the conductive pad, wherein the at least one first thin film layer form at least part of a first thin film beam;
- at least one second thin film layer over the first thin film beam to form at least part of a second thin film beam, wherein the first thin film beam is spaced away from the substrate and the second thin film beam is spaced away from and overlapping the first thin film beam;
- a first pre-release passivation layer partially covering an exterior surface of the first thin film beam, wherein at least a portion of the first thin film beam is exposed;
- a post-release passivation layer over the first pre-release passivation layer, wherein the post-release passivation layer at least covers the exposed portion of the first thin film beam.

21. The device of claim 20, further comprising:
- a second pre-release passivation layer partially covering an exterior surface of the second thin film beam, wherein at least a portion of the second thin film beam is exposed, and wherein the post-release passivation layer covers the exposed portion of the second thin film beam.

22. The device of claim 20, wherein the at least one thin film layer comprises:
- a first conductive layer contacting the conductive pad; and
- a metallic layer disposed on the conductive layer, wherein at least one of the conductive layer and the metallic layer is substantially opaque to light.

23. The device of claim 22, wherein the at least one thin film layer further comprises:
- a second conductive layer disposed on the metallic layer, the second conductive layer being identical in composition with the first conductive layer.

24. The device of claim 20, wherein the first thin film beam comprises:
- one or more electrodes; and
- one or more shutters.

25. The device of claim 24, wherein the exposed portion of the first thin film beam includes an exposed portion of the one or more electrodes.

26. The device of claim 24, wherein the second thin film beam comprises:
- one or more apertures, wherein the one or more shutters are configured to substantially prevent light from traveling through the one or more apertures.

* * * * *